(12) United States Patent
Zhang et al.

(10) Patent No.: US 12,727,327 B2
(45) Date of Patent: Sep. 1, 2026

(54) DISPLAY PANEL AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Tiaomei Zhang, Beijing (CN); Ziyang Yu, Beijing (CN); Wenbo Chen, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 387 days.

(21) Appl. No.: 18/681,167

(22) PCT Filed: Jun. 21, 2022

(86) PCT No.: PCT/CN2022/100229
§ 371 (c)(1),
(2) Date: Feb. 5, 2024

(87) PCT Pub. No.: WO2023/245444
PCT Pub. Date: Dec. 28, 2023

(65) Prior Publication Data
US 2024/0284710 A1 Aug. 22, 2024

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; H10D 30/6734; H10D 86/00; H10D 86/443; H10D 86/451; G09G 3/3225
See application file for complete search history.

(56) References Cited

U.S. PATENT DOCUMENTS

2022/0130933 A1 4/2022 Yu et al.
2024/0414943 A1* 12/2024 Min .................. H10K 59/1213

FOREIGN PATENT DOCUMENTS

CN 113851493 A 12/2021
WO 2022082751 A1 4/2022

OTHER PUBLICATIONS

Extended European Search Report of application No. 22947224.6 dated Apr. 2, 2025.

* cited by examiner

*Primary Examiner* — J. E. Schoenholtz
(74) *Attorney, Agent, or Firm* — Calfee, Halter & Griswold LLP

(57) ABSTRACT

A display panel is provided and includes a first conductive layer including a first conductive portion, a second active layer including an eighth active portion, a third conductive layer, a dielectric layer and a fourth conductive layer including a first bridge portion connected to the eighth active portion and the first conductive portion through a via hole. The first gate line includes a first extension portion, an orthographic projection of the first extension portion is located on the orthographic projection of the first bridge portion, and the first extension portion comprises a first side edge and a second side edge opposite to each other and extending in its extension direction, and the orthographic projection of the first bridge portion perpendicularly intersects with orthographic projections of the first side edge and the second side edge.

20 Claims, 30 Drawing Sheets

DISPLAY PANEL AND DISPLAY APPARATUS

CROSS-REFERENCE

The present disclosure is a U.S. National Stage of International Application No. PCT/CN2022/100229, filed on Jun. 21, 2022, entitled "DISPLAY PANEL AND DISPLAY APPARATUS", the entire content of which is incorporated herein by reference.

TECHNICAL FIELD

The present disclosure relates to a field of display technology, and in particular, to a display panel and a display apparatus.

BACKGROUND

In recent years, with the rapid development of the display industry, consumers have increasingly strict requirements for display borders, and narrow borders or even no borders have gradually become the trend and trend.

In the related art, there is a risk of breaking in an inorganic dielectric layer between the SD1 layer and the Gate layer, which may easily lead to a short circuit between the SD1 layer and the Gate layer, resulting in display problems.

It should be noted that the information disclosed in this section is turned only for enhancing understanding of the BACKGROUND of the disclosure and therefore, may contain information that does not constitute the prior art that is already known to those skilled in the art.

SUMMARY

A purpose of the present disclosure is to overcome the shortcomings of the prior art, and provide a display panel and a display apparatus.

According to an aspect of the present disclosure, a display panel is provided, where the display panel includes a pixel driving circuit including a driving transistor and a second transistor, where a first electrode of the second transistor is connected to a gate of the driving transistor, and a second electrode of the second transistor is connected to a first electrode of the driving transistor, where the display panel further includes: a base substrate; a first conductive layer, located on a side of the base substrate, where the first conductive layer includes: a first conductive portion, configured to form the gate of the driving transistor; a second active layer, located on a side of the first conductive layer away from the base substrate, where the second active layer includes: a second active portion, configured to form a channel region of the second transistor; and an eighth active portion, connected to a side of the second active portion; a third conductive layer, located on a side of the second active layer away from the base substrate, where the third conductive layer includes: a first gate line, where an orthographic projection of the first gate line on the base substrate extends in a first direction and covers the second active portion, a partial structure of the first gate line is configured to form a top gate of the second transistor, and an orthographic projection of the eighth active portion on the base substrate and an orthographic projection of the first conductive portion on the base substrate are located on both sides of the orthographic projection of the first gate line on the base substrate, respectively; a dielectric layer, located on a side of the third conductive layer away from the base substrate; and a fourth conductive layer, located on a side of the dielectric layer away from the base substrate, where the fourth conductive layer includes: a first bridge portion, connected to the eighth active portion and the first conductive portion through a via hole, respectively; where the first gate line includes a sixth side edge and a seventh side edge that are arranged opposite to each other and extend in an extension direction of the first gate line, where an orthographic projection of at least a partial structure of the sixth side edge on the base substrate is perpendicular to an orthographic projection of the first bridge portion on the base substrate, and an orthographic projection of at least a partial structure of the seventh side edge on the base substrate is perpendicular to the orthographic projection of the first bridge portion on the base substrate.

In an exemplary embodiment of the present disclosure, the sixth side edge includes a first segment, and the seventh side edge includes a second segment, where an orthographic projection of the first segment on the base substrate is perpendicular to the orthographic projection of the first bridge portion on the base substrate, and an orthographic projection of the second segment on the base substrate is perpendicular to the orthographic projection of the first bridge portion on the base substrate; and the orthographic projection of the first segment on the base substrate is parallel to the orthographic projection of the second segment on the base substrate, or a straight line where the orthographic projection of the first segment on the base substrate is located intersects with a straight line where the orthographic projection of the second segment on the base substrate is located.

In an exemplary embodiment of the present disclosure, a length of a portion where an orthographic projection of the sixth side edge on the base substrate intersects with the orthographic projection of the first bridge portion on the base substrate is S1, a length of the orthographic projection of the first segment on the base substrate is S2, and a ratio S2/S1 is greater than or equal to 0.7 and less than or equal to 1; and a length of a portion where an orthographic projection of the seventh side edge on the base substrate intersects with the orthographic projection of the first bridge on the base substrate with a length S3, and a length of the orthographic projection of the second segment on the base substrate is S4, where a ratio S4/S3 is greater than or equal to 0.7 and less than or equal to 1.

In an exemplary embodiment of the present disclosure, the display panel further includes: a second conductive layer, located between the first conductive layer and the second active layer, where the second conductive layer includes: a second gate line, where an orthographic projection of the second gate line on the base substrate extends in the first direction and covers an orthographic projection of the second active portion on the base substrate, and a partial structure of the second gate line is configured to form a bottom gate of the second transistor; where the second gate line includes a third side edge and a fourth side edge that are arranged opposite to each other and extend in an extension direction of the second gate line, and the orthographic projection of the first bridge portion on the base substrate perpendicularly intersects with at least part of an orthographic projection of the third side edge on the base substrate and at least part of an orthographic projection of the fourth side edge on the base substrate.

In an exemplary embodiment of the present disclosure, the second gate line includes a second extension portion, where an orthographic projection of the second extension portion on the base substrate is located on the orthographic projection of the first bridge portion on the base substrate and overlaps with the orthographic projection of the first extension portion on the base substrate, and the second extension portion includes a third side edge and a fourth side edge that are arranged opposite to each other and extend in an extension direction of the second extension portion; an orthographic projection of the third side edge on the base substrate is located on a side of an orthographic projection of the fourth side edge on the base substrate away from the orthographic projection of the first conductive portion on the base substrate; an orthographic projection of the first side edge on the base substrate is located on a side of an orthographic projection of the second side edge on the base substrate away from the orthographic projection of the first conductive portion on the base substrate; a distance between an orthographic projection of any first node of the third side edge on the base substrate and the orthographic projection of the first side edge on the base substrate in a second direction is L1, and a distance between the orthographic projection of the first node on the base substrate and the orthographic projection of the fourth side edge on the base substrate in the second direction is L2, where the second direction intersects with the first direction, and a ratio L1/L2 is greater than or equal to 0.25 and less than or equal to 0.8; a distance between an orthographic projection of any second node of the fourth side edge on the base substrate and the orthographic projection of the second side edge on the base substrate in the second direction is L3, and a distance between the orthographic projection of the second node on the base substrate and the orthographic projection of the third side edge on the base substrate in the second direction is L4, where a ratio L3/L4 is greater than or equal to 0.25 and less than or equal to 0.8.

In an exemplary embodiment of the present disclosure, the orthographic projection of the first extension portion on the base substrate covers the orthographic projection of the third side edge on the base substrate, and the orthographic projection of the second extension portion on the base substrate covers the orthographic projection of the second side edge on the base substrate; or the orthographic projection of the first extension portion on the base substrate covers the orthographic projection of the third side edge on the base substrate and the orthographic projection of the fourth side edge on the base substrate; or the orthographic projection of the second extension portion on the base substrate covers the orthographic projection of the first side edge on the base substrate and the orthographic projection of the second side edge on the base substrate; or the orthographic projection of the first extension portion on the base substrate covers the orthographic projection of the fourth side edge on the base substrate, and the orthographic projection of the second extension portion on the base substrate covers the orthographic projection of the first side edge on the base substrate.

In an exemplary embodiment of the present disclosure, a size of an overlapping region of the orthographic projection of the first extension portion on the base substrate and the orthographic projection of the second extension portion on the base substrate in the second direction is L5, where a ratio L1/L5 is greater than or equal to 0.6 and less than or equal to 1, and a ratio L3/L5 is greater than or equal to 0.6 and less than or equal to 1.

In an exemplary embodiment of the present disclosure, the pixel driving circuit includes a fifth transistor and a sixth transistor, a first electrode of the fifth transistor is connected to a second electrode of the driving transistor, and a first electrode of the sixth transistor is connected to the first electrode of the driving transistor; where the display panel further includes: a first active layer, located between the base substrate and the first conductive layer, where the first active layer includes: a fifth active portion, configured to form a channel region of the fifth transistor; and a sixth active portion, configured to form a channel region of the sixth transistor; where a distance between the fifth active portion and the sixth active portion in the first direction is a sixth distance L6, a ratio L1/L6 is greater than or equal to 5%, and a ratio L2/L6 is greater than or equal to 5%.

In an exemplary embodiment of the present disclosure, L1 is greater than or equal to 1.3 μm, and L2 is greater than or equal to 1.3 μm.

In an exemplary embodiment of the present disclosure, the second gate line includes the second extension portion, and the orthographic projection of the second extension portion on the base substrate is located on the orthographic projection of the first bridge portion on the base substrate and overlaps with the orthographic projection of the first extension portion on the base substrate; the orthographic projection of the second extension portion on the base substrate covers the orthographic projection of the first extension portion on the base substrate, the orthographic projection of the second extension portion on the base substrate has a first center line in the first direction, the orthographic projection of the first extension portion on the base substrate has a second center line, and the first center line overlaps with the second center line; and the orthographic projection of the second extension portion on the base substrate has a first width in the second direction, and the orthographic projection of the first extension portion on the base substrate has a second width in the second direction, where the second direction intersects with the first direction; where a ratio of the first width to the second width is 1.5 to 3 at a same position.

In an exemplary embodiment of the present disclosure, the first gate line is provided with a first component and a second component that are connected to each other in the extension direction of the first gate line, a width of an orthographic projection of the first component on the base substrate in the second direction is greater than the width of the orthographic projection of the second component on the base substrate in the second direction, and the second direction intersects with the first direction; and the second gate line is provided with a third component and a fourth component that are connected to each other in the extension direction of the second gate line, and a width of an orthographic projection of the third component on the base substrate in the second direction is greater than a width of an orthographic projection of the fourth component on the base substrate in the second direction; where the orthographic projection of the first component on the base substrate and the orthographic projection of the third component on the base substrate both cover the orthographic projection of the second active portion on the base substrate, and the orthographic projection of the third component on the base substrate covers the orthographic projection of the first component on the base substrate; and the orthographic projection of the first bridge portion on the base substrate partially overlaps with the orthographic projection of the first component on the base substrate and the orthographic projection of the second component on the base substrate, and the orthographic projection of the first bridge portion on the base substrate further partially overlaps with the orthographic projection of the third component on the base substrate and the orthographic projection of the fourth component on the base substrate.

In an exemplary embodiment of the present disclosure, the first gate line is provided with a first component and a second component, a width of the first component in the second direction is greater than a width of the second component in the second direction, and the second direction intersects with the first direction; and the second gate line is provided with a third component and a fourth component, and a width of the third component in the second direction is greater than a width of the fourth component in the second direction; where an orthographic projection of the first component on the base substrate and an orthographic projection of the third component on the base substrate both cover the orthographic projection of the second active portion on the base substrate, and the orthographic projection of the third component on the base substrate covers the orthographic projection of the first component on the base substrate; and the orthographic projection of the first bridge portion on the base substrate intersects with the orthographic projection of the first component on the base substrate and the orthographic projection of the third component on the base substrate.

In an exemplary embodiment of the present disclosure, the display panel includes a plurality of pixel driving circuits arranged in an array along the first direction and a second direction, where the first direction is a row direction and the second direction is a column direction; and the pixel driving circuit is configured to drive a light emitting unit to emit light, and further includes a fourth transistor and a seventh transistor, where a first electrode of the fourth transistor is connected to a second electrode of the driving transistor, a gate of the fourth transistor is connected to a third gate line, and a second electrode of the fourth transistor is connected to a data line, where a first electrode of the seventh transistor is connected to a first electrode of the light emitting unit, a second electrode of the seventh transistor is connected to a second initial signal line, and a gate of the seventh transistor is connected to a third reset signal line, and the display panel further includes: a first active layer, located between the base substrate and the first conductive layer, where the first active layer includes: a fourth active portion, configured to form a channel region of the fourth transistor; and a seventh active portion, configured to form a channel region of the seventh transistor; where the first conductive layer further includes: the third gate line, where an orthographic projection of the third gate line on the base substrate extends in the first direction and covers an orthographic projection of the fourth active portion on the base substrate, and a partial structure of the third gate line is configured to form the gate of the fourth transistor; and the third reset signal line, where an orthographic projection of the third reset signal line on the base substrate extends in the first direction and covers the seventh active portion, and a partial structure of the third reset signal line is configured to form the gate of the seventh transistor; and where the third gate line of the pixel driving circuit of a current row is multiplexed as the third reset signal line of the pixel driving circuit of a previous row.

In an exemplary embodiment of the present disclosure, the pixel driving circuit further includes a storage capacitor, a first electrode of the storage capacitor is connected to the gate of the driving transistor, and a second electrode of the storage capacitor is connected to a first power supply line; and the first conductive portion is further configured to form a first electrode of the storage capacitor;

where the display panel further includes:

a fifth conductive layer, located on a side of the fourth conductive layer away from the base substrate, where the fifth conductive layer includes:

the first power supply line, where an orthographic projection of the first power supply line on the base substrate extends in the second direction, and the second direction intersects with the first direction; a second conductive layer, located between the first conductive layer and the second active layer, where the second conductive layer includes: a second conductive portion, where an orthographic projection of the second conductive portion on the base substrate partially overlaps with the orthographic projection of the first conductive portion on the base substrate, the second conductive portion is configured to form a second electrode of the storage capacitor, and the second conductive portion is connected to the first power supply line through a via hole.

In an exemplary embodiment of the present disclosure, the first direction is a row direction and the second direction is a column direction; where the display panel includes a plurality of repeating units arranged along the row direction and the column direction, where the repeating unit includes two pixel driving circuits adjacent to each other in the row direction, and each column of the pixel driving circuits is correspondingly provided with one first power supply line and one second conductive portion; in a same repeating unit, two first power supply lines are connected to each other; and in the repeating units adjacent in the row direction, adjacent second conductive portions are connected to each other.

In an exemplary embodiment of the present disclosure, in the same repeating unit, two adjacent pixel driving circuits in the row direction are configured as mirror structures to each other.

In an exemplary embodiment of the present disclosure, the pixel driving circuit includes a fifth transistor, where a first electrode of the fifth transistor is connected to a second electrode of the driving transistor, and a second electrode of the fifth transistor is connected to a first power supply line, where the display panel further includes: a first active layer, located between the base substrate and the first conductive layer, where the first active layer includes: a fifth active portion, configured to form a channel region of the fifth transistor; where the first conductive layer further includes: an enable signal line, where an orthographic projection of the enable signal line on the base substrate extends along the first direction and covers the fifth active portion, and a partial structure of the enable signal line is configured to form a gate of the fifth transistor; and a fifth conductive layer, located on a side of the fourth conductive layer away from the base substrate, where the fifth conductive layer includes: the first power supply line, where an orthographic projection of the first power supply line on the base substrate extends in a second direction, and the second direction intersects with the first direction; and where the fourth conductive layer further includes: a second bridge, connected to the second electrode of the fifth transistor through a first via hole and connected to the first power supply line through another via hole.

In an exemplary embodiment of the present disclosure, the first direction is a row direction and the second direction is a column direction; the display panel includes a plurality of repeating units arranged along the row direction and the column direction, and the repeating unit includes two pixel driving circuits adjacent to each other in the row direction; and the second bridge portion is arranged in one-to-one correspondence with the pixel driving circuit, and in the repeating units adjacent in the row direction, adjacent second bridge portions are connected to each other and share the first via hole.

In an exemplary embodiment of the present disclosure, the display panel further includes: a fifth conductive layer, located on a side of the fourth conductive layer away from the base substrate, where the fifth conductive layer includes: a first power supply line, where an orthographic projection of the first power supply line on the base substrate extends in a second direction, and the second direction intersects with the first direction; and where the orthographic projection of the first power supply line on the base substrate covers the orthographic projection of the first bridge portion on the base substrate.

In an exemplary embodiment of the present disclosure, a gate of the second transistor is connected to the first gate line, and the second electrode of the second transistor is connected to the first electrode of the driving transistor; where the second active layer further includes: a first active portion, configured to form a channel region of a first transistor; and the second active portion, configured to form the channel region of the second transistor; where the display panel further includes: a second conductive layer, located between the first conductive layer and the second active layer, where the second conductive layer includes: a second gate line, where an orthographic projection of the second gate line on the base substrate extends in the first direction and covers an orthographic projection of the second active portion on the base substrate, and a partial structure of the second gate line is configured to form a bottom gate of the second transistor, and where the orthographic projection of the first gate line on the base substrate covers the orthographic projection of the second active portion on the base substrate, and the partial structure of the first gate line is configured to form the top gate of the second transistor; and a first reset signal line, where an orthographic projection of the first reset signal line on the base substrate extends in the first direction and covers an orthographic projection of the first active portion on the base substrate, and a partial structure of the first reset signal line is configured to form a bottom gate of the first transistor; and where an orthographic projection of the first power supply line on the base substrate covers the orthographic projection of the first active portion on the base substrate and the orthographic projection of the second active portion on the base substrate.

In an exemplary embodiment of the present disclosure, a second electrode of a first transistor is connected to a first initial signal line, and the second electrode of the second transistor is connected to the first electrode of the driving transistor, where the pixel driving circuit further includes a sixth transistor, and a first electrode of the sixth transistor is connected to the first electrode of the driving transistor; where the display panel further includes: a second conductive layer, located between the first conductive layer and the second active layer, where the second conductive layer includes: the first initial signal line, where an orthographic projection of the first initial signal line on the base substrate extends in the first direction; a first active layer, located between the base substrate and the first conductive layer, where the first active layer includes: a third active portion, configured to form a channel region of the driving transistor; a sixth active portion, configured to form a channel region of the sixth transistor; and an eleventh active portion, connected to the third active portion and the sixth active portion; where the second active layer further includes: the second active portion, configured to form the channel region of the second transistor; a ninth active portion, connected to the second active portion and the eighth active portion; and a fourteenth active portion, connected to a side of the second active portion away from the eighth active portion; where the fourth conductive layer further includes: a third bridge portion, connected to the fourteenth active portion and connected to the first initial signal line through a via hole; and a fourth bridge portion, connected to the eleventh active portion through a via hole and connected to the fourteenth active portion through another via hole.

In an exemplary embodiment of the present disclosure, the display panel includes a plurality of pixel driving circuits arranged in an array along the first direction and a second direction, where the first direction is a row direction and the second direction is a column direction; where the display panel includes a plurality of repeating units arranged along the row direction and the column direction, and the repeating unit includes two pixel driving circuits; and in a same repeating unit, two pixel driving circuits share the third bridge portion.

In an exemplary embodiment of the present disclosure, where the pixel driving circuit further includes a fifth transistor, a sixth transistor and a seventh transistor, where a first electrode of the fifth transistor is connected to a second electrode of the driving transistor, a second electrode of the fifth transistor is connected to a first power supply line, a first electrode of the sixth transistor is connected to the first electrode of the driving transistor, and a second electrode of the sixth transistor is connected to a first electrode of the seventh transistor, and where the display panel further includes: the first active layer, located between the base substrate and the first conductive layer, where the first active layer includes: a fifth active portion, configured to form a channel region of the fifth transistor; a sixth active portion, configured to form a channel region of the sixth transistor; and a seventh active portion, configured to form a channel region of the seventh transistor; where the first conductive layer further includes: an enable signal line, where an orthographic projection of the enable signal line on the base substrate extends along the first direction and covers the fifth active portion and the sixth active portion, and a partial structure of the enable signal line is configured to form a gate of the fifth transistor and the partial structure of the enable signal line is configured to form a gate of the sixth transistor; and a third reset signal line, where an orthographic projection of the third reset signal line on the base substrate extends in the first direction and covers the seventh active portion, and a partial structure of the third reset signal line is configured to form a gate of the seventh transistor; the second conductive layer, located between the first conductive layer and the second active layer, where the second conductive layer includes: the first initial signal line, where the orthographic projection of the first initial signal line on the base substrate extends in the first direction; a fifth conductive layer, located on a side of the fourth conductive layer away from the base substrate, where the fifth conductive layer includes: the first power supply line, where an orthographic projection of the first power supply line on the base substrate extends in a second direction, and the second direction intersects with the first direction; and where the fourth conductive layer further includes: a second bridge, connected to the second electrode of the fifth transistor through a via hole and connected to the first power supply line through another via hole; and where, in a same pixel driving circuit, the orthographic projection of the first conductive portion on the base substrate is located between the orthographic projection of the enable signal line on the base substrate and the orthographic projection of the first gate line on the base substrate; and in the same pixel driving circuit, the orthographic projection of the first gate line on the base substrate, the orthographic projection of the third reset signal line on the base substrate and the orthographic projection of the first initial signal line on the base substrate are sequentially arranged in a direction away from the first conductive portion.

In an exemplary embodiment of the present disclosure, a gate of the first transistor is connected to a second reset signal line; and where the second active layer further includes: a first active portion, configured to form a channel region of the first transistor; where the display panel further includes: the second conductive layer, located between the first conductive layer and the second active layer, where the second conductive layer includes: a first reset signal line, where an orthographic projection of the first reset signal line on the base substrate extends in the first direction and covers an orthographic projection of the first active portion on the base substrate, and a partial structure of the first reset signal line is configured to form a bottom gate of the first transistor; where the third conductive layer further includes: a second reset signal line, where an orthographic projection of the second reset signal line on the base substrate extends in the first direction and covers the orthographic projection of the first active portion on the base substrate, and a partial structure of the second reset signal line is configured to form a top gate of the first transistor; and where the orthographic projection of the first reset signal line on the base substrate is located between the orthographic projection of the first initial signal line on the base substrate and the orthographic projection of the third reset signal line on the base substrate.

In an exemplary embodiment of the present disclosure, the first direction is a row direction and the second direction is a column direction, and where the pixel driving circuit further includes a fourth transistor, a first electrode of the fourth transistor is connected to the second electrode of the driving transistor, and a second electrode of the fourth transistor is connected to a data signal line; where the fifth conductive layer further includes: a data line, where an orthographic projection of the data line on the base substrate extends in the second direction; and the fourth conductive layer further includes: a sixth bridge, connected to the data line through a via hole and connected to a second electrode of the fourth transistor through another via hole; where the display panel includes a plurality of repeating units arranged along the row direction and the column direction, the repeating unit includes two pixel driving circuits, and each column of the pixel driving circuits is correspondingly provided with one first power supply line and one data line; and in a same repeating unit, two first power supply lines are connected to each other, and orthographic projections of two data lines on the base substrate are arranged on both sides of the orthographic projections of two first power supply lines on the base substrate, respectively.

In an exemplary embodiment of the present disclosure, the pixel driving circuit further includes a fourth transistor, a first electrode of the fourth transistor is connected to the second electrode of the driving transistor, and a second electrode of the fourth transistor is connected to a data signal line; where the first transistor and the second transistor are N-type transistors, and the driving transistor, the fourth transistor, the fifth transistor, the sixth transistor and the seventh transistor are P-type transistors.

In an exemplary embodiment of the present disclosure, the display panel includes a plurality of pixel driving circuits arranged in an array along the first direction and a second direction, where the first direction is a row direction and the second direction is a column direction, and where the display panel includes a plurality of sub-pixels arranged in an array along the row direction and the column direction, the sub-pixel includes the pixel driving circuit, and the display panel further includes: a fifth conductive layer, located on a side of the fourth conductive layer away from the base substrate, where the fifth conductive layer includes: a first power supply line, where an orthographic projection of the first power supply line on the base substrate extends in the second direction; and a plurality of virtual pixel rows, where the virtual pixel rows are located between two adjacent rows of sub-pixels, the virtual pixel row includes a plurality of row virtual sub-pixels, and the row virtual sub-pixel includes a row virtual pixel driving circuit.

In an exemplary embodiment of the present disclosure, the row virtual pixel driving circuit includes a row virtual transistor and a row virtual signal line, the row virtual transistor and the row virtual signal line are connected to each other into an integral structure, and the integral structure is connected to the first power supply line.

In an exemplary embodiment of the present disclosure, the display panel includes the plurality of pixel driving circuits arranged in the array along the first direction and the second direction, where the first direction is the row direction and the second direction is the column direction, where the pixel driving circuit is configured to drive a light emitting unit to emit light, and further includes a fourth transistor, a sixth transistor and a seventh transistor, where a first electrode of the fourth transistor is connected to a second electrode of the driving transistor, a gate of the fourth transistor is connected to a third gate line, and a second electrode of the fourth transistor is connected to a data line, where a first electrode of the sixth transistor is connected to the first electrode of the driving transistor, a second electrode of the sixth transistor is connected to a first electrode of the light emitting unit, and where a first electrode of the seventh transistor is connected to the first electrode of the light emitting unit, a second electrode of the seventh transistor is connected to a second initial signal line, and a gate of the seventh transistor is connected to a third reset signal line; where an orthographic projection of the seventh transistor in the pixel driving circuit of a current row on the base substrate is located at a side of an orthographic projection of the virtual pixel row on the base substrate away from an orthographic projection of the sixth transistor in the pixel driving circuit of the current row on the base substrate, and the display panel further includes: a first active layer, located between the base substrate and the first conductive layer, where the first active layer includes: a fourth active portion, configured to form a channel region of the fourth transistor; a sixth active portion, configured to form a channel region of the sixth transistor; and a seventh active portion, configured to form a channel region of the seventh transistor; and a third conductive portion, at least partially located in a region where the virtual pixel row is located, where an orthographic projection of the third conductive portion on the base substrate extends along the second direction, and the third conductive portion is configured to be connected to the second electrode of the sixth transistor in the pixel driving circuit of the current row and the first electrode of the seventh transistor in the pixel driving circuit of the current row; where the first conductive layer further includes: the third gate line, where an orthographic projection of the third gate line on the base substrate extends in the first direction and covers an orthographic projection of the fourth active portion on the base substrate, and a partial structure of the third gate line is configured to form the gate of the fourth transistor; and the third reset signal line, where an orthographic projection of the third reset signal line on the base substrate extends in the first direction and covers the seventh active portion, and a partial structure of the third reset signal line is configured to form the gate of the seventh transistor; and where the third gate line of the pixel driving circuit of a current row is multiplexed as the third reset signal line of the pixel driving circuit of a previous row.

In an exemplary embodiment of the present disclosure, the row virtual pixel driving circuit further includes a row virtual storage capacitor, the row virtual signal line includes a row virtual second initial signal line, a row virtual third reset signal line, a row virtual gate line and a row virtual enable signal line, and the row virtual transistor includes a row virtual driving transistor and a row virtual fifth transistor, where a first notch region is arranged between an orthographic projection of the row virtual fifth transistor on the base substrate and an orthographic projection of the row virtual driving transistor on the base substrate, the orthographic projection of the third conductive portion on the base substrate is located in the first notch region, and an orthographic projection of the second electrode of the row virtual storage capacitor on the base substrate, an orthographic projection of the row virtual second initial signal line on the base substrate, an orthographic projection of the row virtual third reset signal line on the base substrate, and an orthographic projection of the row virtual gate line on the base substrate and an orthographic projection of the row virtual enable signal line on the base substrate are all disconnected at the first notch region.

In an exemplary embodiment of the present disclosure, the third conductive portion is located on the first conductive layer, and the row virtual pixel driving circuit includes a row virtual first transistor, where a first electrode of the row virtual first transistor is connected to a gate of the row virtual driving transistor, a second electrode of the row virtual first transistor is connected to a row virtual first initial signal line, and a gate of the row virtual first transistor is connected to a row virtual second reset signal line; and the row virtual signal line further includes the row virtual second reset signal line, where the row virtual second reset signal line is located on the third conductive layer, and an orthographic projection of the row virtual second reset signal line on the base substrate extends along the first direction and is located between the first notch region and a region where the pixel driving circuit of the previous row is located; where the display panel further includes: a fifth bridge portion, located on the fourth conductive layer, where the fifth bridge portion is connected to the third conductive portion and a second electrode of the sixth transistor in the pixel driving circuit in current row through a via hole respectively, and an orthographic projection of the fifth bridge portion on the base substrate intersects with an orthographic projection of the second reset signal line on the base substrate.

In an exemplary embodiment of the present disclosure, the display panel further includes: a plurality of virtual pixel columns, where the virtual pixel column is located between two adjacent columns of sub-pixels, the virtual pixel column includes a plurality of column virtual sub-pixels, the column virtual sub-pixel includes a column virtual pixel driving circuit, the column virtual pixel driving circuit includes a channel region of a column virtual reset transistor, and an orthographic projection of the channel region of the column virtual reset transistor on the base substrate has a second notch region; and the first conductive layer further includes a third reset signal line, where an orthographic projection of the third reset signal line on the base substrate extends along the first direction and passes through the second notch region.

In an exemplary embodiment of the present disclosure, the virtual pixel column further includes a column virtual storage capacitor and a column virtual signal line, where a first electrode of the column virtual storage capacitor is connected to the enable signal line, the column virtual signal line and the column virtual transistor are connected to each other into an integral structure, and the integral structure is connected to the first power supply line.

According to another aspect of the present disclosure, a display apparatus is further provided, including the display panel according to any embodiment of the present disclosure.

In the display panel provided by the present disclosure, the first bridge portion located on the fourth conductive layer is connected to the eighth active portion and the first conductive portion, and the first electrode of the second transistor T is connected to the gate of the driving transistor T. The orthographic projection of the first bridge portion on the base substrate perpendicularly intersects with orthographic projections of the two side edges of the first extension portion in the first gate line on the base substrate. On the one hand, the stress of the dielectric layer between the third conductive layer and the fourth conductive layer may be reduced. On the other hand, the structure of the first bridge portion on both sides of the first gate line may have the same stress environment. Thus, the stress of the dielectric layer between the fourth conductive layer and the third conductive layer is evenly distributed, thereby reducing the risk that the dielectric layer is broken.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and form a part of the present specification. The embodiments conforming to the present disclosure are shown and used to explain the principles of the present disclosure in conjunction with the specification. Understandably, the accompanying drawings described below are only some embodiments of the present disclosure, and other accompanying drawings may be obtained from these accompanying drawings without any creative effort for those skilled in the art.

DETAILED DESCRIPTION

Figure 1:
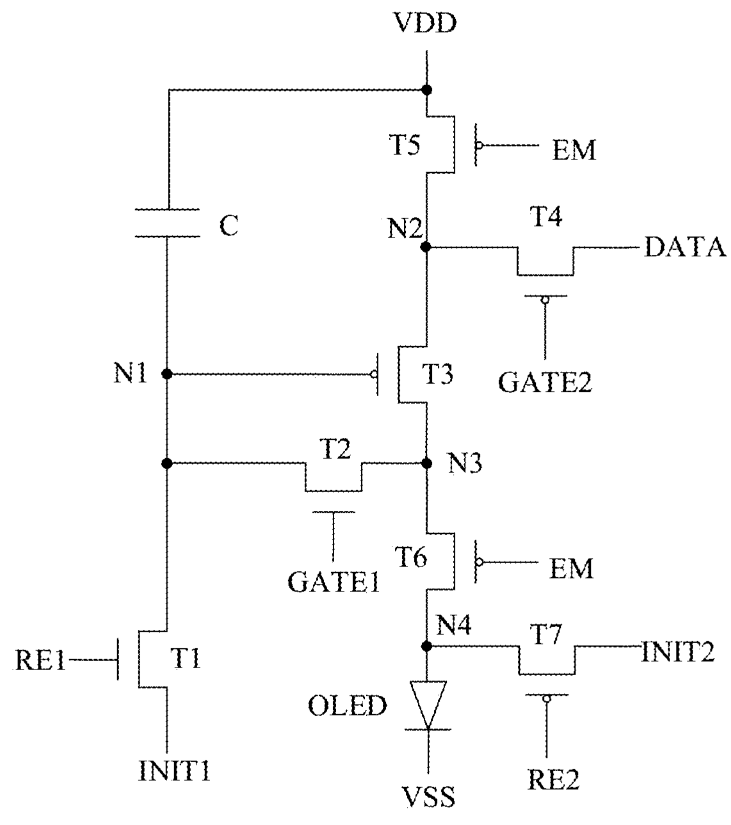
FIG. 1 is a schematic circuit structure diagram of a pixel driving circuit in a display panel according to an embodiment of the present disclosure.

Now, exemplary embodiments will be described more comprehensive with reference to the accompanying drawings. However, exemplary embodiments may be implemented via various manners, and should not be understood as being limited to the embodiments set forth herein. Conversely, these embodiments are provided such that the present disclosure will be comprehensive and complete, and the concept of the exemplary embodiments will be comprehensively communicated to those skilled in the art. The same reference numeral in the accompanying figures denotes the same or similar structure(s), thereby detailed description thereof will be omitted. Furthermore, the accompanying drawings are only exemplary illustrate of the present disclosure and are not necessarily to scale.

FIG. 1 is a schematic circuit structure diagram of a pixel driving circuit in a display panel according to an embodiment of the present disclosure. The pixel driving circuit may include: a first transistor T1, a second transistor T2, a driving transistor T3, a fourth transistor T4, a fifth transistor T5, a sixth transistor T6, a seventh transistor T7, and a storage capacitor C. A second electrode of the first transistor T1 is connected to the first initial signal terminal INIT1, a first electrode of the first transistor T1 is connected to a first node N1, and a gate of the first transistor T1 is connected to a first reset signal terminal RE1. A first electrode of the second transistor T2 is connected to a gate of the driving transistor T3, a second electrode of the second transistor T2 is connected to a third node N3, and a gate of the second transistor T2 is connected to a first gate driving signal terminal GATE1. A gate of the driving transistor T3 is connected to the first node N1. A second electrode of the fourth transistor T4 is connected to a data signal terminal DATA, a first electrode of the fourth transistor T4 is connected to a second electrode of the driving transistor T3, and a gate of the fourth transistor T4 is connected to a second gate driving signal terminal GATE2. A first electrode of the fifth transistor T5 is connected to the second electrode of the driving transistor T3, a second electrode of the fifth transistor T5 is connected to a first power supply terminal VDD, and a gate of the fifth transistor T5 is connected to an enable signal terminal EM. A first electrode of the sixth transistor T6 is connected to a first electrode of the driving transistor T3, and a gate of the sixth transistor T6 is connected to the enable signal terminal EM. A second electrode of the seventh transistor T7 is connected to a second initial signal terminal INIT2, a first electrode of the seventh transistor T7 is connected to the second electrode of the sixth transistor T6, and a gate of the seventh transistor T7 is connected to a second reset signal terminal RE2. The storage capacitor C is connected to the gate of the driving transistor T3 and the first power supply terminal VDD. The pixel driving circuit may be connected to a light emitting unit OLED, for driving the light emitting unit OLED to emit light, and the light emitting unit OLED may be connected to the second electrode of the sixth transistor T6 and a second power supply terminal VSS. The first transistor T1 and the second transistor T2 may be N-type transistors, for example, the first transistor T1 and the second transistor T2 may be N-type metal oxide transistors. N-type metal oxide transistors have smaller leakage current, thus a leakage of the node N through the first transistor T1 and the second transistor T2 may be avoided during a light-emitting phase. Meanwhile, the driving transistor T3, the fourth transistor T4, the fifth transistor T5, the sixth transistor T6, and the seventh transistor T7 may be P-type transistors, for example, the driving transistor T3, the fourth transistor T4, the fifth transistor T5, the sixth transistor T6, and the seventh transistor T7 may be P-type low-temperature polycrystalline silicon transistors. The P-type low-temperature polycrystalline silicon transistors have higher carrier mobility, thus being beneficial to realizing the display panel with high resolution, high reaction speed, high pixel density and high opening rate. The first initial signal terminal INIT1 and the second initial signal terminal may output the same or different voltage signals according to the actual situation.

It should be noted that the transistors used in various embodiments of the present disclosure may be thin film transistors, field effect transistors or other devices with the same characteristics. In the present specification, the first electrode may be a drain electrode, the second electrode may be a source electrode, or the first electrode may be the source electrode and the second electrode may be the drain electrode.

Figure 2:
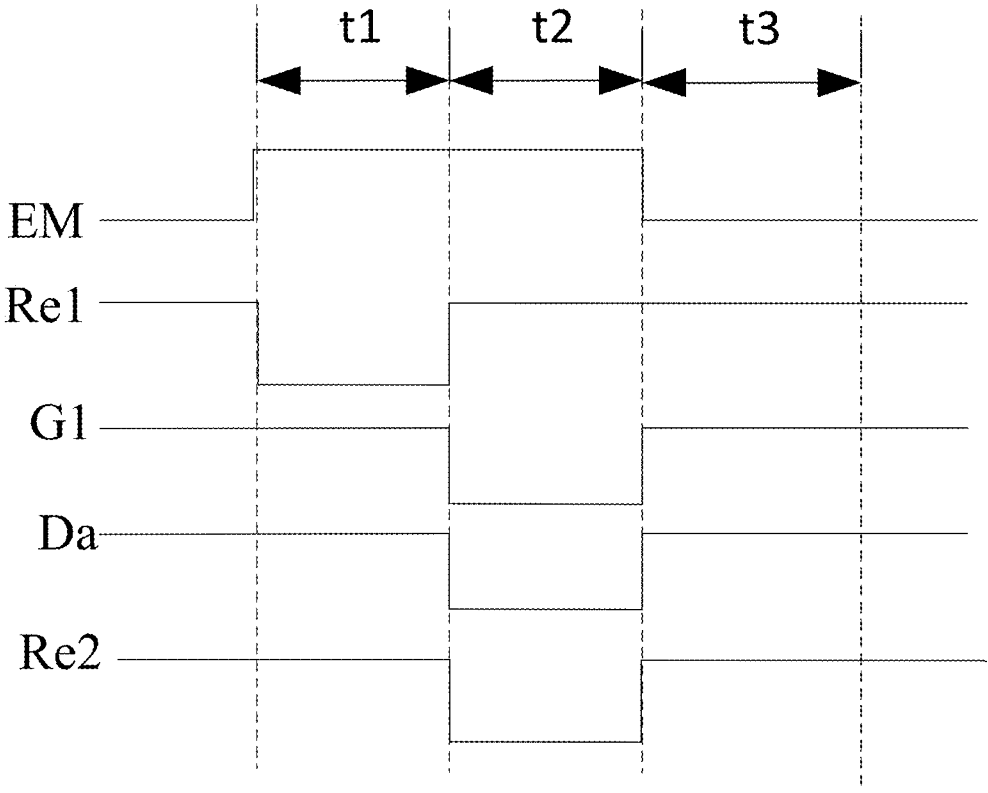
FIG. 2 is a timing diagram of each node in a driving method of the pixel driving circuit in FIG. 1.

FIG. 2 is a timing diagram of each node in a driving method of the pixel driving circuit in FIG. 1. G1 represents a timing of the first gate driving signal terminal GATE1, G2 represents a timing of the second gate driving signal terminal GATE2, Re1 represents a timing of the first reset signal terminal RE1, Re2 represents a timing of the second reset signal terminal RE2, EM represents a timing of the enable signal terminal EM, and Da represents a timing of the data signal terminal DATA. A driving method of the pixel driving circuit may include a first reset phase t1, a compensation phase t2, a second reset phase t3, and a light emitting phase t4. In the first reset phase t1, the first reset signal terminal RE1 outputs a high level signal, the first transistor T1 is turned on, and the first initial signal terminal INIT1 inputs an initial signal to the first node N1. In the compensation phase t2, the first gate driving signal terminal GATE1 outputs a high level signal, the second gate driving signal terminal GATE2 outputs a low level signal, the fourth transistor T4 and the second transistor T2 are turned on, and the data signal terminal DATA outputs a driving signal to write a voltage Vdata+Vth (i.e. the sum of the voltage Vdata and the voltage Vth) to the second node N2. Vdata is a voltage of the driving signal and Vth is a threshold voltage of the driving transistor T3. In the second reset phase t3, the second reset signal terminal RE2 outputs a low level signal, the seventh transistor T7 is turned on, and the second initial signal terminal INIT2 inputs an initial signal to the second electrode of the sixth transistor T6. In the light emitting phase t4, the enable signal terminal EM outputs a low level signal, the sixth transistor T6 and the fifth transistor T5 are turned on, and the driving transistor T3 emits light under the action of the voltage Vdata+Vth stored in the capacitor C.

An output current formula of the driving transistor is $I=(\mu WCox/2L)(Vgs-Vth)^2$, where μ is a carrier mobility, Cox is a gate storage capacity per unit area, W is a width of a channel of the driving transistor, L is a length of the channel of the driving transistor, Vgs is a gate-source voltage difference of the driving transistor, and Vth is a threshold voltage of the driving transistor. An output current of the driving transistor in the pixel driving circuit of the present disclosure is $I=(\mu WCox/2L)(Vdata+Vth-Vdd-Vth)^2$. The pixel driving circuit may avoid the influence of the threshold voltage of the driving transistor on its output current.

Figure 3:
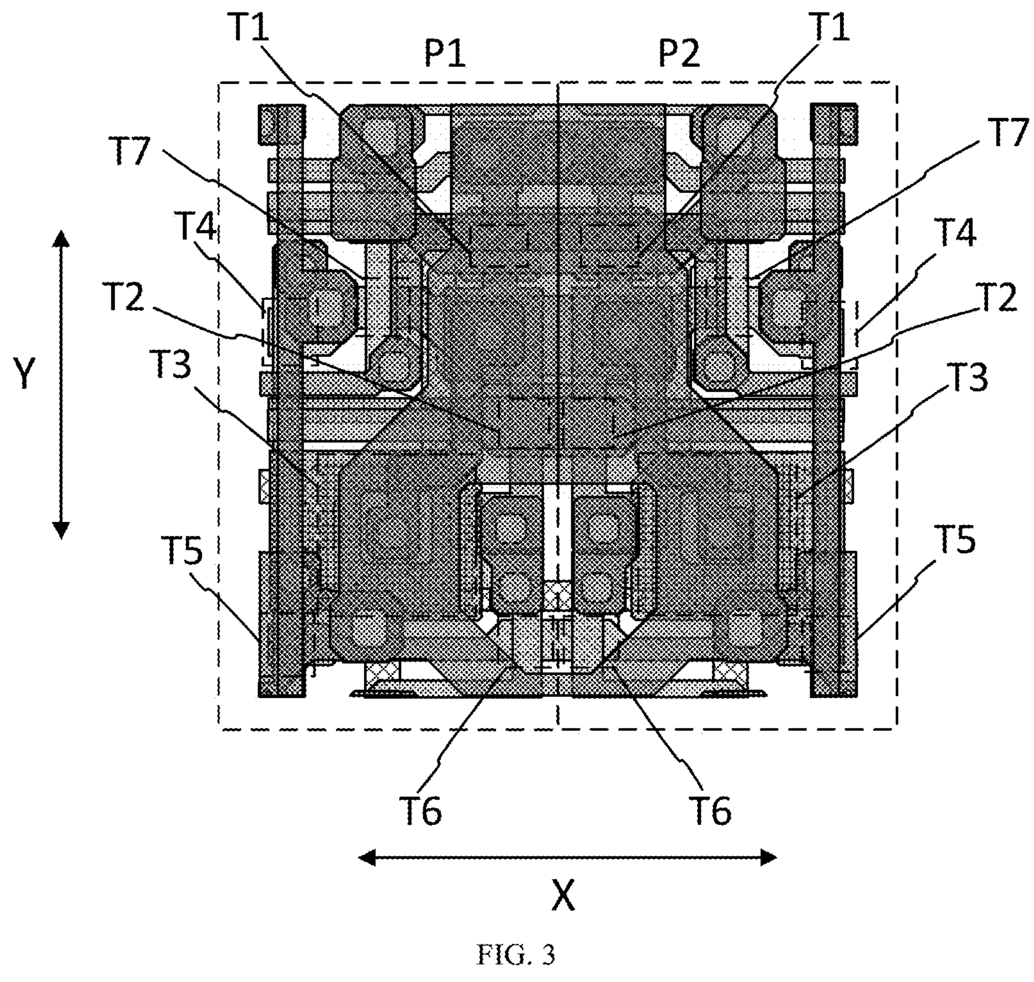
FIG. 3 is a structural layout of a display panel according to an embodiment of the present disclosure.
Figure 4:
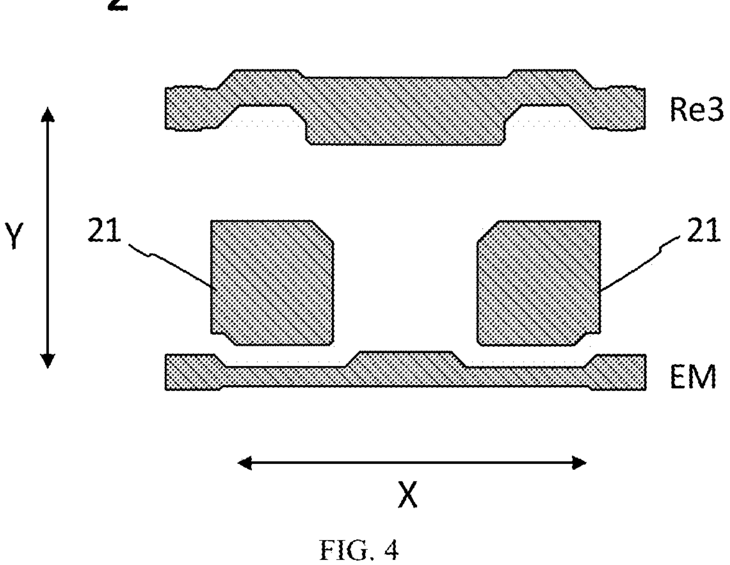
FIG. 4 is a structural layout of a first conductive layer in FIG. 3.
Figure 5:
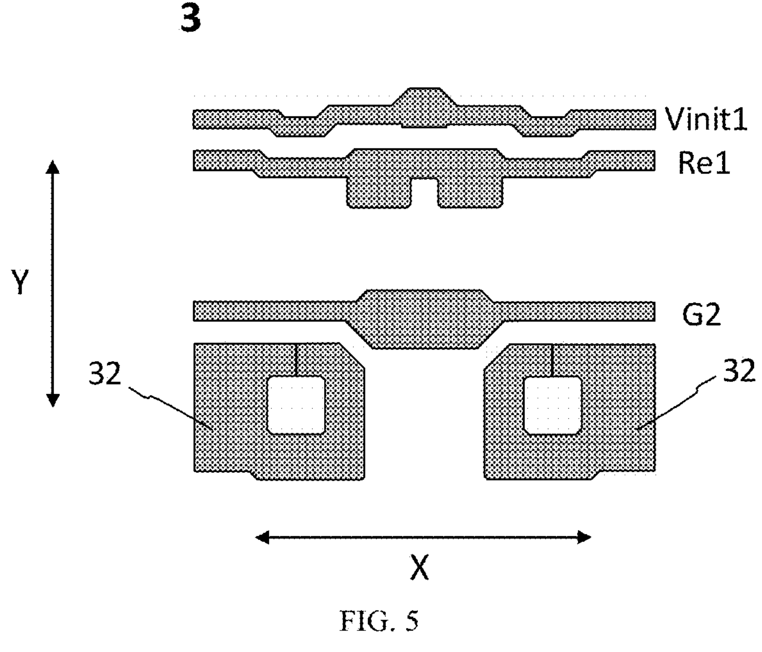
FIG. 5 is a structural layout of a second conductive layer in FIG. 3.
Figure 6:
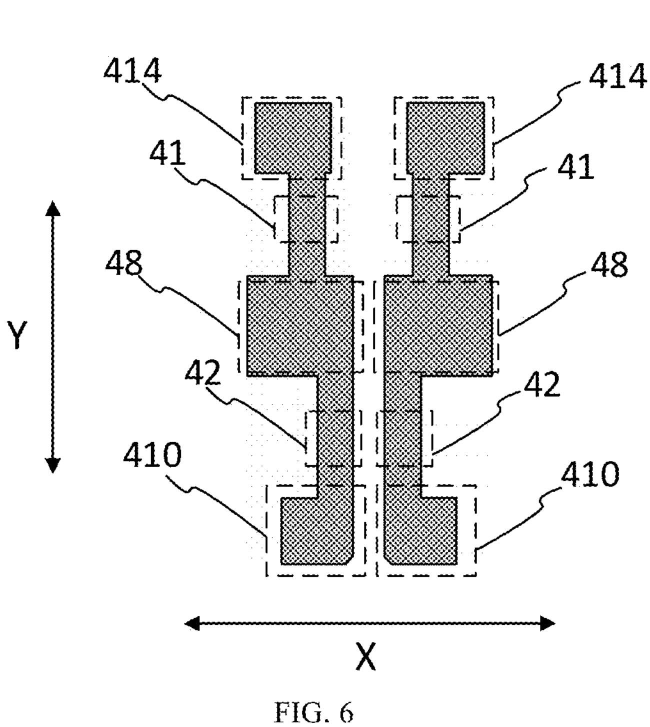
FIG. 6 is a structural layout of a second active layer in FIG. 3.
Figure 7:
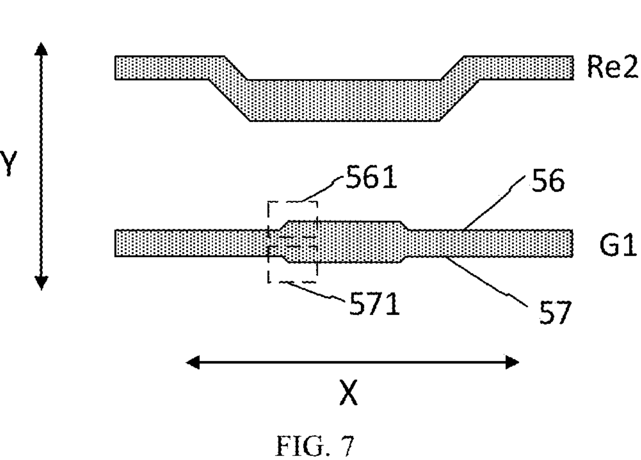
FIG. 7 is a structural layout of a third conductive layer in FIG. 3.
Figure 8:
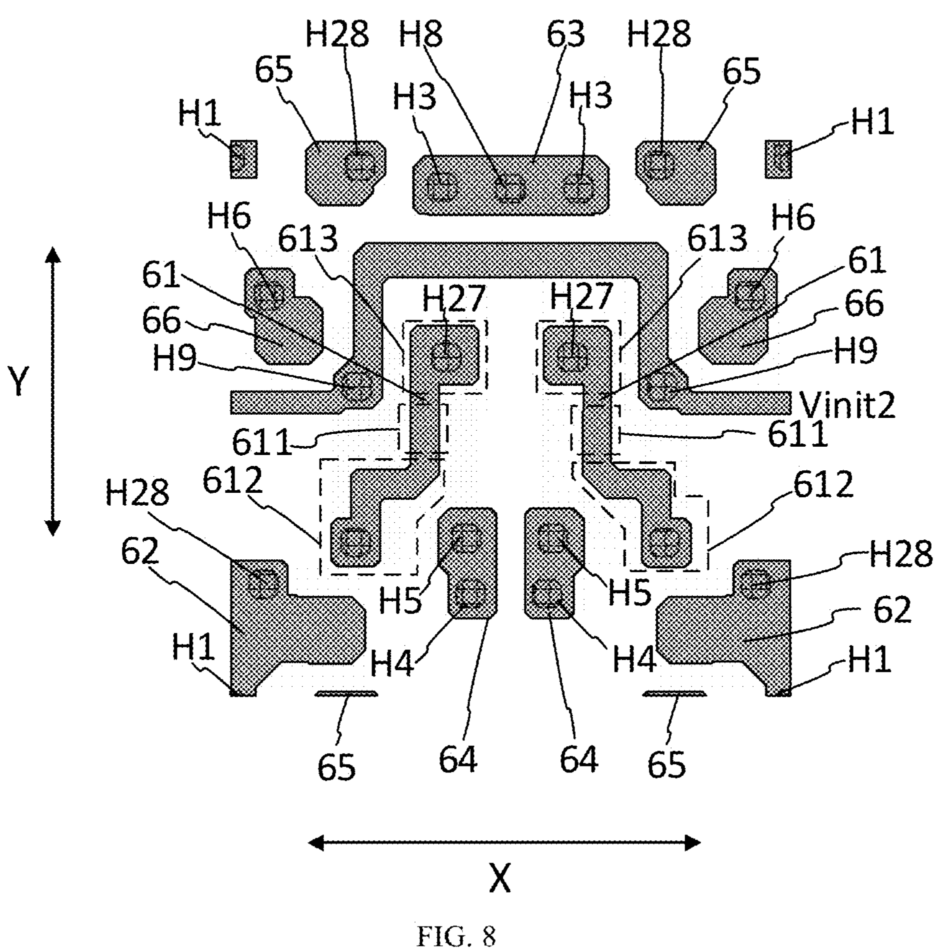
FIG. 8 is a structural layout of a fourth conductive layer in FIG. 3.

The display panel provided by the present exemplary embodiment may include a plurality of pixel driving circuits arranged in an array along a first direction and a second direction. The pixel driving circuit is configured to drive a light emitting device to emit light, and the first direction intersects with the second direction intersect. The pixel driving circuit includes a driving transistor T3 and a second transistor T2, a first electrode of the second transistor T2 is connected to a gate of the driving transistor T3, and a second electrode of the second transistor T2 is connected to a first electrode of the driving transistor T3. The pixel driving circuit may be as shown in FIG. 1. In other exemplary embodiments, the pixel driving circuit in the display panel may also be other structures, for example, 8TIC, 9TIC, etc. FIG. 3 is a structural layout of a display panel according to an embodiment of the present disclosure, FIG. 4 is a structural layout of the first conductive layer in FIG. 3, FIG. 5 is a structural layout of the second conductive layer in FIG. 3, FIG. 6 is a structural layout of the second active layer in FIG. 3, FIG. 7 is a structural layout of the third conductive layer in FIG. 3, and FIG. 8 is a structural layout of the fourth conductive layer in FIG. 3. As shown in FIGS. 3-8, the display panel may include a base substrate, a first conductive layer 2, a second conductive layer 3, a second active layer 4, a third conductive layer 5, a dielectric layer, and a fourth conductive layer 6. The first conductive layer 2 is located on a side of the base substrate, and may include a first conductive portion 21 which may be configured to form the gate of the driving transistor T3. The second active layer 4 is located on a side of the first conductive layer 2 away from the base substrate. The second active layer 4 may include a second active portion 42 and an eighth active portion 48. The second active portion 42 may be configured to form a channel region of the second transistor T2, and the eighth active portion 48 is connected to a side of the second active portion 42. The third conductive layer 5 is located on a side of the second active layer 4 away from the base substrate, and may include a first gate line G1. An orthographic projection of the first gate line G1 on the base substrate extends in a first direction and covers the second active portion 42. A partial structure of the first gate line G1 may be configured to form a top gate of the second transistor T2, and an orthographic projection of the eighth active portion 48 on the base substrate and an orthographic projection of the first conductive portion 21 on the base substrate are located on both sides of the orthographic projection of the first gate line G1 on the base substrate respectively. The dielectric layer is located on a side of the third conductive layer 5 away from the base substrate. The fourth conductive layer 6 is located on a side of the dielectric layer away from the base substrate, and may include a first bridge portion 61, which may be connected to the eighth active portion 48 and the first conductive portion 21 through a via hole, respectively. The first gate line G1 may include a sixth side edge and a seventh side edge which are oppositely arranged and extend in an extension direction of the first gate line G1. An orthographic projection of at least a partial structure of the sixth side edge on the base substrate is perpendicular to an orthographic projection of the first bridge portion on the base substrate, and an orthographic projection of at least a partial structure of the seventh side edge on the base substrate is perpendicular to the orthographic projection of the first bridge portion on the base substrate.

In the display panel provided by the present exemplary embodiment, the first bridge portion 61 located on the fourth conductive layer 6 is connected to the eighth active portion 48 and the first conductive portion 21, and the first electrode of the second transistor T2 is connected to the gate of the driving transistor T3. The orthographic projection of the first bridge portion 61 on the base substrate perpendicularly intersects with orthographic projections of the two side edges in the first gate line G1 on the base substrate. On the one hand, the stress of the dielectric layer between the third conductive layer 5 and the fourth conductive layer 6 may be reduced. On the other hand, the structure of the first bridge portion 61 on both sides of the first gate line G1 may have the same or similar stress environment. Thus, the stress of the dielectric layer between the fourth conductive layer 6 and the third conductive layer 5 is evenly distributed, thereby reducing the risk that the dielectric layer is broken.

In the present exemplary embodiment, a structure A extends in a direction B, which means that the structure A may include a main part and a secondary part connected to the main part. The main part is a line, a line segment or a strip-shaped body, and the main part extends in the direction B, and a length of the main part extending in the direction B is greater than lengths of the secondary part extending in other directions.

As shown in FIG. 3, in the present exemplary embodiment, the first direction X may be the row direction and the second direction Y may be the column direction. The display panel may include a plurality of pixel driving circuits, which may include a first pixel driving circuit P and a second pixel driving circuit P2 which are adjacently arranged in the row direction X. The first pixel driving circuit P1 and the second pixel driving circuit P2 may be arranged in mirror symmetry. The first pixel driving circuit P1 and the second pixel driving circuit P2 may form a repeating unit, and the display panel may include a plurality of repeating units arranged in an array in the row direction X and the column direction Y.

As shown in FIG. 7, in the present exemplary embodiment, the first gate line G1 may include a sixth side edge 56 and a seventh side edge 57. The sixth side edge 56 may include a first segment 561 and the seventh side edge 57 may include a second segment 571.

Figures 8A, 8B:
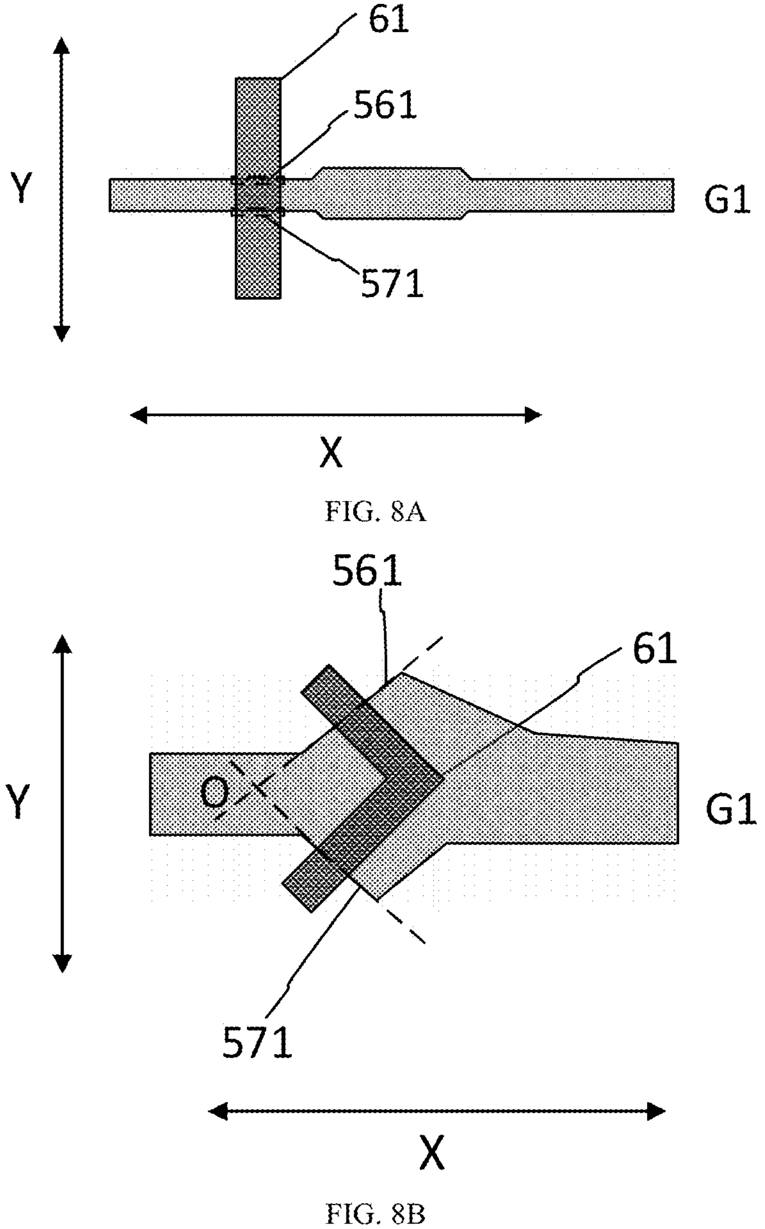
FIG. 8A is a stacked top view of a first gate line and a first bridge portion according to an embodiment of the present disclosure.
FIG. 8B is a stacked top view of a first gate line and a first bridge portion according to another embodiment of the present disclosure.

FIG. 8A is a stacked top view of a first gate line and a first bridge portion according to an embodiment of the present disclosure. As shown in FIG. 8A, an orthographic projection of the first segment 561 on the base substrate and an orthographic projection of the second segment 571 on the base substrate may be parallel to each other, and an orthographic projection of the first bridge portion 61 on the base substrate is perpendicular to the orthographic projection of the first segment 561 on the base substrate and the orthographic projection of the second segment 571 on the base substrate. FIG. 8B is a stacked top view of a first gate line and a first bridge portion according to another embodiment of the present disclosure. As shown in FIG. 8B, the orthographic projection of the first segment 561 on the base substrate and the orthographic projection of the second segment 571 on the base substrate may not be parallel to each other, that is, a linear extension section of the orthographic projection of the first side edge on the base substrate and the linear extension section of the orthographic projection of the second side edge on the base substrate have an intersection. The first bridge portion 61 may be correspondingly arranged according to the specific structures of the first segment 561 and the second segment 571, such that the orthographic projection of the first bridge portion 61 on the base substrate perpendicularly intersects with the orthographic projection of the first segment 561 on the base substrate and the orthographic projection of the second segment 571 on the base substrate, respectively. For example, the first bridge portion 61 may include two components. One of the components perpendicularly intersects with the orthographic projection of the first segment 561 on the base substrate, and the other perpendicularly intersects with the orthographic projection of the second segment 571 on the base substrate, such that the orthographic projection of the first bridge portion 61 on the base substrate perpendicularly intersects with the orthographic projection of the first segment 561 on the base substrate and the orthographic projection of the second segment 571 on the base substrate, thereby reducing a stress in the medium layer.

Figure 8C:
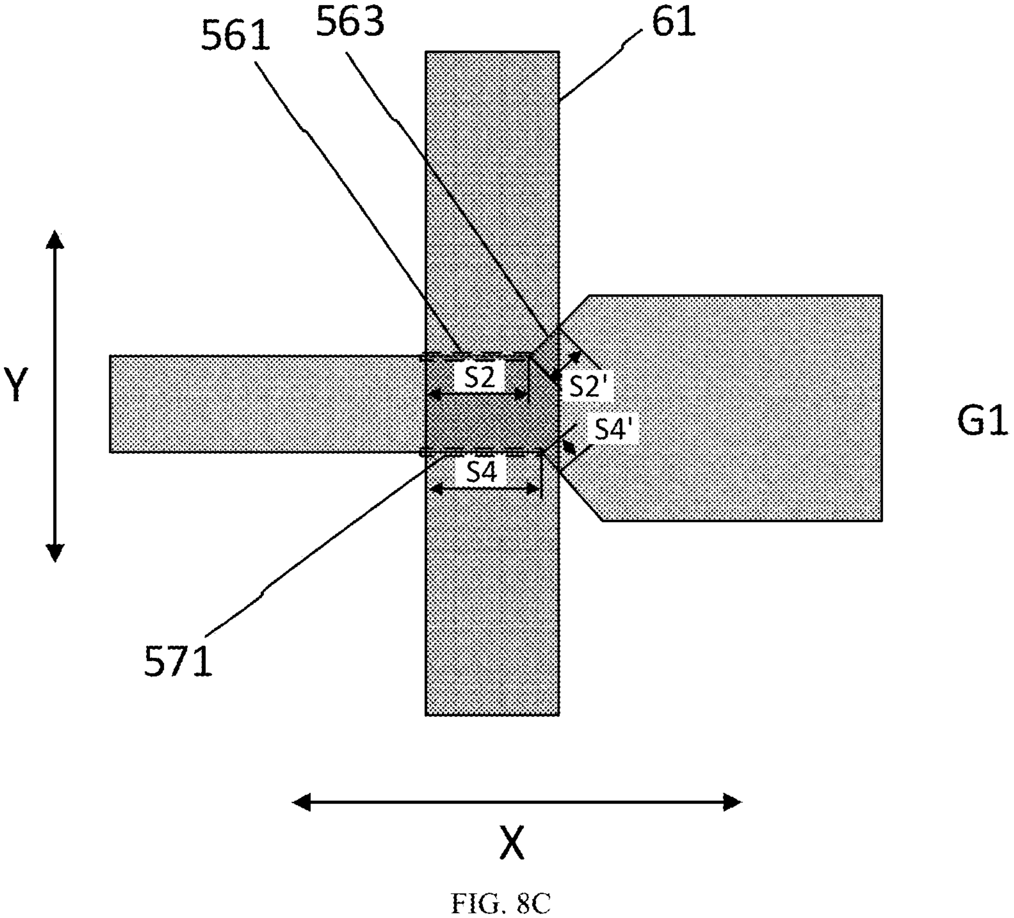
FIG. 8C is a stacked top view of a first gate line and a first bridge portion according to yet another embodiment of the present disclosure.

It should be understood that, the sixth side edge 56 may further include other segments, and orthographic projections of other segments on the base substrate may not be perpendicular to the orthographic projection of the first bridge portion 61 on the base substrate. For example, FIG. 8C is a stacked top view of a first gate line and a first bridge portion according to yet another embodiment of the present disclosure. As shown in FIG. 8C, the sixth side edge 56 may further include a third segment, and an orthographic projection of the third segment on the base substrate intersects with (but is not perpendicular to) the orthographic projection of the first bridge portion 61 on the base substrate. By this structure, the orthographic projection of the first bridge portion 61 on the base substrate may be set to perpendicularly intersect with the orthographic projection of the main part of the sixth side edge 56 on the base substrate, in other words, the orthographic projection of the main part of the sixth side edge 56 on the base substrate perpendicularly intersects with the orthographic projection of the first bridge portion on the base substrate. With continued reference to FIG. 8C, in the present exemplary embodiment, a length of an orthographic projection of the first segment 561 on the base substrate is S2, and a length of a portion where an orthographic projection of the sixth side edge 56 on the base substrate intersects with the orthographic projection of the first bridge portion on the base substrate is S1=S2+S2'. A ratio S2/S1 may be set to be greater than or equal to 0.7 and less than or equal to 1. The ratio S2/S1 may be, for example, 0.7, 0.8, 0.9, 1, etc. That is, in the portion where the orthographic projection of the sixth side edge 56 on the base substrate intersects with the orthographic projection of the first bridge portion on the base substrate, the ratio of the perpendicularly intersecting portion to the entire overlapping portion is greater than a set value, so as to meet the requirement that the orthographic projection of the main part of the overlapping portion of the sixth side edge 56 and the first bridge portion perpendicularly intersects with the orthographic projection of the first bridge portion on the base substrate, which may also play a role in reducing the stress of the dielectric layer, thus helping to prevent the dielectric layer from breaking. Similarly, a length of an orthographic projection of the second segment 571 on the base substrate is S4, and a length of a portion where the orthographic projection of the seventh side 57 on the base substrate intersects with the orthographic projection of the first bridge portion on the base substrate is S3=S4+S4'. A ratio S4/S3 is greater than or equal to 0.7 and less than or equal to 1.

It should be understood that, the terms “first”, “second” and “third” in the present disclosure are only used as marks to distinguish the names of different structures, and there is no restriction on the number of objects that follow and no order relationship among them.

As shown in FIG. 3, in the present exemplary embodiment, the display panel may further include a light shield layer, a first active layer 1, a second conductive layer 3, and a fifth conductive layer 7. The base substrate, the light shield layer, the first active layer 1, the first conductive layer 2, the second conductive layer 3, the second active layer 4, the third conductive layer 5, the fourth conductive layer 6, and the fifth conductive layer 7 are sequentially stacked, and an insulation layer may be provided between every two of the above functional layers. The first conductive layer 2 may be a first gate metal layer (Gate1 layer), the second conductive layer 3 may be a second gate metal layer (Gate2 layer), the third conductive layer 5 may be a third gate metal layer (Gate3 layer), the fourth conductive layer 6 may be a first metal wiring layer (SD1 layer), and the fifth conductive layer 7 may be a second metal wiring layer (SD2 layer).

Figure 9:
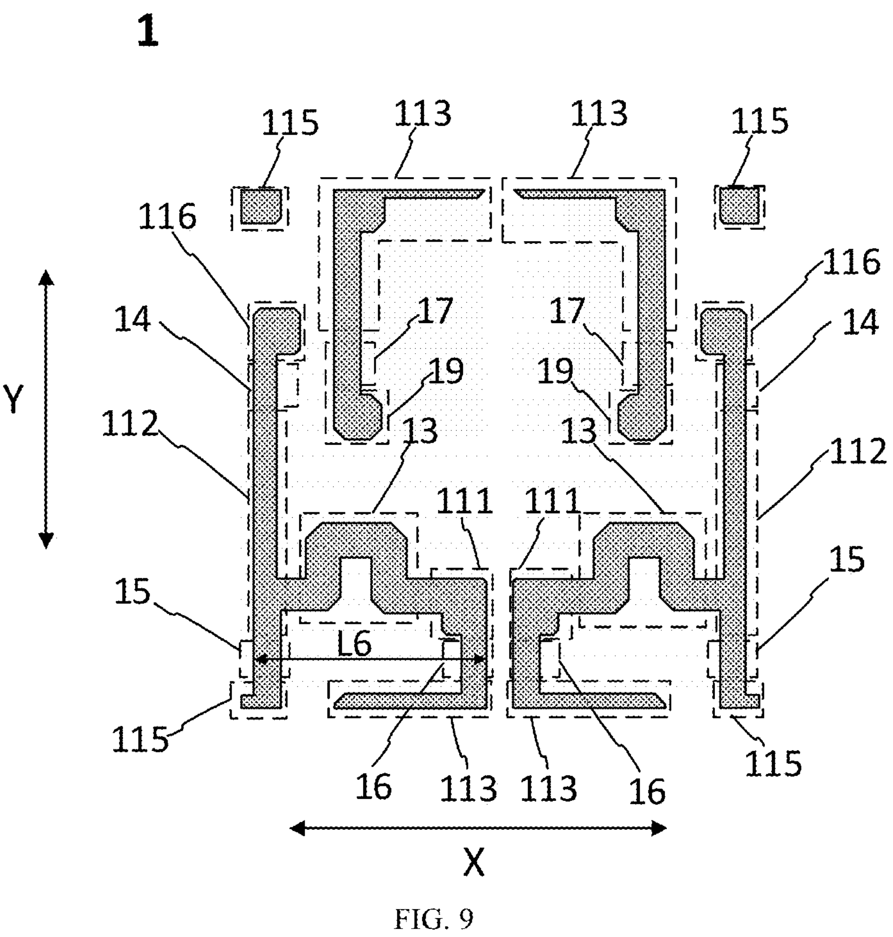
FIG. 9 is a structural layout of a first active layer in FIG. 3.
Figures 10, 11:
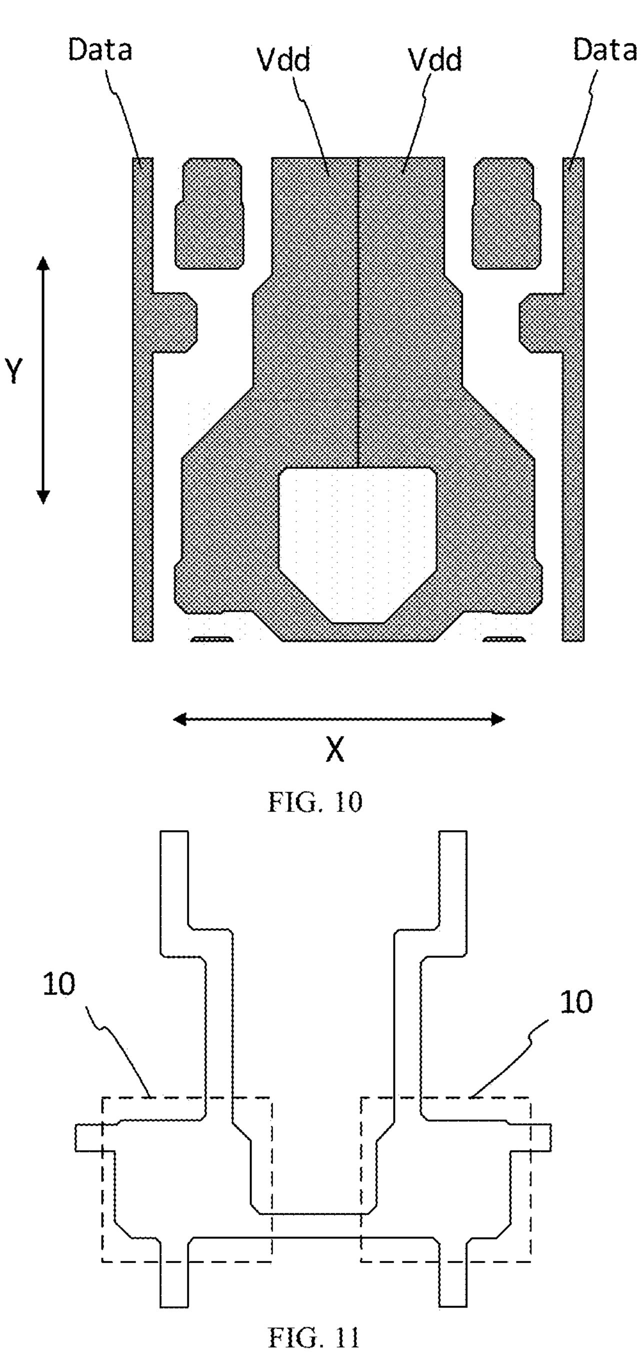
FIG. 10 is a structural layout of a fifth conductive layer in FIG. 3.
FIG. 11 is a structural layout of a light shield layer in FIG. 3.
Figure 12:
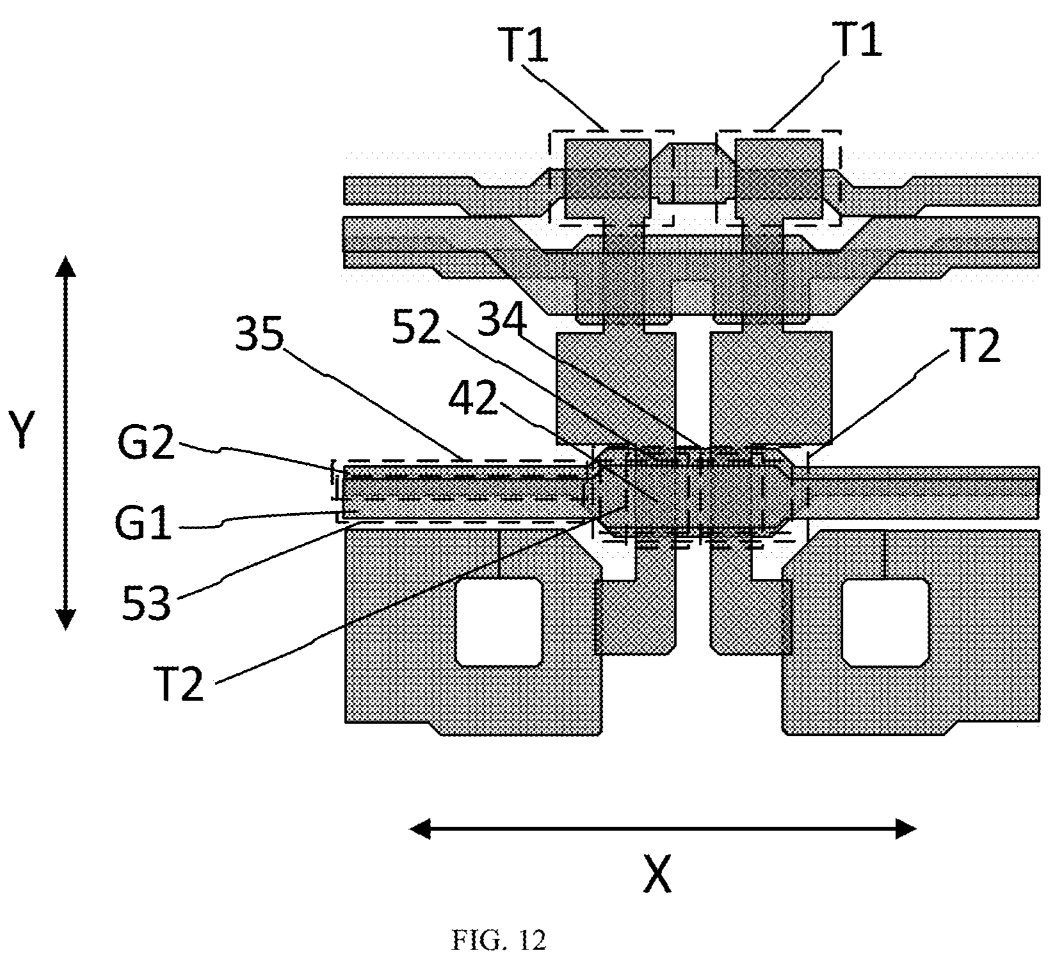
FIG. 12 is a stacked structural layout of the second conductive layer, the second active layer and the third conductive layer in FIG. 3.
Figure 13:
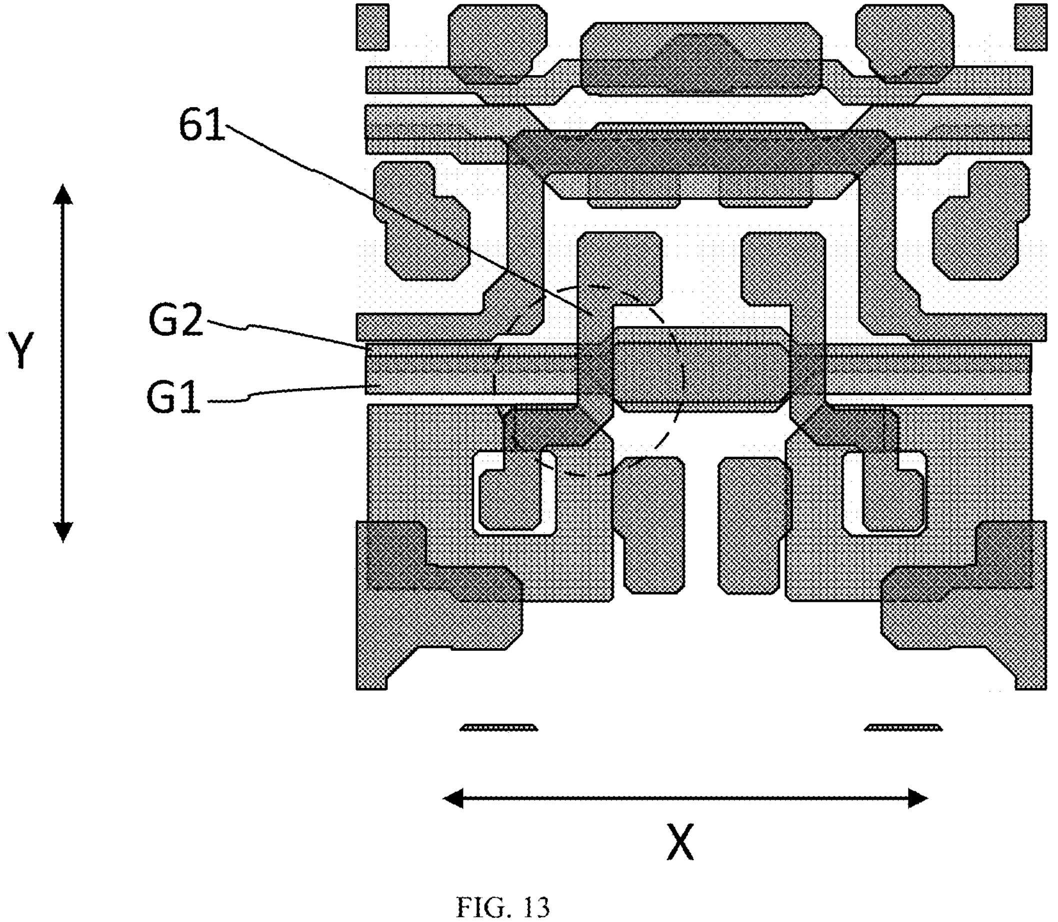
FIG. 13 is a stacked structural layout of the second conductive layer, the third conductive layer and the fourth conductive layer in FIG. 12.
Figure 15:
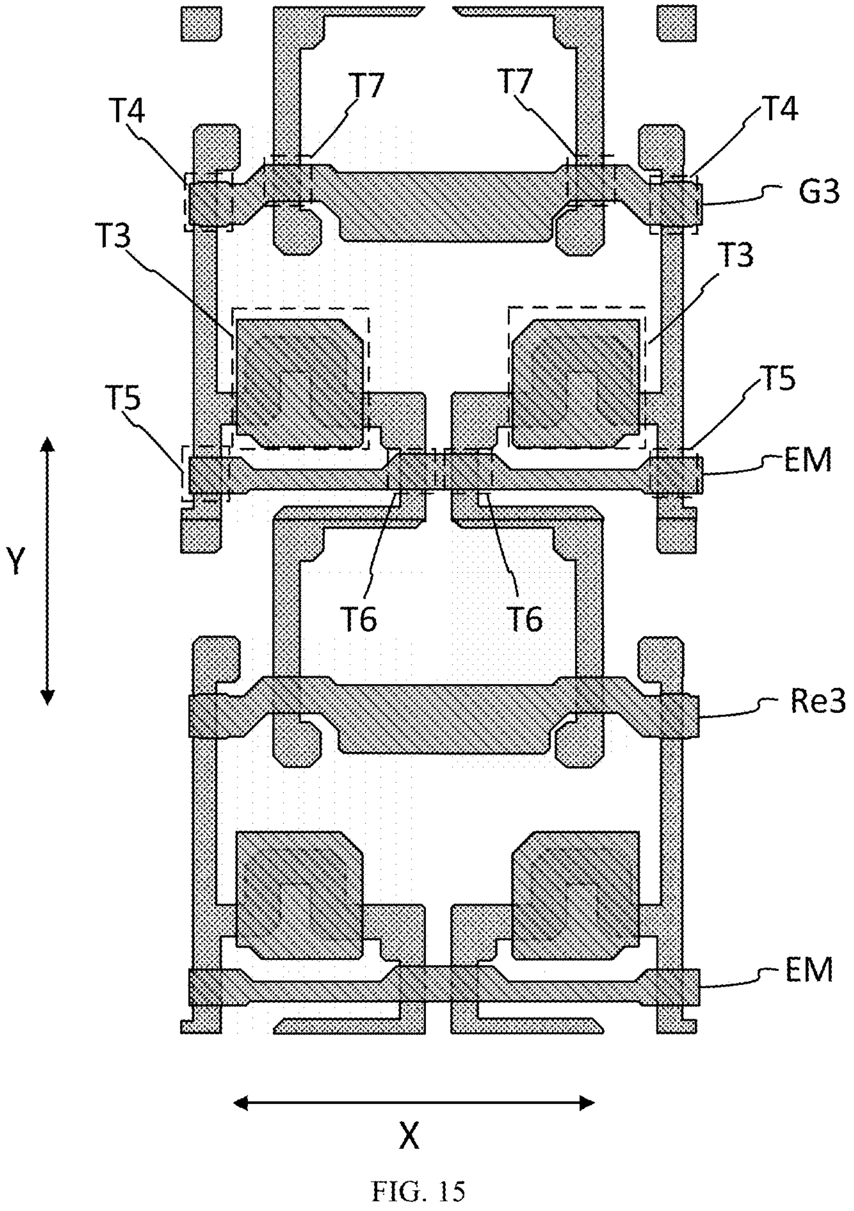
FIG. 15 is a stacked layout of a first conductive layer and an active layer in two pixel driving circuits adjacent in a column direction.
Figure 16:
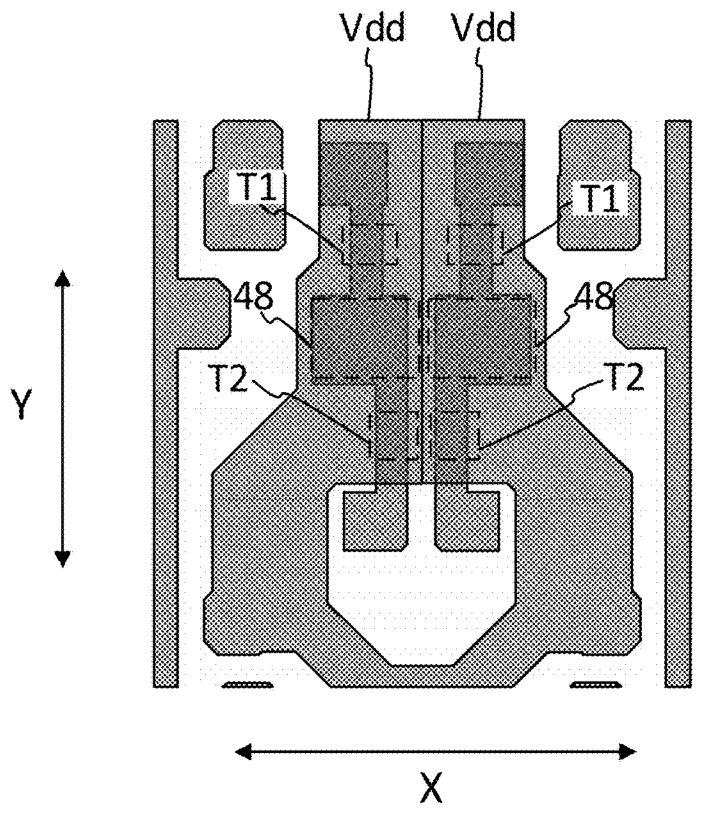
FIG. 16 is a stacked layout of the second active layer and the fifth conductive layer in FIG. 3.
Figure 17:
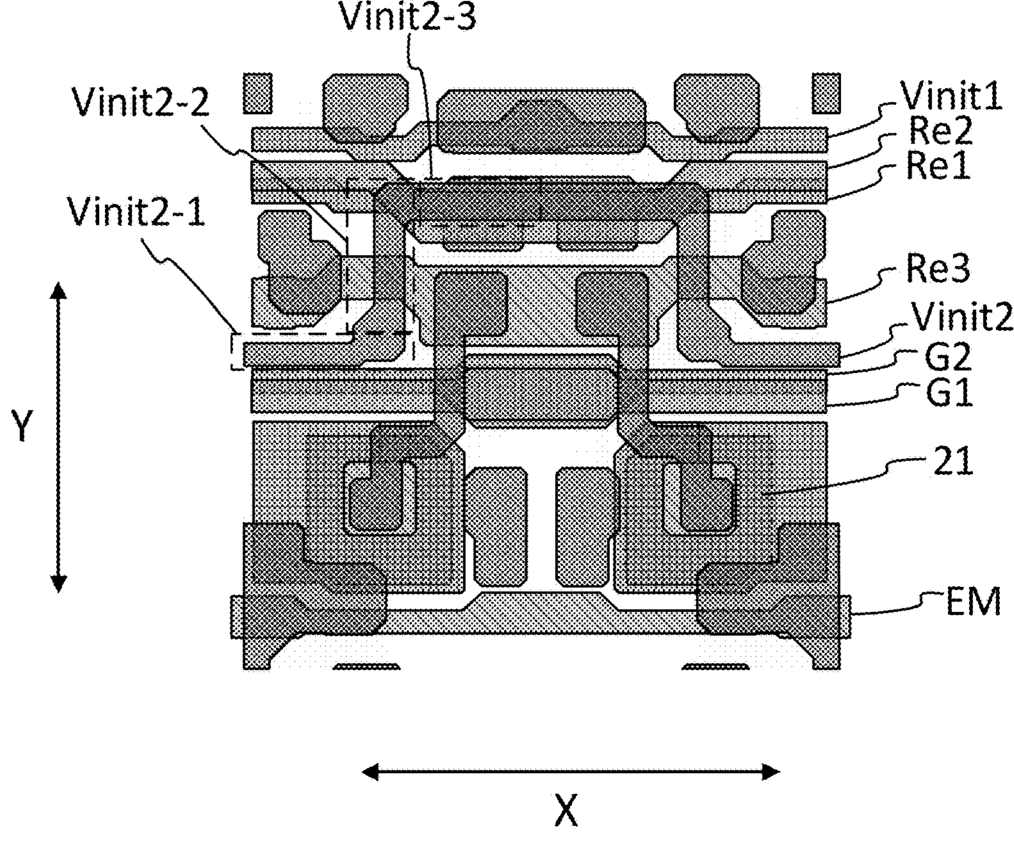
FIG. 17 is a stacked structural layout of the first conductive layer, the second conductive layer, the third conductive layer and the fourth conductive layer in FIG. 3.
Figure 18:
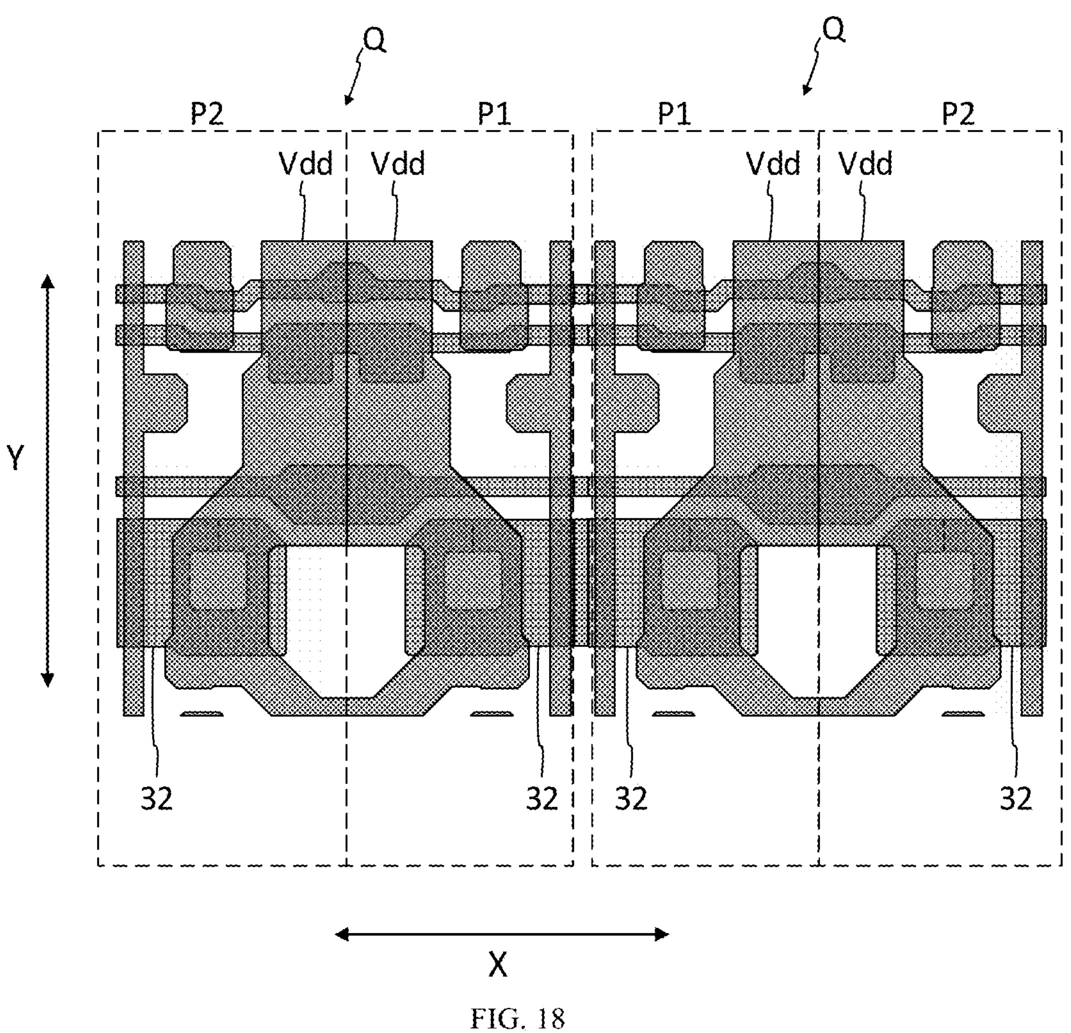
FIG. 18 is a stacked structural layout of a second conductive layer and a fifth conductive layer in two repeating units.
Figure 19:
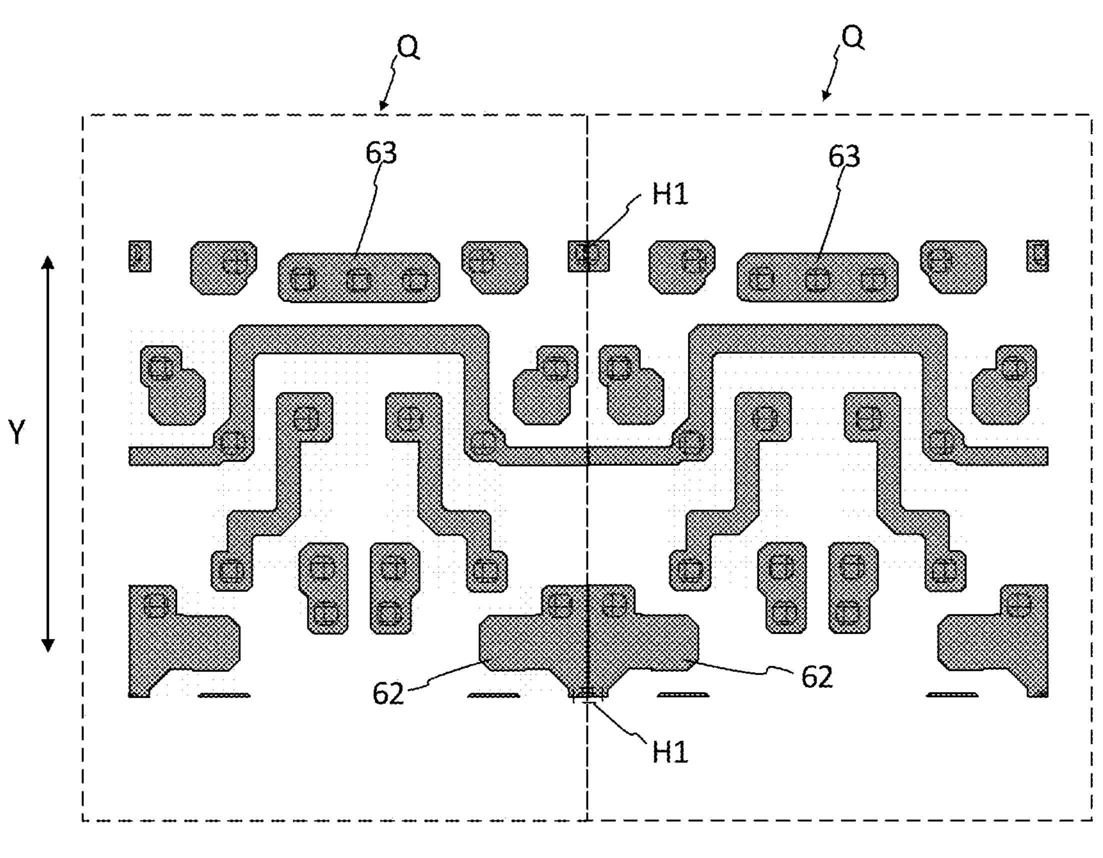
FIG. 19 is a structural layout of a fourth conductive layer in two repeating units.

FIG. 9 is a structural layout of the first active layer in FIG. 3. FIG. 10 is a structural layout of the fifth conductive layer in FIG. 3. FIG. 11 is a structural layout of the light shield layer in FIG. 3. FIG. 12 is a stacked structural layout of the second conductive layer, the second active layer and the third conductive layer in FIG. 3. FIG. 13 is a stacked structural layout of the second conductive layer, the third conductive layer and the fourth conductive layer in FIG. 12. FIG. 14 is a stacked structural layout of the first active layer and the first conductive layer in FIG. 3. FIG. 15 is a stacked layout of the first conductive layer and the active layer in two pixel driving circuits adjacent in the column direction, FIG. 16 is a stacked layout of the second active layer and the fifth conductive layer in FIG. 3. FIG. 17 is a stacked structural layout of the first conductive layer, the second conductive layer, the third conductive layer and the fourth conductive layer in FIG. 3. FIG. 18 is a stacked structural layout of the second conductive layer and the fifth conductive layer in two repeating units. FIG. 19 is a structural layout of the fourth conductive layers in two repeating units.

In the present exemplary embodiment, the second transistor T2 may be an oxide transistor, and the second transistor T2 may have a double-gate structure. As shown in FIG. 6, the second active layer 4 may include a second active portion 42 for forming a channel region of the second transistor T2. As shown in FIG. 9, the second conductive layer 3 may include a second gate line G2 used to form a bottom gate of the second transistor T2. Specifically, as shown in FIG. 12, an orthographic projection of the first gate line G1 on the base substrate may cover an orthographic projection of the second active portion 42 on the base substrate, and a partial structure of the first gate line G1 is used to form a top gate of the second transistor T2. An orthographic projection of the second gate line G2 on the base substrate may cover the orthographic projection of the second active portion 42 on the base substrate, and a partial structure of the second gate line G2 may form the bottom gate of the second transistor T2. Therefore, the orthographic projection of the first bridge portion 61 on the base substrate in the present exemplary embodiment also has an overlapping portion with the orthographic projection of the second gate line G2 on the base substrate.

Figure 8D:
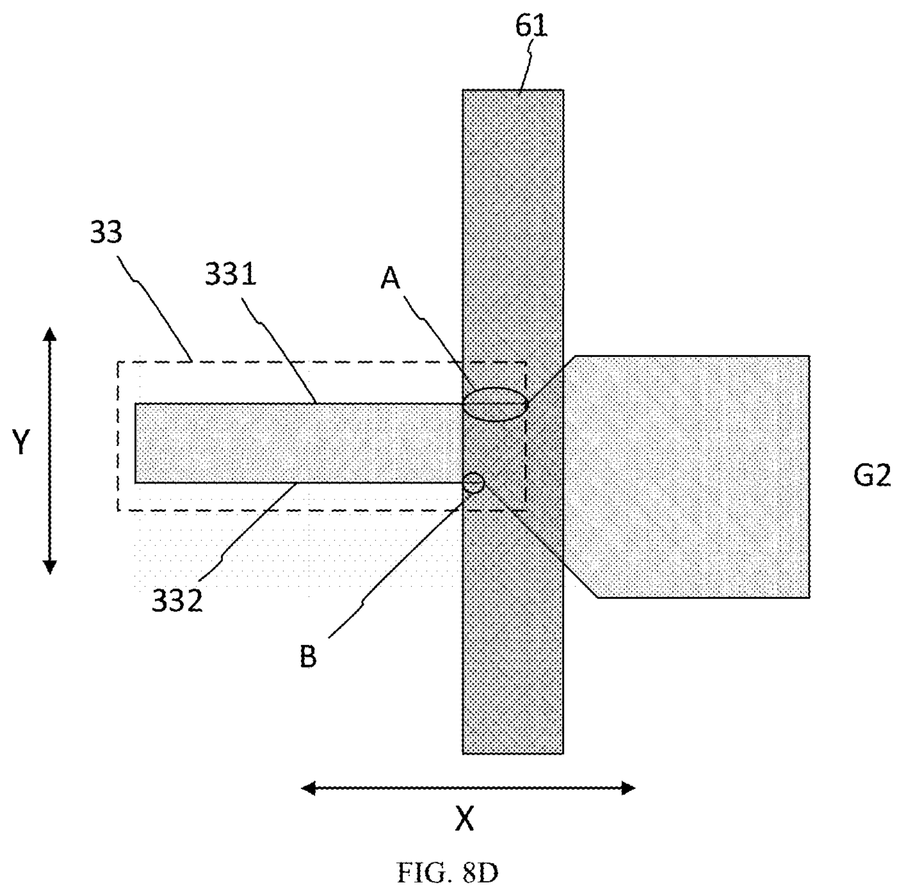
FIG. 8D is a stacked top view of a first bridge portion and a second gate line according to an embodiment of the present disclosure.

As shown in FIGS. 3 and 13, in the present exemplary embodiment, the orthographic projection of the first bridge portion 61 on the base substrate may perpendicularly intersect with an orthographic projection of at least the partial structure of the second gate line G2 on the base substrate. FIG. 8D is a stacked top view of a first bridge portion and a second gate line according to an embodiment of the present disclosure. As shown in FIG. 8D, the second gate line G2 may include a second extension portion 33. The second extension portion 33 may include a third side edge 331 and a fourth side edge 332 which are opposite to each other, and the orthographic projection of the first bridge portion on the base substrate may perpendicularly intersect with an orthographic projection of part of the segment A of the third side edge 331 on the base substrate and/or with an orthographic projection of part of the segment B of the fourth side edge on the base substrate. This structure is also beneficial to reduce the stress of the dielectric layer, thus reducing the risk of dielectric layer breaking.

It may be understood that, the second gate line G2 and the first gate line G1 have a certain convex height in a direction perpendicular to the plane of the base substrate, and the first bridge portion 61 needs to pass over a convex structure formed by the second gate line G2 and the first gate line G1 to make the eighth active portion 48 and the first conductive portion 21 at both sides of the gate line be connected to each other. That is, the first bridge portion 61 forms an uphill structure or a downhill structure on a side of the first gate line G1 and the downhill structure or the uphill structure on the other side of the first gate line G1. The present disclosure may further improve the structures of the first gate line G1 and the second gate line G2 based on the above embodiments, so as to further reduce the risk of breaking of the dielectric layer between the fourth conductive layer 6 and the third conductive layer 5.

Figure 13A:
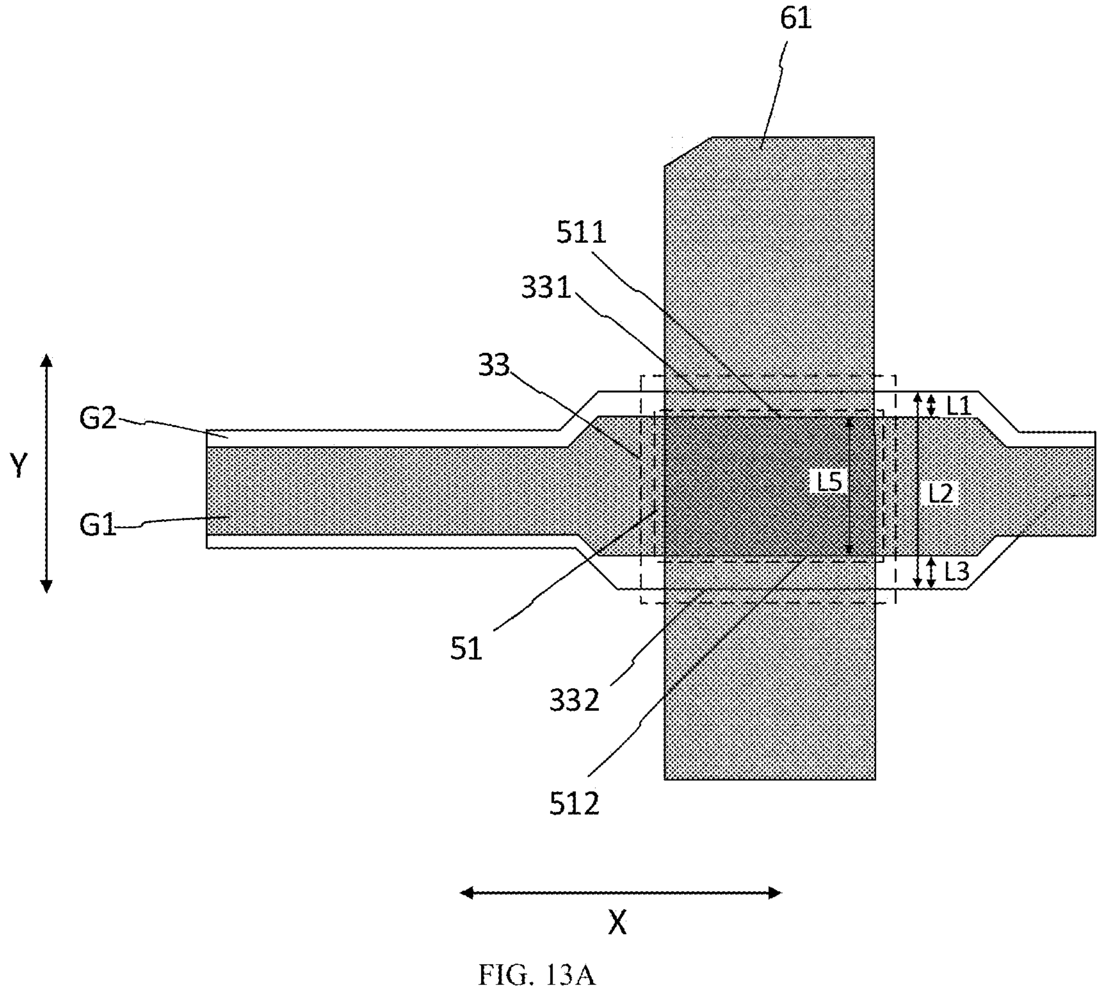
FIG. 13A is a stacked top view of a first gate line, a second gate line and a first bridge portion according to an embodiment of the present disclosure.

FIG. 13A is a stacked top view of a first gate line, a second gate line and a first bridge portion according to an embodiment of the present disclosure. As shown in FIGS. 3, 13 and 13A, in the present exemplary embodiment, the first gate line G1 may have a first extension portion 51 at a position where the first gate line G1 overlaps with the first bridge portion 61. The first extension portion 51 has a first side edge 511 and a second side edge 512 which are arranged opposite to each other. The second gate line G2 may have a second extension portion 33. The second extension portion 33 has a third side edge 331 and a fourth side edge 332 which are opposite to each other. An orthographic projection of the first side edge 511 on the base substrate is located on a side of the orthographic projection of the second side edge 512 on the base substrate away from the orthographic projection of the first conductive portion 21 on the base substrate, and an orthographic projection of the third side edge 331 on the base substrate is located on a side of the orthographic projection of the fourth side edge 332 on the base substrate away from the orthographic projection of the first conductive portion 21 on the base substrate. That is, the first side edge is adjacent to the third side edge, and the second side edge is adjacent to the fourth side edge. The orthographic projection of the first extension portion 51 on the base substrate may be a portion where the orthographic projection of the first gate line G1 on the base substrate overlaps with the orthographic projection of the first bridge portion 61 on the base substrate. The orthographic projection of the second extension portion 33 on the base substrate may be a portion where the orthographic projection of the second gate line G2 on the base substrate overlaps with the orthographic projection of the first bridge portion 61 on the base substrate. It may be understood that orthographic projections of other structures of the first gate line G1 on the base substrate and orthographic projections of other structures of the second gate line G2 on the base substrate may not be perpendicular to or intersect with the orthographic projection of the first bridge portion 61 on the base substrate.

As shown in FIGS. 3, 13, and 13A, in the present exemplary embodiment, the orthographic projection of the second extension portion 33 on the base substrate may completely cover the orthographic projection of the first extension portion 51 on the base substrate, and a distance between the first side edge 511 and the third side edge 331 and a distance between the second side edge 512 and the fourth side edge 332 are both greater than zero, which means that the second extension portion 33 has an extension section on both sides of the first extension portion 51 in the second direction Y. Therefore, the second gate line G2 may form a hemming structure on the first gate line G1. On basis of this, a width of the extension section of the second extension portion 33 in the column direction may be increased. On the one hand, a slope between the second extension portion 33 and the first extension portion 51 may be reduced. On the other hand, a slope of the second extension portion 33 and a slope of the first extension portion 51 may be spaced by a certain distance. In this way, uphill structures formed by the first bridge portion 61 on both sides of the second extension portion 33 and the first extension portion 51 may reduce the stress of the dielectric layer on the one hand. On the other hand, the stress of dielectric layer may be released in time. For example, as shown in FIG. 13A, a distance between an orthographic projection of any first node of the third side edge 331 on the base substrate and the orthographic projection of the first side edge 511 on the base substrate in the second direction Y is L1, and a distance between the orthographic projection of the first node on the base substrate and the orthographic projection of the fourth side edge 332 on the base substrate in the second direction Y is L2. A ratio L1/L2 may be set to be greater than or equal to 0.25 and less than or equal to 0.8, for example, the ratio may be 0.25. 0.3, 0.35, 0.4, 0.45, 0.5, 0.55, 0.6, 0.65, 0.7, 0.75, 0.8, etc., in order to increase a length of the extension section of the third side edge beyond the first side edge in the second direction and play a role in reducing the stress of the medium layer and releasing the stress of the medium layer in time. Similarly, the fourth side edge 332 of the second extension portion 33 may have a similar structure to the second side edge 512 of the first extension portion 51. A distance between the orthographic projection of any second node of the fourth side edge 332 on the base substrate and the orthographic projection of the second side edge 512 on the base substrate in the second direction Y is L3, and a distance between the orthographic projection of the second node on the base substrate and the orthographic projection of the third side edge on the base substrate in the second direction Y is L4. A ratio L3/L4 may be set to be greater than or equal to 0.25 and less than or equal to 0.8, for example, the ratio may be 0.25, 0.3, 0.35, 0.4, 0.45, 0.5, 0.55, 0.6, 0.65, 0.7, 0.75, 0.8, etc.

As shown in FIG. 13A, in the present exemplary embodiment, a width of an overlapping region of the orthographic projection of the first extension portion 51 on the base substrate and the orthographic projection of the second extension portion 33 on the base substrate in the second direction Y is L5. A ratio L1/L5 may be set to 0.6-1, such as 0.6, 0.65, 0.7, 0.75, 0.8, 0.85, 0.9 1, etc. Similarly, a ratio L3/L5 may be set to 0.6-1, such as 0.6, 0.65, 0.7, 0.75, 0.8, 0.85, 0.9, 0.95, 1, etc. By increasing a width of the orthographic projection of the first extension portion 51 on the base substrate and a width of the orthographic projection of the second extension portion 33 on the base substrate in the column direction, the interval distance of slopes on both sides of the first extension portion 51 may be increased. Therefore, after the dielectric layer goes uphill on one side of the first extension portion 51, the dielectric layer may then go downhill on the other side of the first extension portion 51 after a certain buffer time, and the stress of the dielectric layer may be reduced and released, thus further reducing the risk that dielectric layer is broken.

As shown in FIG. 13A, in other exemplary embodiments, the orthographic projection of the second extension portion 33 on the base substrate may cover the orthographic projection of the first extension portion 51 on the base substrate. The orthographic projection of the second extension portion 33 on the base substrate has a first center line in the first direction X, and the orthographic projection of the first extension portion 51 on the base substrate has a second center line. The first center line overlaps with the second center line, that is, the orthographic projection of the first extension portion 51 on the base substrate may be centrally arranged inside the orthographic projection of the second extension 31 on the base substrate. The orthographic projection of the second extension portion 33 on the base substrate has a first width in the second direction Y, and the orthographic projection of the first extension portion 51 on the base substrate has a second width in the second direction Y. At a same position, the ratio of the first width to the second width may be 1.5-3, such as 1.5, 1.7, 1.8, 2.0, 2.2, 2.4, 2.6, 2.8, 3.0, etc. By increasing the width of the second extension portion 33 in the second direction Y, a distance between a boundary of the orthographic projection of the first extension portion 51 on the base substrate and a boundary of the orthographic projection of the second extension portion 33 on the base substrate on the same side may be increased, such that there is a smooth transition section with a certain length between a convex structure formed by the second extension portion 33 and a convex structure formed by the first extension portion 51. That is, after the dielectric layer goes uphill on one side of the second extension portion 33, the dielectric layer goes a gentle transition for a certain distance before climbing over a convex slope of the first extension portion 51. Therefore, on the one hand, the stress of the dielectric layer may be reduced, and on the other hand, the stress of the dielectric layer may be released in time, such that the risk of breaking of the dielectric layer between the third conductive layer 5 and the fourth conductive layer 6 may be reduced.

The same position in the present exemplary embodiment may be understood as follows. A line segment is drawn from an orthographic projection of a point on one side edge of the first extension portion 51 on the base substrate along the second direction Y to an orthographic projection of the other side edge of the first extension portion 51 on the base substrate to obtain a first line segment. A line segment is drawn from an orthographic projection of a point on one side edge of the second extension on the base substrate along the second direction Y to an orthographic projection of the other side edge of the second extension on the base substrate to obtain a second line segment. A straight line where the first line segment is located coincides with a straight line where the second line segment is located.

Figure 13B:
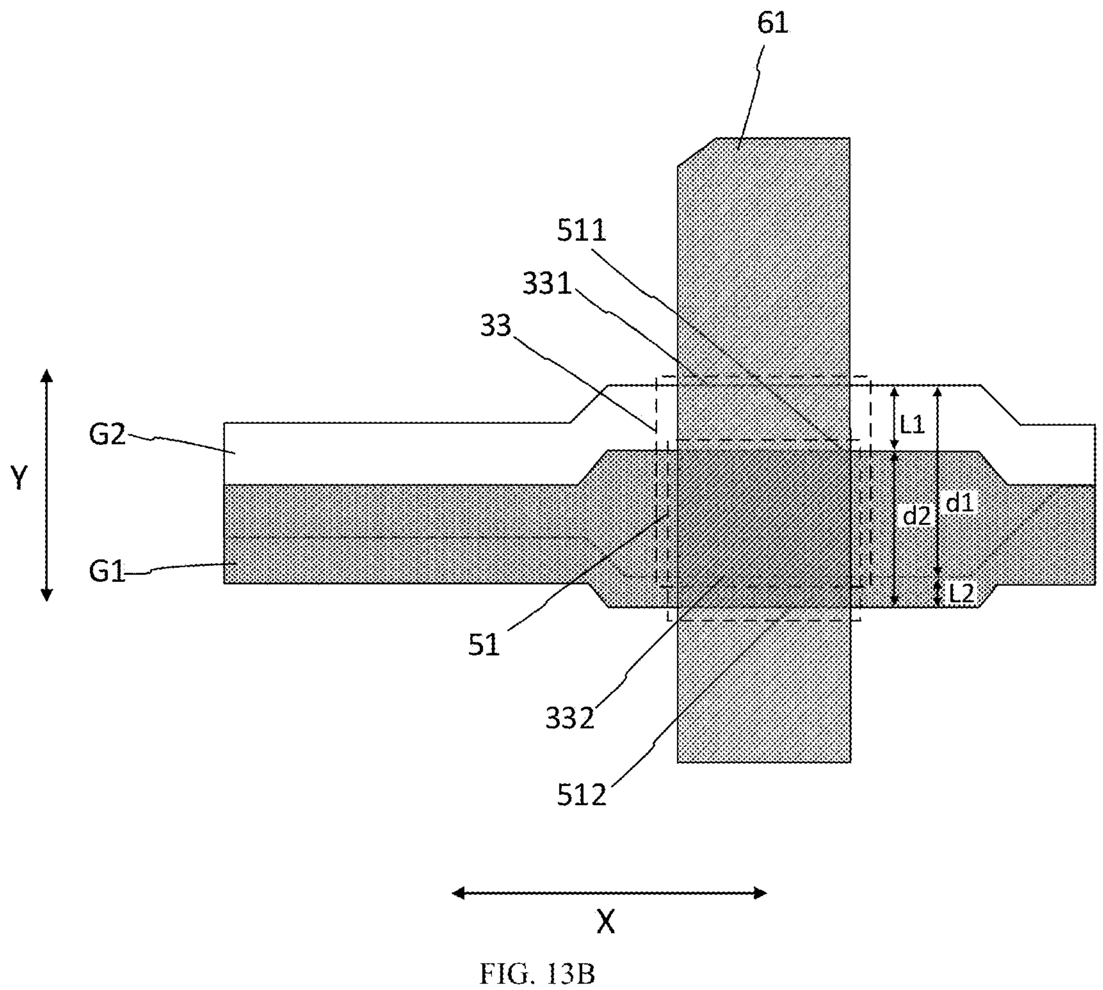
FIG. 13B is a stacked top view of a first gate line, a second gate line and a first bridge portion according to another embodiment of the present disclosure.

As shown in FIG. 13, in other exemplary embodiments, the orthographic projection of the second extension portion 33 on the base substrate may cover one side edge of the orthographic projection of the first extension portion 51 on the base substrate without covering the other side edge of the orthographic projection of the first extension portion 51 on the base substrate. Alternatively, the orthographic projection of the first extension portion 51 on the base substrate may cover one side edge of the orthographic projection of the second extension portion 33 on the base substrate without covering the other side edge of the orthographic projection of the second extension portion 33 on the base substrate. Exemplarily, FIG. 13B is a stacked top view of a first gate line, a second gate line and a first bridge portion according to another embodiment of the present disclosure. As shown in FIG. 13B, the first extension portion 51 has a first side edge 511 and a second side edge 512 which are arranged opposite to each other, and the second extension portion 33 has a third side edge 331 and a fourth side edge 332 which are opposite to each other. The first side edge 511 is adjacent to the third side edge 331, and the second side edge 512 is adjacent to the fourth side edge 332. The orthographic projection of the second extension portion 33 on the base substrate has a first width d1 in the second direction Y, and the orthographic projection of the first extension portion 51 on the base substrate has a second width d2 in the second direction Y. The first side edge 511 is adjacent to the third side edge 331, and a distance between the first side edge 511 and the third side edge 331 in the second direction Y is a first distance L1. The second side edge 512 is adjacent to the fourth side edge 332, and a distance between the second side edge 512 and the fourth side edge 332 in the second direction Y is a second distance L2 in the second direction Y. The orthographic projection of the second extension portion 33 on the base substrate may cover the first side edge 511, and the orthographic projection of the first extension portion 51 on the base substrate may cover the fourth side edge 332. Through this structure, the climbing difficulty of the dielectric layer may also be reduced by increasing the first distance L1 and the second distance L2, such that the stress of the dielectric layer between the fourth conductive layer 6 and the third conductive layer 5 may be released in time, thereby reducing the risk of breaking of the dielectric layer. Exemplarily, a ratio of the first distance L1 to the second width d2 at the same position may be 0.25-0.8, for example, the ratio may be 0.25, 0.3, 0.35, 0.4, 0.45, 0.5, 0.55, 0.6, 0.65, 0.7, 0.75, 0.8, etc. Similarly, a ratio of the second distance L2 to the second width d2 may be 0.25-0.8, for example, the ratio may be 0.25, 0.3, 0.35, 0.4, 0.45, 0.5, 0.55, 0.6, 0.65, 0.7, 0.75, 0.8, etc.

In the present exemplary embodiment, a width of an extension portion in the second direction Y may be understood as a distance in the second direction Y between an orthographic projection of any point of one side of the extension portion on the base substrate and an orthographic projection of the other side of the extension portion on the base substrate.

It should be understood that: both the orthographic projection of the first gate line G1 on the base substrate and the orthographic projection of the second gate line G2 on the base substrate do not overlap with orthographic projections of other structures adjacent to them in the column direction on the base substrate. That is, in the present disclosure, when the width of the first extension portion 51 in the first gate line G1 and/or the second extension portion 33 in the second gate line G2 in the column direction is widen, the space of other structures in the column direction will not be occupied. For example, on basis of the above embodiment, the first distance L1 may be set to be greater than or equal to 1.3 μm, such as 1.3 μm, 1.4 μm, 1.5 μm, 1.6 μm, 1.8 μm, etc. Similarly, the second distance L2 may be set to be greater than or equal to 1.3 μm, such as 1.3 μm, 1.4 μm, 1.5 μm, 1.6 μm, 1.8 μm, etc. In addition, it should be understood that: a distance between a boundary of the orthographic projection of the first extension portion 51 in the first gate line G1 on the base substrate and a boundary of the orthographic projection of the second extension portion 33 in the second gate line G2 on the base substrate may be increased in the case of sufficient space of pixels. For example, as shown in FIG. 9, the first active layer 1 may include a fifth active portion 15 and a sixth active portion 16. The fifth active portion 15 may be used to form a channel region of the fifth transistor T5 and the sixth active portion 16 may be used to form a channel region of the sixth transistor T6. A distance between an orthographic projection of the fifth active portion 15 on the base substrate and an orthographic projection of the sixth active portion 16 on the base substrate in the first direction X may be a sixth distance L6. A ratio of the second distance L2 to the sixth distance L6 may be set to be greater than or equal to 5%, such as 5%, 6%, 7%, 8%, etc. Similarly, a ratio of the second distance L2 to the sixth distance L6 may be set to be greater than or equal to 5%, such as 5%, 6%, 7%, 8%, etc. The ratio may be set according to the size of pixels. In the present exemplary embodiment, the distance between the orthographic projection of the fifth active portion 15 on the base substrate and the orthographic projection of the sixth active portion 16 on the base substrate in the first direction X may be understood as a distance between the side edge of the orthographic projection of the fifth active portion 15 on the base substrate away from the orthographic projection of the third active portion in the pixel driving circuit on the base substrate and the side edge of the orthographic projection of the sixth active portion 16 on the base substrate away from the orthographic projection of the third active portion in the pixel driving circuit on the base substrate, that is, a distance between outer side edges of orthographic projections of the two active portions on the base substrate.

As shown in FIG. 12, in the present exemplary embodiment, the first gate line G1 may have a first component 52 and a second component 53. A width of the first component 52 in the second direction Y is greater than a width of the second component 53 in the second direction Y. An orthographic projection of the first component 52 on the base substrate may cover the orthographic projection of the second active portion 42 on the base substrate. The first gate line G1 forms a bottom gate of the second transistor T2. Similarly, the second gate line G2 may have a third component 34 and a fourth component 35. A width of the third component 34 in the second direction Y may be greater than a width of the fourth component 35 in the second direction Y. An orthographic projection of the third component 34 on the base substrate may cover an orthographic projection of the second active portion 42 on the base substrate. The second gate line G2 forms a top gate of the second transistor T2. The orthographic projection of the third component 34 on the base substrate may cover the orthographic projection of the first component 52 on the base substrate.

Figure 13C:
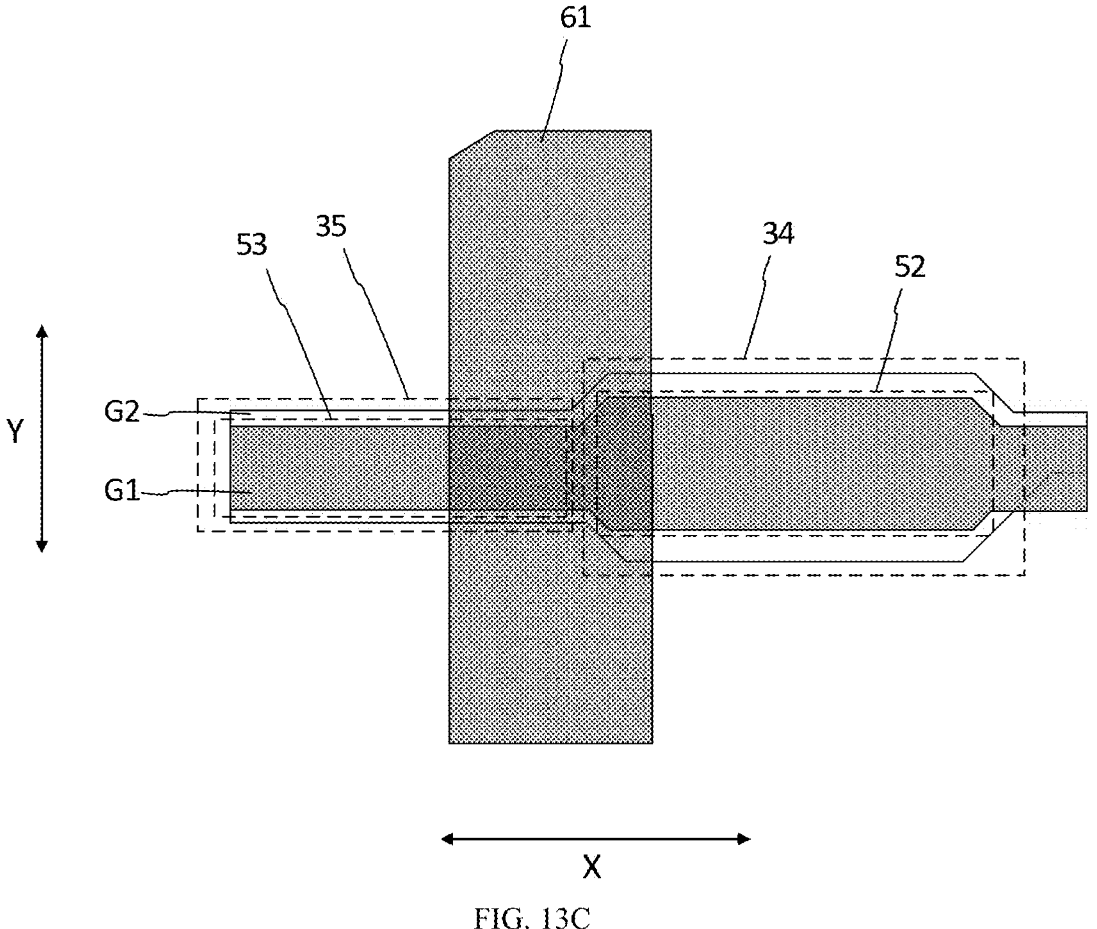
FIG. 13C is a stacked top view of a first gate line, a second gate line and a first bridge portion according to yet another embodiment of the present disclosure.
Figures 13D, 14:
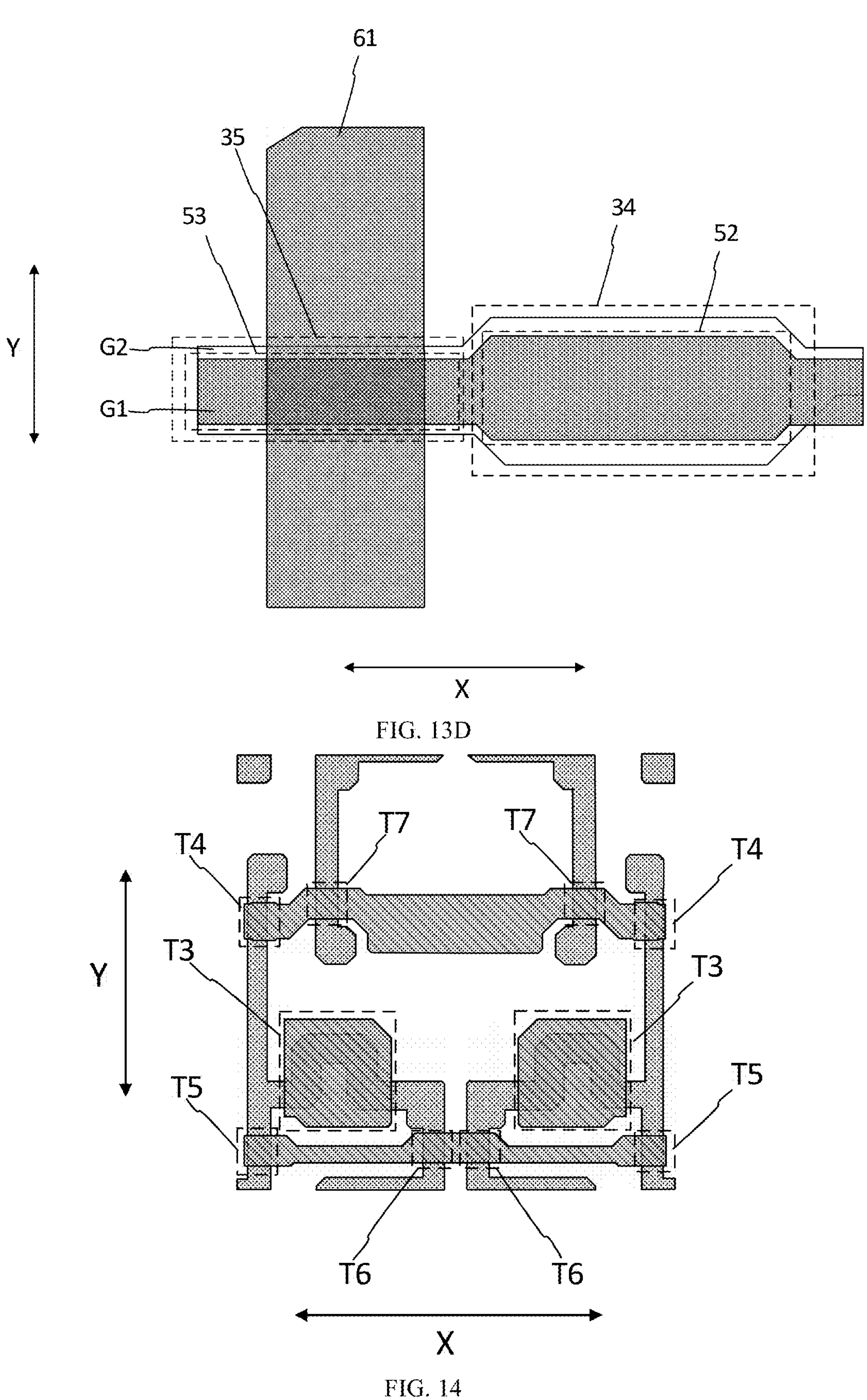
FIG. 13D is a stacked top view of a first gate line, a second gate line and a first bridge portion according to another embodiment of the present disclosure.
FIG. 14 is a stacked structural layout of the first active layer and the first conductive layer in FIG. 3.

FIG. 13C is a stacked top view of a first gate line, a second gate line and a first bridge portion according to yet another embodiment of the present disclosure. As shown in FIG. 13C, in the present exemplary embodiment, the orthographic projection of the first bridge portion 61 located on the fourth conductive layer 6 on the base substrate may partially overlap with the orthographic projection of the first component 52 on the base substrate and the orthographic projection of the second component 53 on the base substrate, and the orthographic projection of the first bridge portion 61 on the base substrate may also partially overlap with the orthographic projection of the third component 34 on the base substrate and the orthographic projection of the fourth component 35 on the base substrate.

As shown in FIG. 13A, in other exemplary embodiments, the orthographic projection of the first bridge portion 61 on the base substrate may partially overlap with the orthographic projection of the first component 52 on the base substrate and the orthographic projection of the third component 34 on the base substrate, but not with the orthographic projection of the second component 53 on the base substrate and the orthographic projection of the fourth component 35 on the base substrate. That is, the orthographic projection of the first bridge portion 61 on the base substrate only overlaps with an orthographic projection of a widened portion of the first gate line G1 and the second gate line G2 in the column direction on the base substrate, but does not overlap with an orthographic projection of a non-widened portion of the first gate line G1 and the second gate line G2 on the base substrate.

FIG. 13D is a stacked top view of a first gate line, a second gate line and a first bridge portion according to another embodiment of the present disclosure. As shown in FIG. 13D, in other exemplary embodiments, the orthographic projection of the first bridge portion 61 on the base substrate may partially overlap with the orthographic projection of the second component 53 on the base substrate and the orthographic projection of the fourth component 35 on the base substrate, but not with the orthographic projection of the first component 52 on the base substrate and the orthographic projection of the third component 34 on the base substrate. That is, the orthographic projection of the first bridge portion 61 on the base substrate only overlaps with the orthographic projection of the non-widened portion of the first gate line G1 and the second gate line G2 in the column direction on the base substrate, but does not overlap with the orthographic projection of the widened portion of the first gate line G1 and the second gate line G2 on the base substrate.

As shown in FIG. 11, in the present exemplary embodiment, the light shield layer may include a plurality of light shield portions 10 arranged in the row direction X and the column direction Y, and adjacent light shield portions 10 may be connected to each other. The light shield layer may be a conductor structure, for example, the light shield layer may be a light shield metal layer.

As shown in FIG. 9, in the present exemplary embodiment, the first active layer 1 may include a third active portion 13, a fourth active portion 14 and a seventh active portion 17 in addition to the fifth active portion 15 and the sixth active portion 16. The third active portion 13 may be configured to form a channel region of the driving transistor T3, the fourth active portion 14 may be configured to form a channel region of the fourth transistor T4, and the seventh active portion 17 may be configured to form a channel region of the seventh transistor T7. In addition, the first active layer 1 may further include a ninth active portion 19, an eleventh active portion 111, a twelfth active portion 112, a thirteenth active portion 113, a fifteenth active portion 115, and a sixteenth active portion 116. The ninth active portion 19 is connected to a side of the seventh active portion 17 away from a fourth node in the pixel driving circuit in a previous row, and used to form the second electrode of the seventh transistor T7. The eleventh active portion 111 is connected to the third active portion 13 and the sixth active portion 16. The eleventh active portion 111 forms the third node N3 in FIG. 1. The first electrode of the sixth transistor T6 is connected to the first electrode of the driving transistor T3 via the eleventh active portion 111. The twelfth active portion 112 is connected to the third active portion 13, the fourth active portion 14 and the fifth active portion 15. The twelfth active portion 112 forms the second node N2 in FIG. 1. The first electrode of the fourth transistor T4 and the first electrode of the fifth transistor T5 are connected to the second electrode of the driving transistor T3 via the twelfth active portion 112. The thirteenth active portion 113 is connected to the sixth active portion 16 and the seventh active portion 17. The thirteenth active portion 113 is used to form the fourth node N4 in FIG. 1. The second electrode of the sixth transistor T6 is connected to the first electrode of the seventh transistor T7 via the thirteenth active portion 113. It should be noted that in the present exemplary embodiment, the seventh active portion 17 of pixel driving of the current row is located on the pixel driving circuit in the next row, so the thirteenth active portion 113 is essentially located between the pixel driving circuit in the current row and the pixel driving circuit in the next row. The fifteenth active portion 115 is connected to a side of the fifth active portion 15 away from the twelfth active portion 112 and forms the second electrode of the fifth transistor T5. The fifteenth active portion 115 may be connected to the second bridge portion 62 located on the fourth conductive layer 6 through a via hole H1. The second electrode of the fifth transistor T5 is connected to the first power supply line Vdd through the second bridge portion 62. The sixteenth active portion 116 is connected to a side of the fourth active portion 14 away from the twelfth active portion 112 and form the second electrode of the fourth transistor T4. The sixteenth active portion 116 may be connected to the sixth bridge portion 66 located on the fourth conductive layer 6 through a via hole H6. The second electrode of the fourth transistor T4 is connected to the data line Data through the sixth bridge portion 66. The first active layer 11 may be formed of a polysilicon semiconductor material, and correspondingly, the transistor in the display panel of the present disclosure may be a P-type low-temperature polysilicon thin film transistor.

As shown in FIG. 4, in the present exemplary embodiment, the orthographic projection of the first conductive portion 21 in the first conductive layer 2 on the base substrate may cover the orthographic projection of the third active portion 13 on the base substrate, and the first conductive portion 21 may be configured to form a gate of the driving transistor T3 and a first electrode of the storage capacitor C. The first conductive layer 2 may further include an enable signal line EM, a third reset signal line Re3, and a third gate line G3. The enable signal line EM may be configured to provide the enable signal terminal EM in FIG. 1. An orthographic projection of the enable signal line EM on the base substrate may extend in the first direction X and cover the fifth active portion 15 and the sixth active portion 16, and a partial structure of the enable signal line EM is used to form the gate of the fifth transistor T5 and the partial structure of the enable signal line EM is used to form the gate of the sixth transistor T6. A third gate line G3 may be configured to provide the second gate driving signal terminal GATE2 in FIG. 1. An orthographic projection of the third gate line G3 on the base substrate extends along the first direction X and covers the orthographic projection of the fourth active portion 14 on the base substrate. A partial structure of the third gate line G3 is used to form the gate of the fourth transistor T4 and provide a second gate driving signal to the gate of the fourth transistor T4. The third reset signal line Re3 may be configured to provide the second reset signal terminal Re1 in FIG. 1. An orthographic projection of the third reset signal line Re3 on the base substrate may extend along the first direction X and cover the seventh active portion 17. A partial structure of the third reset signal line Re3 is used to form the gate of the seventh transistor T7 and provide the second reset signal to the gate of the seventh transistor T7. As shown in FIG. 15, in the present exemplary embodiment, the third gate line G3 of the pixel driving circuit of the current row may be multiplexed as the third reset signal line Re3 of the pixel driving circuit of the previous row. This setting may improve the integration of the pixel driving circuit and reduce the layout area of the pixel driving circuit. The orthographic projection of the third reset signal line Re3 on the base substrate may cover the orthographic projection of the eighth active portion 48 on the base substrate to form the first node N1 in FIG. 1.

In the present exemplary embodiment, in the display panel, the first conductive layer 2 may be used as a mask to perform a conductive treatment on the active layer, that is, a region of the active layer covered by the first conductive layer 2 forms a channel region of the transistor, and a region of the active layer not covered by the first conductive layer 2 forms a conductor structure.

It should be understood that "an orthographic projection of a certain structure A on the base substrate covers an orthographic projection of another structure B on the base substrate" described in the present exemplary embodiment may be understood as "an outline of the projection of the structure B on a plane of the base substrate is completely inside an outline of the projection of the structure A on the same plane".

As shown in FIGS. 5 and 14, in the present exemplary embodiment, the second conductive layer 3 may include a first initial signal line Vinit1, a first reset signal line Re1, a second gate line G2, and a second conductive portion 32. The first initial signal line Vinit1 may be used to provide the first initial signal terminal INIT1 in FIG. 1, and an orthographic projection of the first initial signal line Vinit1 on the base substrate may extend along the first direction X. The first initial signal line Vinit1 may be connected to a fourteenth active portion 414 located on the second active layer 4 through the third bridge portion 63 in the fourth conductive layer, such that the second electrode of the first transistor t1 is connected to the first initial signal line Vinit1. The first reset signal line Re1 may be configured to provide the first reset signal terminal RE1 in FIG. 1. An orthographic projection of the first reset signal line Re1 on the base substrate may extend along the first direction X and cover the orthographic projection of the first active portion 41 on the base substrate. A partial structure of the first reset signal line Re1 is used to form a bottom gate of the first transistor T1. The second gate line G2 may be configured to provide the first gate driving signal terminal GATE1 in FIG. 1. An orthographic projection of the second gate line G2 on the base substrate may extend along the first direction X and cover the orthographic projection of the second active portion 42 on the base substrate. A partial structure of the second gate line G2 is used to form a bottom gate of the second transistor T2. An orthographic projection of the second conductive portion 32 on the base substrate partially overlaps with the orthographic projection of the first conductive portion 21 on the base substrate. The second conductive portion 32 may be configured to form a second electrode of the storage capacitor C. The second conductive portion 32 may be connected to the first power supply line Vdd located on the fifth conductive layer 7 through a via hole H2, such that the second electrode of the storage capacitor C may be connected to the first power supply line Vdd.

As shown in FIG. 6, in the present exemplary embodiment, the eighth active portion 48 in the second active layer 4 may be configured to form the first node N1 in FIG. 1. On the one hand, the eighth active portion 48 is connected to the first electrode of the first transistor T1 and the first electrode of the second transistor T2. The first electrode of the first transistor T1 and the first electrode of the second transistor T2 are connected to the first node N1. The eighth active portion 48 may be connected to the first bridge portion 66 located on the fourth conductive layer 6 through a via hole H27, and the first nodeN1 is connected to a gate of the driving transistor T3 via a first bridge portion 61 through a via hole H43. The second active layer 4 may further include a first active portion 41, a tenth active portion 410, and a fourteenth active portion 414. The first active portion 41 may be configured to form a channel region of the first transistor T1, and the first electrode of the second transistor T2 is connected to the first node N1 through an eighth active portion 48. The tenth active portion 410 is connected to a side of the second active portion 42 away from the eighth active portion 48. The tenth active portion 410 may be connected to a fourth bridge portion 64 located on the fourth conductive layer 6 through a via H5, such that the second electrode of the second transistor T2 is connected to the third node N3 through the fourth bridge portion 64. The fourteenth active portion 414 is connected to an end of the first active portion 41 away from the eighth active portion 48. The fourteenth active portion 414 may be connected to the third bridge portion 63 located on the fourth conductive layer 6 through a via hole H3, and the second electrode of the first transistor T1 is connected to the first initial signal line Vinit1 of the second conductive layer 3 through the third bridge portion 63. The second active layer 4 may be formed of indium gallium zinc oxide, and correspondingly, the first transistor T1 and the second transistor T2 may be N-type metal oxide thin film transistors.

As shown in FIG. 7, in the present exemplary embodiment, the third conductive layer 5 may include a second reset signal line Re2 and a first gate line G1. An orthographic projection of the second reset signal line Re2 on the base substrate may extend along the first direction X and cover the orthographic projection of the first active portion 41 on the base substrate, and a partial structure of the second reset signal line Re2 is used to form a top gate of the first transistor T1. An orthographic projection of the first gate line G1 on the base substrate may extend along the first direction X and cover the orthographic projection of the second active portion 42 on the base substrate, and a partial structure of the first gate line G1 is used to form the top gate of the second transistor T2. In addition, in the display panel, the third conductive layer 5 may be used as a mask to perform a conductive treatment on the second active layer 4, that is, a region of the second active layer 4 covered by the third conductive layer 5 forms a channel region of the transistor, and a region of the second active layer 4 not covered by the third conductive layer 5 forms a conductor structure.

As shown in FIG. 8, in the present exemplary embodiment, the first bridge portion 61 in the fourth conductive layer 6 may include a first connection sub-portion 611, a second connection sub-portion 612 and a third connection sub-portion 613. The first connection sub-portion 611 is connected between the second connection sub-portion 612 and the third connection sub-portion 613, and an orthographic projection of the first connection sub-portion 611 on the base substrate may perpendicularly intersects with an orthographic projection of a side edge of the first extension portion 51 in the first gate line G1 on the base substrate. The fourth conductive layer 6 may further include a second bridge portion 62, a third bridge portion 63, a fourth bridge portion 64, and a sixth bridge portion 66. The second bridge portion 62 may be connected to the fifteenth active portion 115 through the first via hole H1, and the second bridge portion 62 may also be connected to the first power supply line Vdd of the fifth conductive layer 7 through another via hole H2, thereby the second electrode of the fifth transistor T5 is connected to the first power supply line Vdd. In addition, the second bridge portion 62 may also be connected to the second conductive portion 32 through the via hole H28, thereby the second electrode of the storage capacitor C is connected to the first power supply line Vdd. An orthographic projection of the third bridge portion 63 on the base substrate may extend along the first direction X. The third bridge portion 63 may be connected to the first initial signal line Vinit1 through the via hole H8 and the fourteenth active portion 414 through the via hole H3, such that the second electrode of the first transistor T1 is connected to the first initial signal line Vinit1 through the third bridge portion 63. The fourth bridge portion 64 may be connected to the eleventh active portion 111 through the via hole H4 and the tenth active portion 410 through the via hole H5, thereby the second electrode of the second transistor T2 is connected to the third node. The sixth bridge portion 66 may be connected to the data line Data located on the fifth conductive layer 7 through a via hole H7 and the sixteenth active portion 116 through a via hole H6, such that the second electrode of the fourth transistor T4 is connected to the data line Data. In addition, the fourth conductive layer 6 may also include a second initial signal line Vinit2. The second initial signal line Vinit2 may be configured to provide the second initial signal terminal INIT2 in FIG. 1. A partial structure of the second initial signal line Vinit2 is bent to avoid the first bridge portion 61 and is connected to the second initial signal line Vinit2 in an adjacent pixel driving circuit adjacent in the row direction. The second initial signal line Vinit2 may be connected to the ninth active portion 19 through a via hole H9, thereby the second electrode of the seventh transistor T7 is connected to the second initial signal lineVinit2. In the present exemplary embodiment, the first initial signal line Vinit1 is used to provide a first initialization signal, and the second initial signal line Vinit2 is used to provide a second initialization signal. The first initialization signal and the second initialization signal may not be the same, so the pixel driving circuit may provide different initialization signals to the first node N1 and the first electrode of the light emitting device according to actual requirements. For example, an effective level voltage of the first initialization signal may be set to −3V, and an effective level voltage of the second initialization signal may be set to −4V, which may ensure that the display screen has low brightness in the black state and improve the picture display effect.

As shown in FIG. 10, in the present exemplary embodiment, the fifth conductive layer 7 may include a first power supply line Vdd and a data line Data, and an orthographic projection of the first power supply line Vdd on the base substrate and an orthographic projection of the data line Data on the base substrate may both extend in the second direction Y. The first power supply line Vdd may be configured to provide the first power supply terminal VDD in FIG. 1. The first power supply line Vdd may be connected to the second bridge portion 62 located on the fourth conductive layer 6 through the via hole H2, such that the second electrode of the fifth transistor T2 and the second electrode of the storage capacitor C are connected to the first power supply line Vdd through the second bridge portion 62. The data line Data may be configured to provide the data signal terminal DATA in FIG. 1. The data line Data may be connected to the sixth bridge portion 66 of the fourth conductive layer 6 through the via hole H7, such that the second electrode of the fourth transistor T4 is connected to the data line Data through the sixth bridge portion 66.

In the present exemplary embodiment, a structure A extends in a direction B, which means that the structure A may include a main part and a secondary part connected to the main part. The main part is a line, a line segment or a strip-shaped body, and the main part extends in the direction B, and a length of the main part extending in the direction B is greater than a length of the secondary part extending in other directions.

As shown in FIG. 16, in the present exemplary embodiment, the orthographic projection of the first power supply line Vdd on the base substrate may cover the orthographic projection of the eighth active portion 48 on the base substrate, such that the first power supply line Vdd may shield the first node and stabilize the voltage of the first node, which may prevent the interference of static electricity or other signals in the circuit to the first node, thereby weakening the crosstalk phenomenon and further improving the display uniformity. Further, as shown in FIG. 16, the orthographic projection of the first power supply line Vdd on the base substrate may cover orthographic projections of other structures of the second active layer 4 on the base substrate, that is, the second active layer 4 is shielded by the first power supply line Vdd to shield the interference of other signals on the second active layer 4, thereby improving the stability of the second active layer 4.

As shown in FIG. 17, in the present exemplary embodiment, in a same pixel driving circuit, the orthographic projection of the first conductive portion 21 on the base substrate may be located between the orthographic projection of the enable signal line EM and the orthographic projection of the first gate line G1 on the base substrate. In the same pixel driving circuit, the orthographic projection of the first gate line G1 on the base substrate, the orthographic projection of the third reset signal line Re3 on the base substrate, the orthographic projection of the first reset signal line Re1 on the base substrate, and the first initial signal line Vinit1 on the base substrate are sequentially arranged in a direction away from the first conductive portion. In addition, the orthographic projection of the first gate line G1 on the base substrate may partially overlap with the orthographic projection of the second gate line G2 on the base substrate, and the orthographic projection of the first reset signal line Re1 on the base substrate may partially overlap with the orthographic projection of the second reset signal line Re2 on the base substrate. As shown in FIG. 17, the second initial signal line Vinit2 may include a first signal line extension portion Vinit2-1, a second signal line extension portion Vinit2-2 and a third signal line extension portion Vinit2-3. An orthographic projection of the first signal line extension portion Vinit2-1 on the base substrate may extend along the first direction X and be located between the orthographic projection of the third reset signal line Re3 on the base substrate and the orthographic projection of the first gate line G1 on the base substrate. An orthographic projection of the second signal line extension portion Vinit2-2 on the base substrate may extend along the second direction Y. An orthographic projection of the third signal line extension portion Vinit2-3 on the base substrate may extend along the first direction X and be located between the orthographic projection of the third reset signal line Re3 on the base substrate and the orthographic projection of the first reset signal line Re1 on the base substrate.

As shown in FIG. 3, in the present exemplary embodiment, a plurality of pixel driving circuits may include a first pixel driving circuit P1 and a second pixel driving circuit P2 which are adjacently arranged in the row direction X. The first pixel driving circuit P1 and the second pixel driving circuit P2 may be arranged in mirror symmetry. The first pixel driving circuit P1 and the second pixel driving circuit P2 may form a repeating unit Q, and the display panel may include a plurality of repeating units Q arranged in an array in the row direction X and the column direction Y. In two adjacent repeating units Q in the row direction, the first pixel driving circuit P1 in one repeating unit Q is arranged adjacent to the second pixel driving circuit P2 in the adjacent other repeating unit Q, and the second pixel driving circuit P2 in one repeating unit Q is arranged adjacent to the first pixel driving circuit P1 in the other repeating unit Q.

As shown in FIG. 18, in the present exemplary embodiment, in one repeating unit Q, the first pixel driving circuit P1 and the second pixel driving circuit P2 are arranged in mirror symmetry, and the first power supply line Vdd in the first pixel driving circuit P1 and the first power supply line Vdd in the second pixel driving circuit P2 may be connected to each other as a whole, while the second conductive portion 32 may be disconnected. In two repeating units Q adjacent in the row direction, the first power supply line Vdd in the first pixel driving circuit P1 may not be connected to the first power supply line Vdd in the second pixel driving circuit P2 in the adjacent repeating unit Q, and the second conductive portion 32 in the first pixel driving circuit P1 is connected to the second conductive portion 32 in the second pixel driving circuit P2 in the adjacent repeating unit Q, such that the power supply line VDD and the second conductive portion 32 may form a grid structure. The power supply line with the grid structure may reduce the voltage drop of the power supply signal thereon. In addition, as shown in FIG. 18, in the same repeating unit Q, the data line Data in the first pixel driving circuit P1 and the data line Data in the second pixel driving circuit P2 are not connected to each other, and the two data lines Data are arranged on both sides of the two first power supply lines Vdd, respectively.

As shown in FIG. 19, in the present exemplary embodiment, in two adjacent repeating units Q in the row direction, the second bridge portion 62 in the first pixel driving circuit P1 and the second bridge portion 62 in the second pixel driving in the adjacent repeating unit Q may be connected to each other, and the first pixel driving circuit P1 and the second pixel driving circuit P2 in the adjacent repeating unit Q may share one first via hole H1. Two sub-pixels share one first via hole H1, which may save the occupied space of sub-pixels and is beneficial to improving the space utilization rate of the display panel.

As shown in FIG. 19, in the present exemplary embodiment, in one repeating unit Q, the first pixel driving circuit P1 and the second pixel driving circuit P2 may share one third bridge portion 63, thereby saving the occupied space of sub-pixels and being beneficial to improving the space utilization rate of the display panel.

Figure 20:
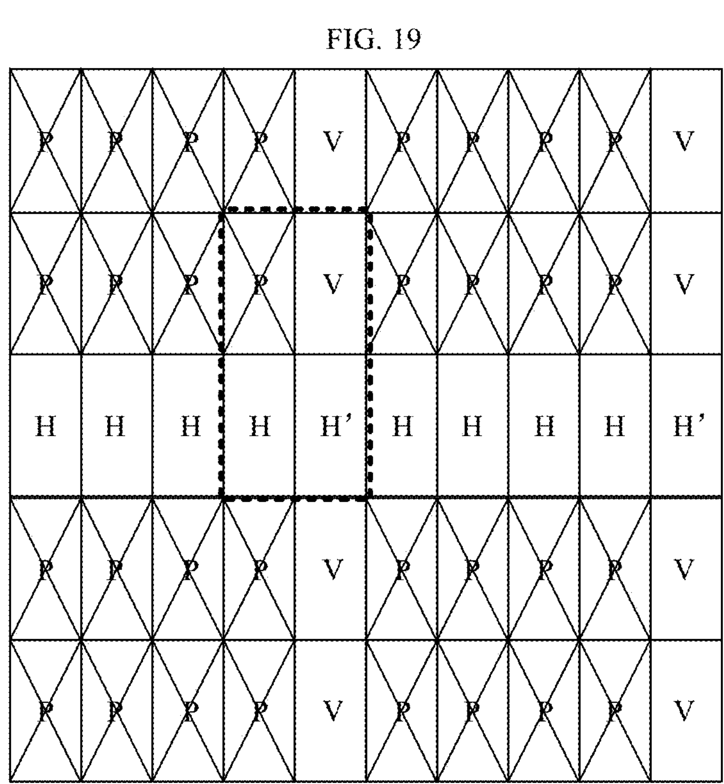
FIG. 20 is a schematic structure diagram of a pixel arrangement according to an embodiment of the present disclosure.

In recent years, with the rapid development of the display industry, consumers have increasingly strict requirements for display borders, and narrow borders or even no borders have gradually become the trend and trend. It is no longer a concept to compress fanout wires into the active area (AA), but a reality. One way to put the fanout wires into the active area is to longitudinally compress the pixels in the active area. As shown in FIG. 20, tightly arranged compressed pixels are used in a gate on panel (GOP) area located on a side of the active area close to the border area, and the compressed pixels are arranged by inserting virtual (dummy) pixels in a non-GOP area in the active area. In FIG. 20, P represents a normal sub-pixel, H represents an inserted virtual pixel row, and V represents an inserted virtual pixel column.

Figure 21:
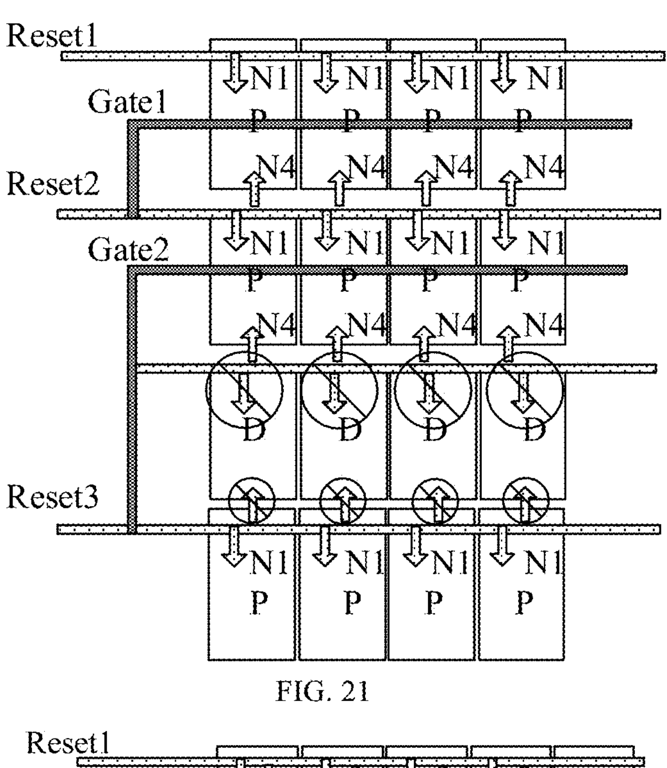
FIG. 21 is a schematic diagram of a gate driver on array (GOA) load of a display region in the related art.

However, the following problem is that a loading of a gate driver on array (GOA) signal in a region where the virtual pixel row is not inserted in the active area and a region where the virtual pixel row is inserted in the active area will be different. As shown in FIG. 21, if the scanning signal line Gate of the current row is used to drive the seventh transistor T7 of the current row, in the region where the virtual pixel row is not inserted, one row of GOA drives one row of scanning signal line Gate and one row of reset signal line Reset, but in the region where the virtual pixel row is inserted, one row of GOA drives one row of scanning signal line Gate and two rows of reset signal lines Reset, which illustrates that the loading of GOA in the region where the virtual pixel row is inserted is increased by one row compared with the loading of GOA in the region where the virtual pixel row is not inserted, which is very unfavorable for display. This is because the loading of GOA in the region where the virtual pixel row is inserted is large, which will lead to a difference in the charging time from the region where the virtual pixel row is not inserted and the display effect of the display panel is poor.

Figure 23:
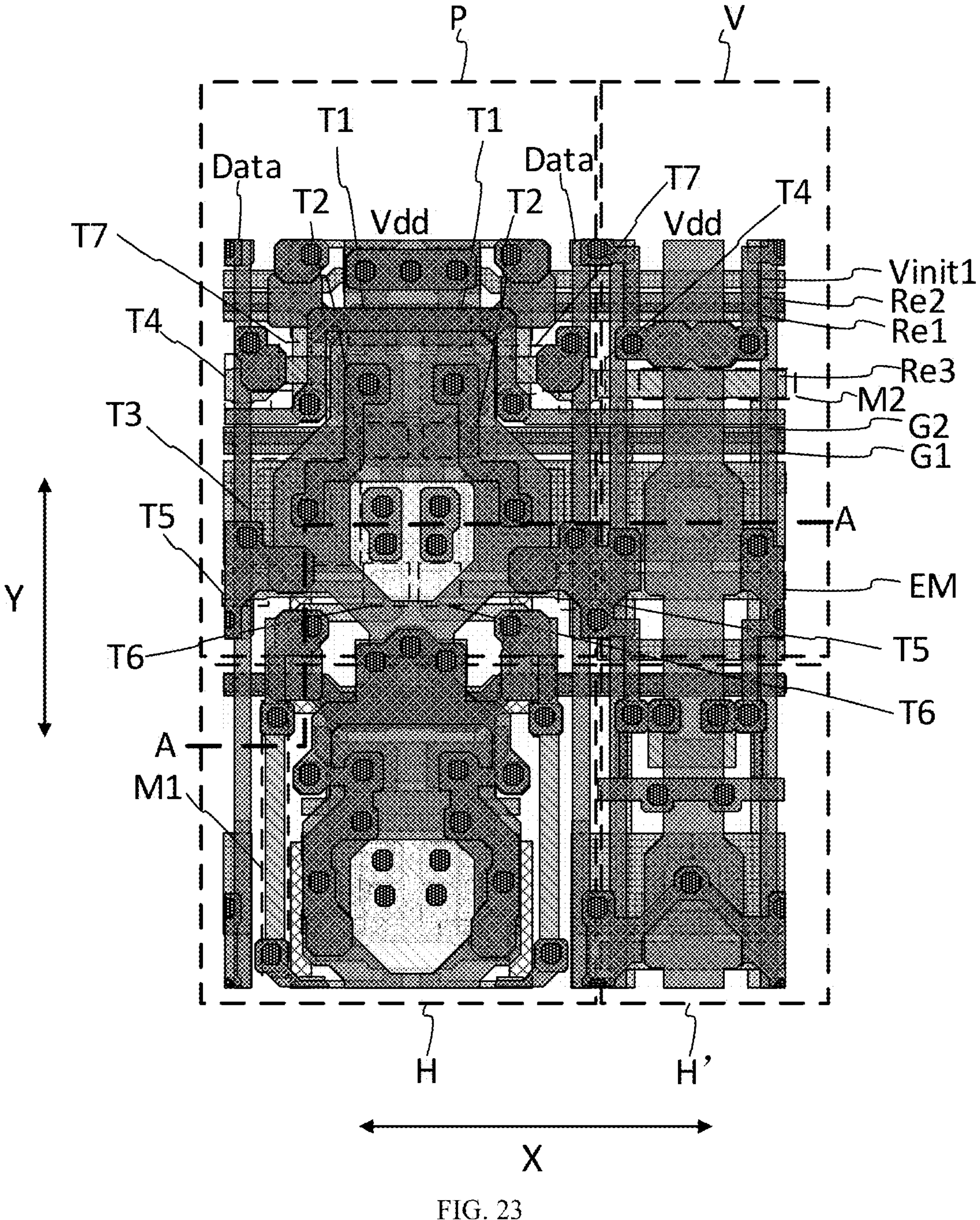
FIG. 23 is a structural layout of the display panel in a dashed box region in FIG. 20.
Figure 24:
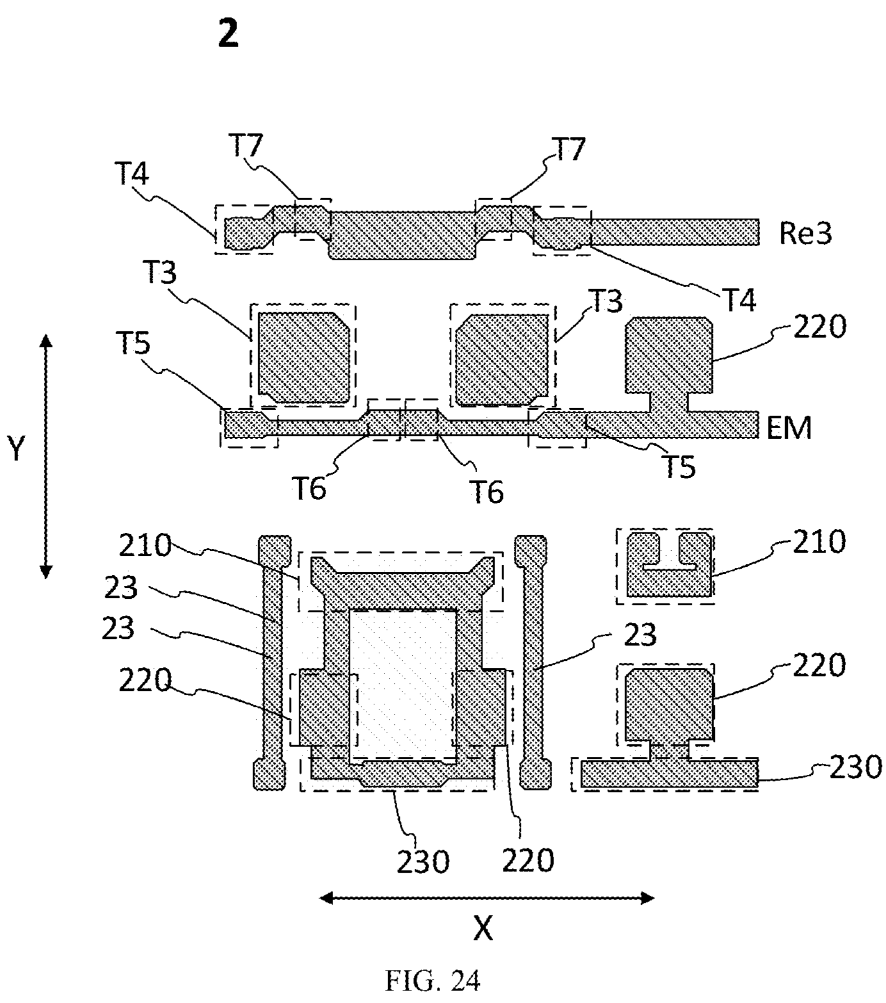
FIG. 24 is a structural layout of a first conductive layer in FIG. 23.
Figure 25:
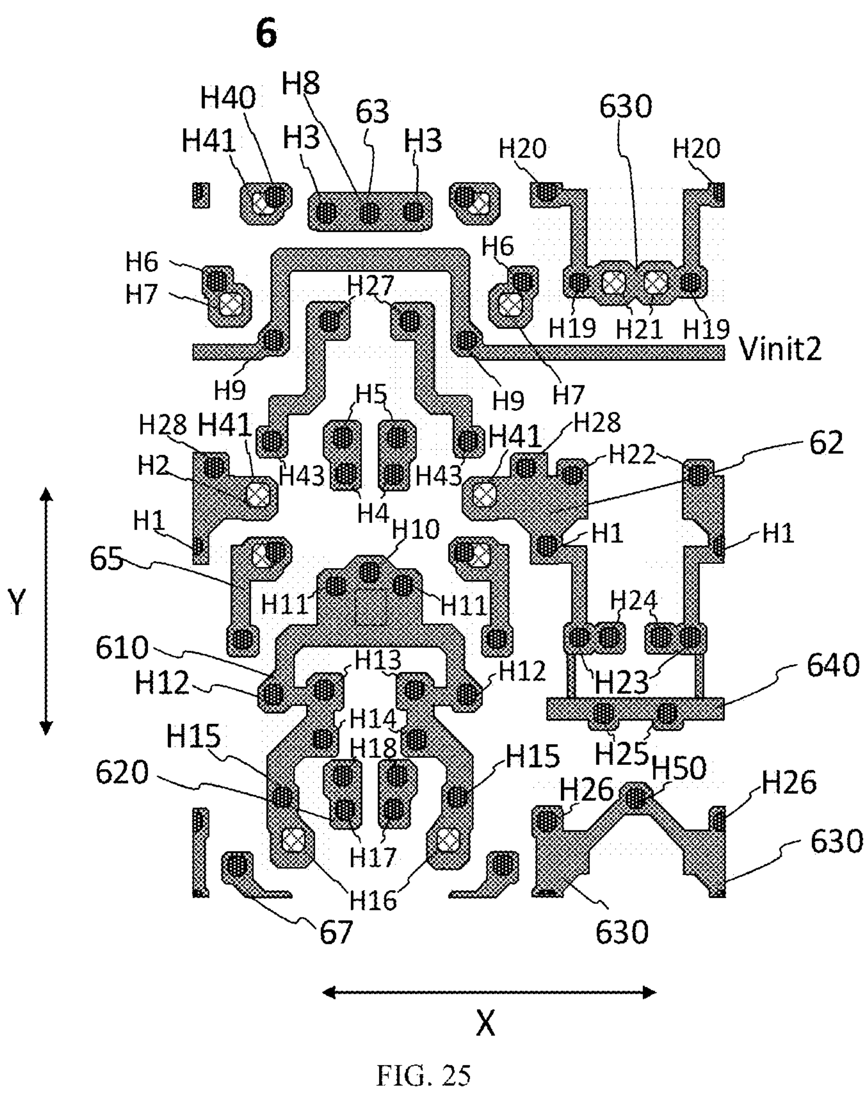
FIG. 25 is a structural layout of a fourth conductive layer in FIG. 23.
Figure 26:
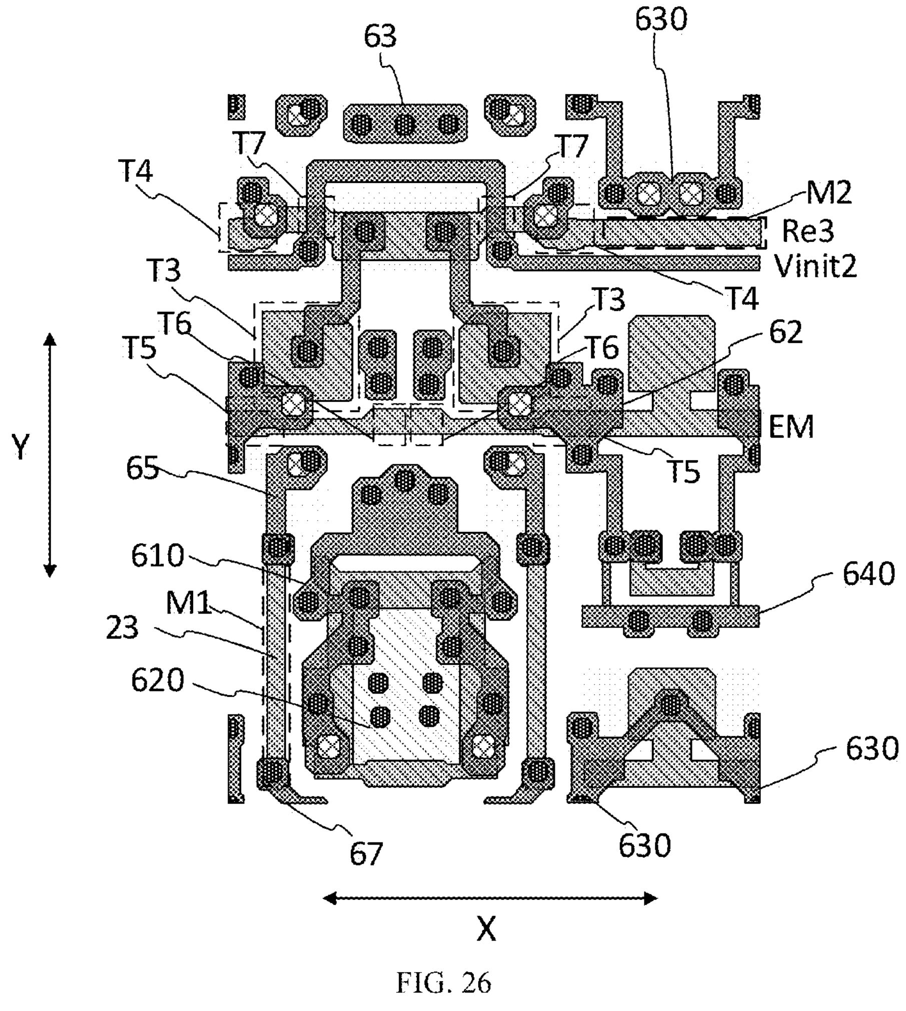
FIG. 26 is a stacked structural layout of the first conductive layer and the fourth conductive layer in FIG. 23.
Figure 27:
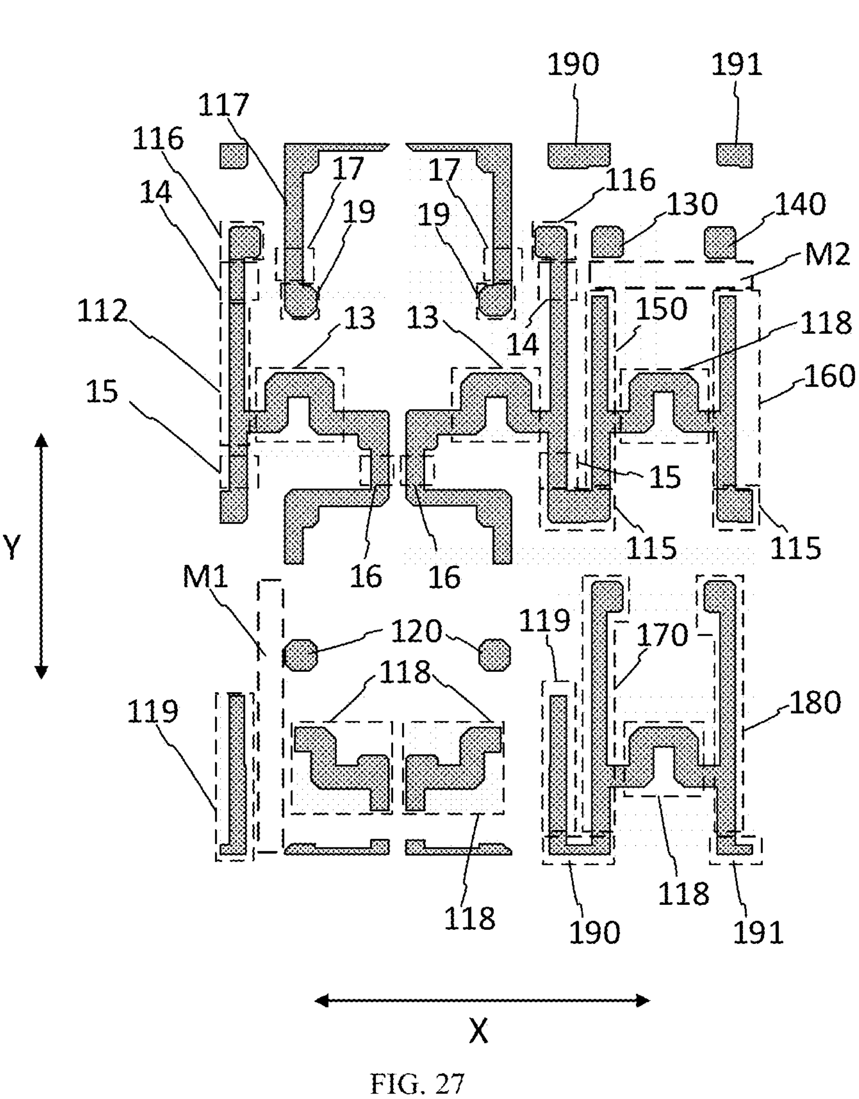
FIG. 27 is a structural layout of a first active layer in FIG. 23.
Figure 28:
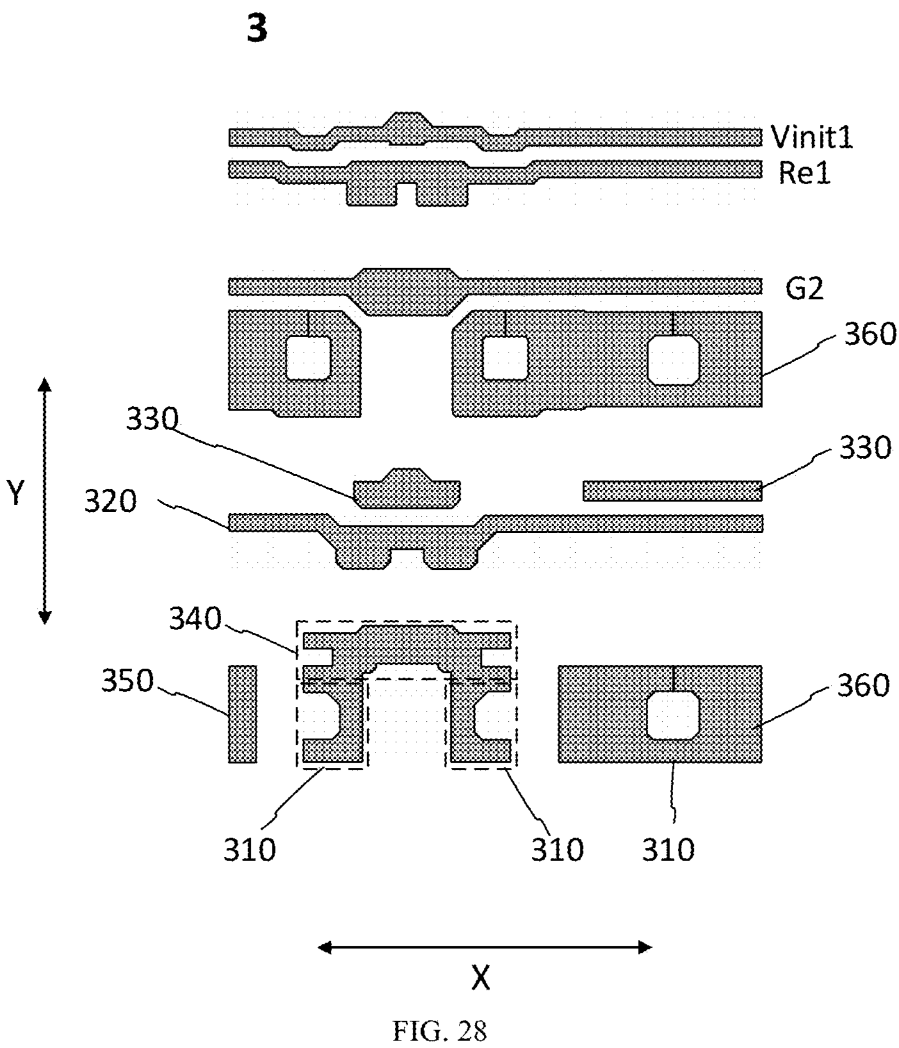
FIG. 28 is a structural layout of a second conductive layer in FIG. 23.
Figure 29:
FIG. 29 is a structural layout of a second active layer in FIG. 23.
Figure 29:
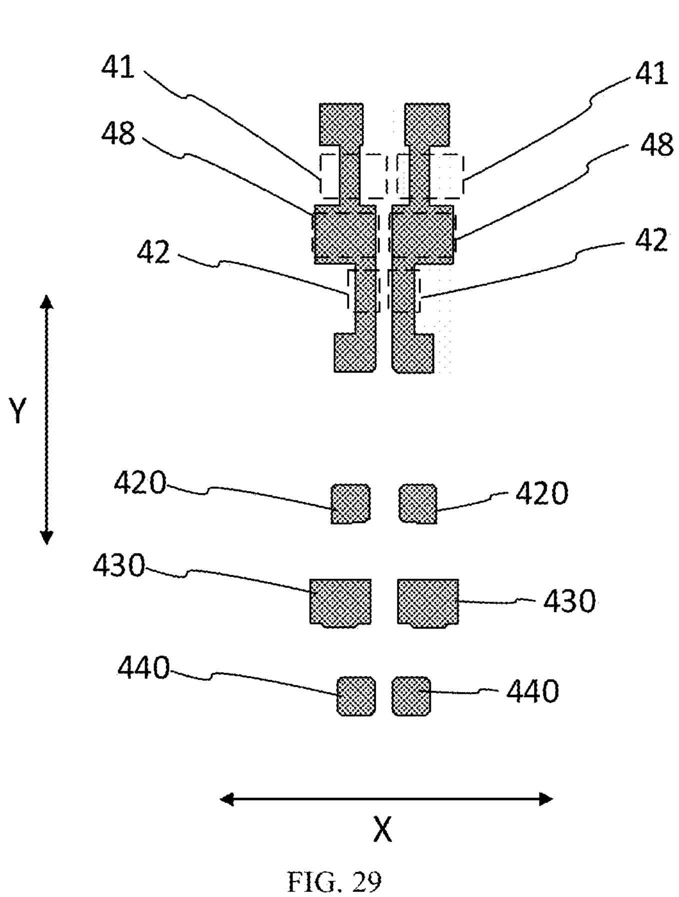

The display panel provided by the present disclosure may also solve the above problems by improving the layout structure. FIG. 23 is a structural layout of the display panel in a dashed box region in FIG. 20, FIG. 24 is a structural layout of the first conductive layer in FIG. 23, FIG. 25 is a structural layout of the fourth conductive layer in FIG. 23, FIG. 26 is a stacked structural layout of the first conductive layer and the fourth conductive layer in FIG. 23, FIG. 27 is a structural layout of the first active layer in FIG. 23, FIG. 28 is a structural layout of the second conductive layer in FIG. 23, and FIG. 29 is a structural layout of the second active layer in FIG. 23. The display panel may include all the structures of the display panel shown in FIG. 3.

Figure 22:
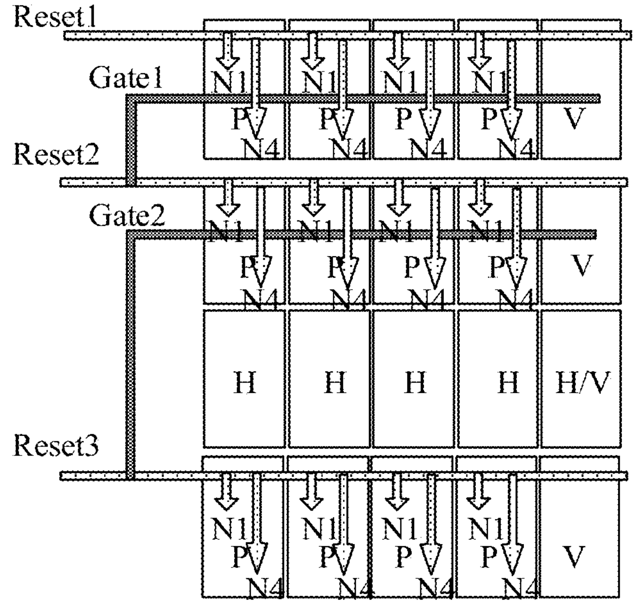
FIG. 22 is a schematic diagram of a GOA load of a display region according to an embodiment of the present disclosure.

As shown in FIGS. 23 and 24, in the present exemplary embodiment, the display panel may further include a plurality of virtual pixel rows. The virtual pixel row may be located between two adjacent rows of sub-pixels. An orthographic projection of the seventh transistor in the pixel driving circuit of the previous row of the virtual pixel row on the base substrate is located in a region where an orthographic projection of the pixel driving circuit of the next row of the virtual pixel driving circuit on the base substrate is located. The virtual pixel row may include a plurality of virtual pixel driving circuits, and the virtual pixel driving circuit may include a virtual transistor and a virtual signal line. The virtual transistor and the virtual signal line are connected to each other as an integral structure, and the integral structure is connected to a first power supply line. Further, the virtual pixel row may include a third conductive portion 23. An orthographic projection of the third conductive portion 23 on the base substrate may extend along the second direction Y and is at least partially located in the region where the virtual pixel row is located. The third conductive portion 23 may be configured to be connected to the second electrode of the sixth transistor T6 in the pixel driving circuit in the previous row of the virtual pixel row and the first electrode of the seventh transistor T7 in the pixel driving circuit in the next row of the virtual pixel row. For example, the third conductive portion 23 may be located on the first conductive layer 2. One end of the third conductive portion 23 may be connected to the seventh bridge portion 67 located on the fourth conductive layer 6 through a via hole. The seventh bridge portion 67 is connected to the fourth node N4 in the pixel driving circuit of the next row, such that the third conductive portion 23 is connected to the fourth node of the pixel driving circuit of the next row through the seventh bridge portion 67. The other end of the third conductive portion 23 is connected to the fourth node N4 in the pixel driving circuit of the previous row, such that the first electrode of the seventh transistor T7 in the next row of the virtual pixel row is connected to the second electrode of the sixth transistor T6 in the previous row of the virtual pixel row through the third conductive portion 23. The GOA load in this case may be shown in FIG. 22. It may be seen that, in two rows of pixel driving circuits inserted into the virtual pixel row, the fourth node N4 connected to OLED of normal pixels of the previous row of the virtual pixel row is still initialized by the seventh transistor T7 of normal pixels of the next row of the virtual pixel row, such that the P-Gate GOA of each row drives a row of Gate signals. A design across the virtual pixel row region and the normal region is highly consistent, thus avoiding the problem of doubling the P-Gate GOA loading across the virtual pixel row under the condition that the fourth transistor T4 and the seventh transistor T7 share one row of Gate signals, thus solving the problem of abnormal display.

In the present exemplary embodiment, the region where the virtual pixel row is located may be understood as a region jointly covered by an orthographic projection of the virtual transistor in the virtual pixel row on the base substrate, an orthographic projection of the virtual signal line on the base substrate, and an orthographic projection of a conductive structure connected to the virtual transistor and the virtual signal line on the base substrate. As shown in FIGS. 23, 24 and 25, in the present exemplary embodiment, the third conductive portion 23 may be located on the first conductive layer 2, that is, the third conductive portion 23 is close to a bottom metal layer of the base substrate, such that a parasitic capacitance between the metal line and the metal of anode may be reduced or weakened. On this basis, as shown in FIG. 26, the display panel may also include a fifth bridge portion 65 located on the fourth conductive layer 6, which is located in the virtual pixel row. The fifth bridge portion 65 may be connected to the fourth node N4 in the pixel driving circuit on the previous row of the virtual pixel row through a via hole H40, and connected to the third conductive portion 23 through a via hole H, such that the fourth node of the next row of the virtual pixel row may be connected to the fourth node of the previous row of the virtual pixel row through the cooperation of the third conductive portion 23, the fifth bridge portion 65 and a seventh bridge portion 67. Of course, in other exemplary embodiments, the third conductive layer 5 may also be located on the second conductive layer 3, the third conductive layer 5, the fourth conductive layer 6, or the fifth conductive layer 7. In addition, in the present exemplary embodiment, in the virtual pixel row, the orthographic projection of the virtual signal line on the base substrate extends along the first direction X, and does not overlap with an orthographic projection of the third conductive portion 23 on the base substrate, thus preventing the signal line from generating a parasitic capacitance with the third conductive portion 23, and contributing to providing a stable reset signal to the fourth node through the third conductive portion 23.

As shown in FIG. 27, in the present exemplary embodiment, in the virtual pixel row, the first active layer 1 may include a row virtual third active portion 118, a row virtual seventh active portion 119, and a row virtual eighth active portion 120. An orthographic projection of the row virtual seventh active portion 119 on the base substrate may extend along the column direction, and the row virtual seventh active portion 119 may be configured to form the row virtual fifth transistor. In the present exemplary embodiment, a first notch region M1 is arranged between an orthographic projection of the row virtual seventh active portion 119 on the base substrate and an orthographic projection of the row virtual third active portion 118 in the current virtual pixel driving circuit on the base substrate.

As shown in FIG. 24, in the present exemplary embodiment, in the virtual pixel row, the first conductive layer 2 may include a row virtual third reset signal line 210, a row virtual first conductive portion 220, and a row virtual enable signal line 230. The row virtual first conductive portion 210 is connected to the row virtual enable signal line 230. An orthographic projection of the row virtual first conductive portion 220 on the base substrate covers an orthographic projection of the row virtual third active portion 118 on the base substrate.

As shown in FIG. 28, in the present exemplary embodiment, in the virtual pixel row, the second conductive layer 3 may include a row virtual second conductive portion 310, a row virtual first reset signal line 320, a row virtual first initial signal line 330, a row virtual second gate line 340, and a row virtual second connecting portion 350. An orthographic projection of the row virtual second conductive portion 310 on the base substrate partially overlaps with an orthographic projection of the row virtual first conductive portion 210 on the base substrate. The row virtual second conductive portion 310 may be configured to form a gate of the row virtual driving transistor a second electrode of the row virtual storage capacitor. The row virtual second conductive portions 310 in two adjacent repeating units in the row direction are not connected to each other. An orthographic projection of the row virtual first reset signal lines 320 on the base substrate may extend along the first direction X, and the row virtual first reset signal lines 320 may be connected to each other in each virtual pixel driving circuit in the same row. An orthographic projection of the row virtual first initial signal line 330 on the base substrate partially overlaps with an orthographic projection of the row virtual first active portion 420 on the base substrate. The row virtual second gate line 340 is connected to the row virtual second conductive portion 310. An orthographic projection of the row virtual second connecting portion 350 on the base substrate may extend in the column direction and partially overlap with an orthographic projection of the row virtual seventh active portion on the base substrate.

As shown in FIG. 29, in the present exemplary embodiment, in the virtual pixel row, the second active layer 4 may include a row virtual first active portion 420, a row virtual second active portion 430, and a row virtual ninth active portion 440. An orthographic projection of the row virtual first active portion 420 on the base substrate partially overlaps with the orthographic projection of the row virtual first initial signal line 330 on the base substrate.

Figure 30:
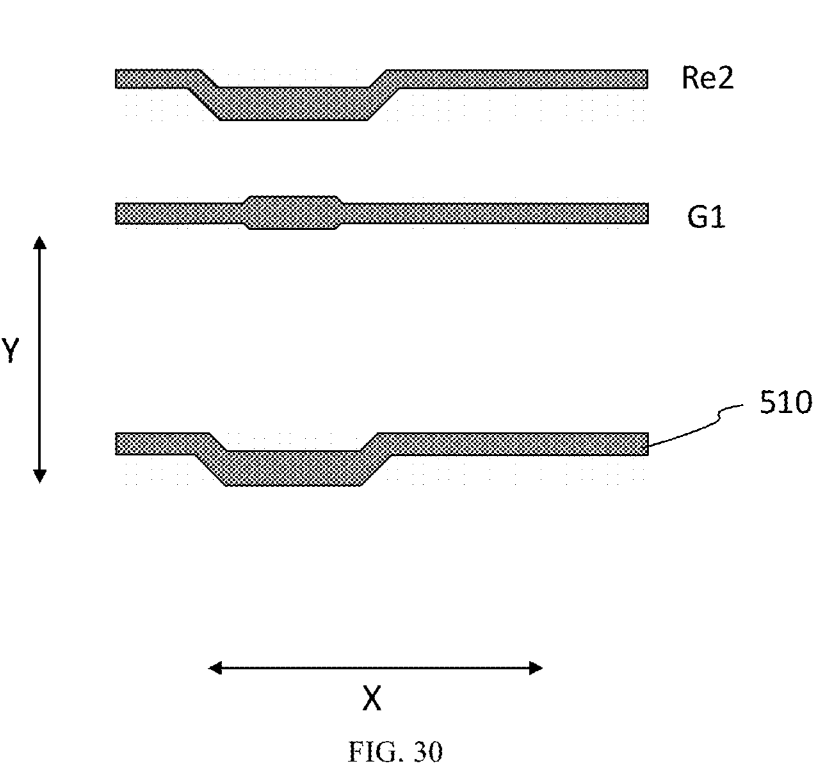
FIG. 30 is a structural layout of a third conductive layer in FIG. 23.

As shown in FIG. 30, in the present exemplary embodiment, in the row virtual pixel, the third conductive layer 5 may include a row virtual second reset signal lines 510. An orthographic projection of the row virtual second reset signal lines 510 on the base substrate may extend in the first direction X and overlap with the orthographic projection of the virtual first reset signal line on the base substrate. Row virtual second reset signal lines 510 in each virtual pixel driving circuit in the same row may be connected to each other. In the present exemplary embodiment, the third conductive portion 23 may be connected to the fourth node N4 in the pixel driving circuit of the previous row by providing the fifth bridge portion 65 in the virtual pixel row.

As shown in FIG. 25, in the present exemplary embodiment, in the virtual pixel row, the fourth conductive layer 6 may include a row virtual third connecting portion 610 and a row virtual fourth connecting portion 620. The row virtual third connecting portion 610 may be connected to the row virtual first initial signal line 330 through a via hole H10 and connected to the row virtual first reset signal line 320 through a via hole H11. The row virtual third connecting portion 610 may further be connected to the row virtual eighth active portion 120 through a via hole H12, connected to the row virtual second active portion 430 through a via hole H13, connected to the row virtual second gate line 340 through a via hole H14, and connected to the row virtual first conductive portion 220 and the row virtual third active portion 118 through a via hole H15. In addition, the row virtual third connecting portion 610 may further be connected to the first power supply line Vdd through a via hole H16. Thereby the row virtual first initial signal line 330, the row virtual first reset signal line 320, the row virtual eighth active portion 120, the row virtual second active portion 430, the row virtual second gate line 340, the row virtual first conductive portion 220, and the row virtual third active portion 118 are connected to the first power supply line Vdd. The row virtual fourth connecting portion 620 may be connected to the row virtual third active portion 118 through a via hole H17, connected to the row virtual ninth active portion 440 through a via hole H18, and further connected to the first power supply line Vdd through the row virtual third connecting portion 610.

As shown in FIG. 23, in the present exemplary embodiment, as described above, the orthographic projection of the row virtual second conductive portion 310 on the base substrate, the orthographic projection of the row virtual third reset signal line 210 on the base substrate, the orthographic projection of the row virtual second gate line 340 on the base substrate, and the orthographic projection of the row virtual enable signal line 230 on the base substrate in the current virtual pixel driving circuit are all disconnected at the first notch region M1. The orthographic projection of the third conductive portion 23 on the base substrate is located in the first notch region M1, such that parasitic capacitance between the third conductive portion 23 and other conductive structures may be avoided, and a stable reset signal may be provided to the fourth node.

As shown in FIG. 23, in the present exemplary embodiment, the display panel may further include a plurality of virtual pixel columns. The virtual pixel column is located between two adjacent columns of sub-pixels, the virtual pixel column includes a plurality of column virtual sub-pixels. The column virtual pixel driving circuit includes a column virtual transistor. An orthographic projection of a channel region of the column virtual reset transistor on the base substrate has a second notch region M2. That is, the channel region of the column virtual reset transistor in the column virtual transistor is a spacing structure, and an orthographic projection of the third reset signal line Re3 of the normal sub-pixel on the base substrate extends along the first direction and passes through the second notch region, such that the third reset signal line Re3 will not form the parasitic capacitance with other conductive structures, and the signal interference to the third reset signal line Re3 may be avoided or reduced.

As shown in FIG. 27, in the present exemplary embodiment, in the virtual pixel column, the first active layer 1 may include a column virtual fourth active portion 130, a column virtual seventh active portion 140, a column virtual third active portion 118, a column virtual fifth connecting portion 150, a column virtual sixth connecting portion 160, a column virtual seventh connecting portion 170, a column virtual eighth connecting portion 180, a column virtual ninth connecting portion 190, and a column virtual tenth connecting portion 191. An orthographic projection of the column virtual fifth connecting portion 150 on the base substrate and an orthographic projection of the column virtual sixth connecting portion 160 on the base substrate may both extend in the column direction. The column virtual fifth connecting portion 150 and the column virtual sixth connecting portion 160 are oppositely arranged on both sides of the column virtual third active portion 118 and are both connected to the column virtual third active portion 118. The column virtual fifth connecting portion 150 may be connected to the fifteenth active portion 115 in pixel driving circuits adjacent in the row direction, such that the column virtual fifth connecting portion 150 is connected to the first power supply line Vdd through the fifteenth active portion 115. Similarly, the column virtual sixth connecting portion 160 may be connected to the fifteenth active portion 115 in pixel driving circuits adjacent in the row direction, such that the column virtual sixth connecting portion 160 is connected to the first power supply line Vdd through the fifteenth active portion 115 in the pixel driving circuits adjacent in the row direction.

In the present exemplary embodiment, the structure of the virtual pixel driving circuit in a virtual pixel where a virtual pixel column and a virtual pixel row intersect may be different from the structure of the virtual pixel driving circuit in the virtual pixel column and the structure of the virtual pixel driving circuit in the virtual pixel row. For example, the virtual seventh connecting portion 170 and the virtual eighth connecting portion 180 are located in the virtual pixel where the virtual pixel column and the virtual pixel row intersect. An orthographic projection of the virtual seventh connecting portion 170 and an virtual eighth connecting portion 180 on the base substrate may both extend in the column direction, and the virtual seventh connecting portion 170 and the virtual eighth connecting portion 180 are oppositely arranged on both sides of the virtual third active portion 118 in the virtual pixel and connected to the virtual third active portion 118 in the virtual pixel. A partial structure of the virtual ninth connecting portion 190 and a partial structure of the virtual tenth connecting portion 191 are located in the virtual pixel where the virtual pixel column and the virtual pixel row intersect, and the virtual ninth connecting portion 190 in the virtual pixel is connected to the virtual seventh connecting portion 170 in the virtual pixel and the virtual seventh active portion 119 in the adjacent row virtual pixel driving circuit, respectively. The virtual tenth connecting portion 191 in the virtual pixel is connected to the virtual eighth connecting portion 180 in the virtual pixel and the virtual seventh active portion 119 in the adjacent row virtual pixel driving circuit.

As shown in FIG. 24, in the present exemplary embodiment, in the virtual pixel column, the first conductive layer 2 may include a column virtual first conductive portion 220. An orthographic projection of the column virtual first conductive portion 220 on the base substrate may cover the column virtual third active portion 118 at a corresponding position, and the column virtual first conductive portion 220 is connected to the enable signal line EM in the pixel driving circuit adjacent in the row direction, so as to provide a stable electric signal for the virtual first conductive portion 220 through the enable signal line, to avoid the virtual first conductive portion 220 from floating and being susceptible to static electricity or other signal interference. In addition, in a virtual pixel where the virtual pixel column and the virtual pixel row intersect, the virtual first conductive portion 220 is connected to the virtual enable signal line 230, and further connected to the first power supply line Vdd.

As shown in FIG. 28, in the present exemplary embodiment, in the virtual pixel column, the second conductive layer 3 may include a column virtual third conductive portion 360. An orthographic projection of the column virtual third conductive portion 360 on the base substrate may partially overlap with the orthographic projection of the column virtual first conductive portion 220 on the base substrate. The column virtual third conductive portion 360 may be used to be connected to the second conductive portions 32 in the adjacent pixel driving circuit. Specifically, as described in the above embodiment, the display panel may include repeating units arranged in the row direction and the column direction, and one repeating unit includes a first pixel driving circuit and a second pixel driving circuit arranged in mirror symmetry. The first pixel driving circuit is arranged adjacent to the second pixel driving circuit in another repeating unit adjacent in the row direction. In two repeating units adjacent in the row direction, the second conductive portion 32 in the first pixel driving circuit is connected to the second conductive portion 32 in the second pixel driving circuit in the other repeating unit. When the virtual pixel column is inserted in the two repeating units adjacent in the row direction, the second conductive portion 32 of the first pixel driving circuit in one repeating unit may be connected to the second conductive portion 32 of the second pixel driving circuit in another repeating unit through the virtual third conductive portion 360 in the virtual pixel column, such that the second conductive portions 32 in the two repeating units adjacent in the row direction are connected to each other. In addition, in the virtual pixel where the virtual pixel column and the virtual pixel row intersect, the virtual third conductive portion 360 may have the same structure as the virtual third conductive portion 360 in the virtual pixel column.

As shown in FIG. 25, in the present exemplary embodiment, in the virtual pixel column, the fourth conductive layer 6 may include a column virtual fourth conductive portion 630. The column virtual fourth conductive portion 630 may be connected to the column virtual fourth active portion 130 and the column virtual seventh active portion 140 through a via hole H19, connected to the column virtual ninth connecting portion 190 and the column virtual tenth connecting portion 191 through a via hole H20, and connected to the first power supply line Vdd through a via hole H21. Therefore, the column virtual fourth active portion 130, the column virtual seventh active portion 140, the column virtual ninth connecting portion 190 and the column virtual tenth connecting portion 191 are connected to the first power supply line Vdd through the column virtual fourth conductive portion 630, so as to provide stable voltage signals. In addition, a partial structure of the second bridge portion 62 in the adjacent pixel driving circuits may be located in the virtual pixel column, and the the partial structure of the second bridge portion 62 located in the virtual pixel column may be connected to the column virtual fifth connecting portion 150 in the virtual pixel column through a via hole H22, such that the column virtual fifth connecting portion 150 is connected to the first power supply line Vdd and a stable voltage signal is provided for the column virtual fifth connecting portion 150. Similarly, the partial structure of the second bridge portion 62 in the pixel driving circuit adjacent to the column virtual sixth connecting portion 160 in the virtual pixel column may be connected to the column virtual sixth connecting portion 160 through a via hole H22 at the position, thereby the column virtual sixth connecting portion 160 is connected to the first power supply line Vdd, and a stable voltage signal is provided for the column virtual sixth connecting portion 160. Further, the partial structure of the second bridge portion 62 may also be located in the virtual pixel where the virtual pixel column and the virtual pixel row intersect, and this the partial structure may be connected to the virtual seventh connecting portion 170 at the corresponding position through a via hole H23 and connected to the virtual third reset signal line 210 at the corresponding position through a via hole H24, such that the virtual seventh connecting portion 170 and the virtual third reset signal line 210 are connected to the first power supply line Vdd, so as to provide stable voltage signals. Similarly, the second bridge portion 62 in the pixel driving circuit adjacent in the row direction to the virtual eighth connecting portion 180 may be connected to the virtual eighth connecting portion 180 in the corresponding position through the via hole H23 in the corresponding position and connected to the virtual third reset signal line 210 in the corresponding position through the via hole H24, such that the virtual eighth connecting portion 180 is connected to the first power supply line Vdd. In addition, the fourth conductive layer 6 may further include a virtual fifth conductive portion 640. The virtual fifth conductive portion 640 may be located in the virtual pixel where the virtual pixel row and the virtual pixel column intersect, and the virtual fifth conductive portion 640 may be connected to the first power supply line through a via hole H25. An orthographic projection of the virtual fifth conductive portion 640 on the base substrate may extend in the row direction and be located between the orthographic projection of the virtual third reset signal line 210 on the base substrate and the orthographic projection of the virtual third conductive portion 360 on the base substrate. In addition, a partial structure of the virtual fourth conductive portion 630 may be located in the virtual pixel where the virtual pixel row and the virtual pixel column intersect, and the virtual fourth conductive portion 630 located in this virtual pixel is connected to the virtual third conductive portion 360 through a via hole H26 and connected to the virtual first conductive portion 220 through a via hole H50, such that the virtual third conductive portion 360 and the virtual first conductive portion 220 are connected to the first power supply line.

Figure 31:
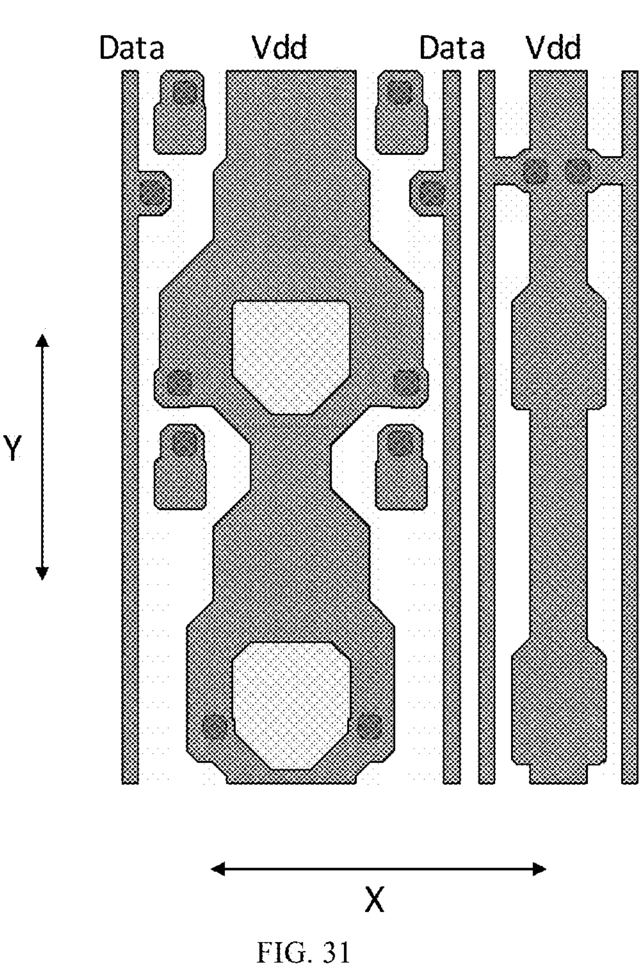
FIG. 31 is a structural layout of a fifth conductive layer in FIG. 23.

As shown in FIG. 31, in the present exemplary embodiment, in the virtual pixel column, the fifth conductive layer 7 may include the first power supply line Vdd, which is used to provide a stable voltage signal for a floating conductive structure in the virtual pixel column, so as to prevent the floating conductive structure from being affected by static electricity.

Figure 32:
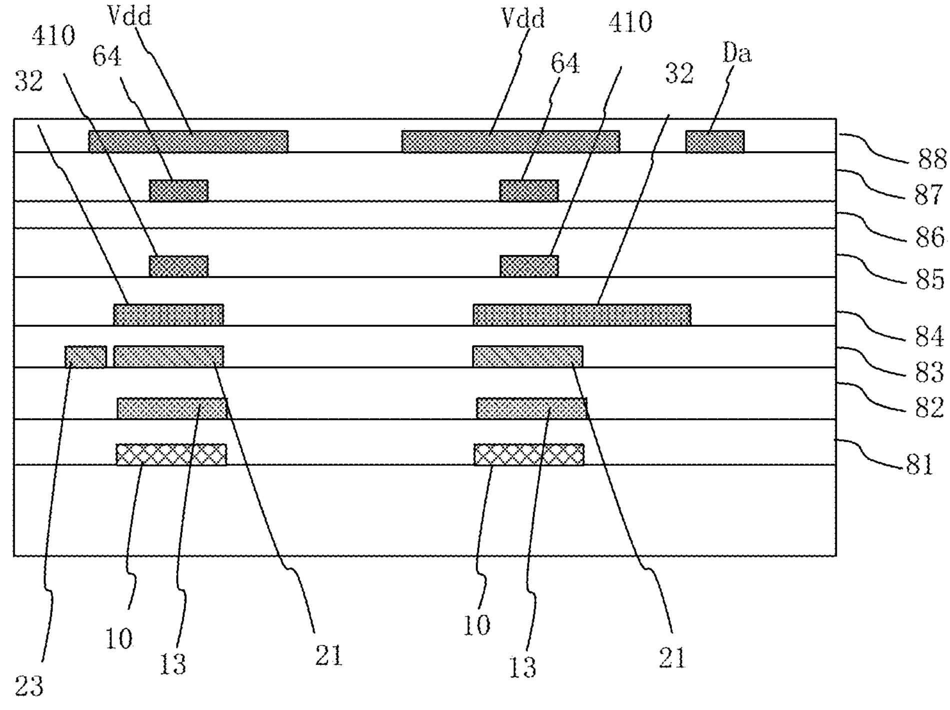
FIG. 32 is a sectional view taken along an AA direction in FIG. 23.

FIG. 32 is a partial sectional view along a dotted line AA in FIG. 23. The display panel may include a first insulating layer 81, a second insulating layer 82, a third insulating layer 83, a fourth insulating layer 84, a fifth insulating layer 85, a first dielectric layer 86, and a first flat layer 87. The base substrate 80, the light shield layer, the first insulating layer 81, the first active layer 1, the second insulating layer 82, the first conductive layer 2, the third insulating layer 83, and the second conductive layer 3, the fourth insulating layer 84, the second active layer 4, the fifth insulating layer 85, the third conductive layer 5, the first dielectric layer 86, the fourth conductive layer 6, the first flat layer 87, the fifth conductive layer 7, the second flat layer 88 are sequentially stacked. The first insulating layer 81 and the second insulating layer 82 may be a silicon oxide layer, and the first dielectric layer 86 may be a silicon nitride layer. The base substrate may include a glass substrate, a barrier layer and a polyimide layer which are sequentially stacked, and the barrier layer may be an inorganic material. The materials of the first conductive layer 2 and the second conductive layer 3 may be one or an alloy of molybdenum, aluminum, copper, titanium and niobium, or molybdenum/titanium alloy or a stack thereof, etc. The materials of the third conductive layer 5 and the fourth conductive layer 6 may include metal materials, such as one or an alloy of molybdenum, aluminum, copper, titanium and niobium, molybdenum/titanium alloys or stacks, etc., or titanium/aluminum/titanium stacks.

The present disclosure also provides a display apparatus, which includes the display panel of any of the above-mentioned embodiments.

After considering the specification and practicing the disclosure disclosed herein, it will be easy for those skilled in the art to think of the other implementations of the present disclosure. The present application intends to cover any variants, usage, or changes of adaptation of the present disclosure. These variants, usage or changes of adaptation follow the general principles of the present disclosure, and include common sense or common technical means in the technical field not disclosed by the present disclosure. The specification and embodiments are only exemplary, and the scope and spirit of the present disclosure are defined by the appended claims.

What is claimed is:

1. A display panel, wherein the display panel comprises a pixel driving circuit comprising a driving transistor and a second transistor, wherein a first electrode of the second transistor is connected to a gate of the driving transistor, and a second electrode of the second transistor is connected to a first electrode of the driving transistor, wherein the display panel further comprises:

a base substrate;

a first conductive layer, located on a side of the base substrate, wherein the first conductive layer comprises:

a first conductive portion, configured to form the gate of the driving transistor;

a second active layer, located on a side of the first conductive layer away from the base substrate, wherein the second active layer comprises:

a second active portion, configured to form a channel region of the second transistor; and an eighth active portion, connected to a side of the second active portion;

a third conductive layer, located on a side of the second active layer away from the base substrate, wherein the third conductive layer comprises:

a first gate line, wherein an orthographic projection of the first gate line on the base substrate extends in a first direction and covers the second active portion, a partial structure of the first gate line is configured to form a top gate of the second transistor, and an orthographic projection of the eighth active portion on the base substrate and an orthographic projection of the first conductive portion on the base substrate are located on both sides of the orthographic projection of the first gate line on the base substrate, respectively;

a dielectric layer, located on a side of the third conductive layer away from the base substrate; and a fourth conductive layer, located on a side of the dielectric layer away from the base substrate, wherein the fourth conductive layer comprises:

a first bridge portion, connected to the eighth active portion and the first conductive portion through a via hole, respectively;

wherein the first gate line comprises a sixth side edge and a seventh side edge that are arranged opposite to each other and extend in an extension direction of the first gate line, wherein an orthographic projection of at least a partial structure of the sixth side edge on the base substrate is perpendicular to an orthographic projection of the first bridge portion on the base substrate, and an orthographic projection of at least a partial structure of the seventh side edge on the base substrate is perpendicular to the orthographic projection of the first bridge portion on the base substrate.

2. The display panel according to claim 1, wherein the sixth side edge comprises a first segment, and the seventh side edge comprises a second segment, wherein an orthographic projection of the first segment on the base substrate is perpendicular to the orthographic projection of the first bridge portion on the base substrate, and an orthographic projection of the second segment on the base substrate is perpendicular to the orthographic projection of the first bridge portion on the base substrate; and the orthographic projection of the first segment on the base substrate is parallel to the orthographic projection of the second segment on the base substrate, or a straight line where the orthographic projection of the first segment on the base substrate is located intersects with a straight line where the orthographic projection of the second segment on the base substrate is located.

3. The display panel according to claim 2, wherein a length of a portion where an orthographic projection of the sixth side edge on the base substrate intersects with the orthographic projection of the first bridge portion on the base substrate is S1, a length of the orthographic projection of the first segment on the base substrate is S2, and a ratio S2/S1 is greater than or equal to 0.7 and less than or equal to 1; and a length of a portion where an orthographic projection of the seventh side edge on the base substrate intersects with the orthographic projection of the first bridge on the base substrate with a length S3, and a length of the orthographic projection of the second segment on the base substrate is S4, wherein a ratio S4/S3 is greater than or equal to 0.7 and less than or equal to 1.

4. The display panel according to claim 1, further comprising:

a second conductive layer, located between the first conductive layer and the second active layer, wherein the second conductive layer comprises:

a second gate line, wherein an orthographic projection of the second gate line on the base substrate extends in the first direction and covers an orthographic projection of the second active portion on the base substrate, and a partial structure of the second gate line is configured to form a bottom gate of the second transistor;

wherein the second gate line comprises a third side edge and a fourth side edge arranged opposite to each other and extending in an extension direction of the second gate line, and the orthographic projection of the first bridge portion on the base substrate perpendicularly intersects with at least part of an orthographic projection of the third side edge on the base substrate and at least part of an orthographic projection of the fourth side edge on the base substrate.

5. The display panel according to claim 4, wherein the first gate line comprises a first extension portion, wherein an orthographic projection of the first extension portion on the base substrate is located on the orthographic projection of the first bridge portion on the base substrate, and the first extension portion comprises a first side edge and a second side edge that are arranged opposite to each other and extend in an extension direction of the first extension portion;

the second gate line comprises a second extension portion, wherein an orthographic projection of the second extension portion on the base substrate is located on the orthographic projection of the first bridge portion on the base substrate and overlaps with the orthographic projection of the first extension portion on the base substrate, and the second extension portion comprises the third side edge and the fourth side edge that are arranged opposite to each other and extend in an extension direction of the second extension portion;

the orthographic projection of the third side edge on the base substrate is located on a side of the orthographic projection of the fourth side edge on the base substrate away from the orthographic projection of the first conductive portion on the base substrate;

an orthographic projection of the first side edge on the base substrate is located on a side of an orthographic projection of the second side edge on the base substrate away from the orthographic projection of the first conductive portion on the base substrate;

a distance between an orthographic projection of any first node of the third side edge on the base substrate and the orthographic projection of the first side edge on the base substrate in a second direction is L1, and a distance between the orthographic projection of the first node on the base substrate and the orthographic projection of the fourth side edge on the base substrate in the second direction is L2, wherein the second direction intersects with the first direction, and a ratio L1/L2 is greater than or equal to 0.25 and less than or equal to 0.8; and a distance between an orthographic projection of any second node of the fourth side edge on the base substrate and the orthographic projection of the second side edge on the base substrate in the second direction is L3, and a distance between the orthographic projection of the second node on the base substrate and the orthographic projection of the third side edge on the base substrate in the second direction is L4, wherein a ratio L3/L4 is greater than or equal to 0.25 and less than or equal to 0.8.

6. The display panel according to claim 5, wherein the orthographic projection of the first extension portion on the base substrate covers the orthographic projection of the third side edge on the base substrate, and the orthographic projection of the second extension portion on the base substrate covers the orthographic projection of the second side edge on the base substrate; or the orthographic projection of the first extension portion on the base substrate covers the orthographic projection of the third side edge on the base substrate and the orthographic projection of the fourth side edge on the base substrate; or the orthographic projection of the second extension portion on the base substrate covers the orthographic projection of the first side edge on the base substrate and the orthographic projection of the second side edge on the base substrate; or the orthographic projection of the first extension portion on the base substrate covers the orthographic projection of the fourth side edge on the base substrate, and the orthographic projection of the second extension portion on the base substrate covers the orthographic projection of the first side edge on the base substrate.

7. The display panel according to claim 5, wherein a width of an overlapping region of the orthographic projection of the first extension portion on the base substrate and the orthographic projection of the second extension portion on the base substrate in the second direction is L5, wherein a ratio L1/L5 is greater than or equal to 0.6 and less than or equal to 1, and a ratio L3/L5 is greater than or equal to 0.6 and less than or equal to 1;

wherein L1 is greater than or equal to 1.3 μm, and L2 is greater than or equal to 1.3 μm.

8. The display panel according to claim 5, wherein the pixel driving circuit comprises a fifth transistor and a sixth transistor, a first electrode of the fifth transistor is connected to a second electrode of the driving transistor, and a first electrode of the sixth transistor is connected to the first electrode of the driving transistor;

wherein the display panel further comprises:

a first active layer, located between the base substrate and the first conductive layer, wherein the first active layer comprises:

a fifth active portion, configured to form a channel region of the fifth transistor; and a sixth active portion, configured to form a channel region of the sixth transistor;

wherein a distance between the fifth active portion and the sixth active portion in the first direction is L6, a ratio L1/L6 is greater than or equal to 5%, and a ratio L2/L6 is greater than or equal to 5%.

9. The display panel according to claim 6, wherein the second gate line comprises the second extension portion, and the orthographic projection of the second extension portion on the base substrate is located on the orthographic projection of the first bridge portion on the base substrate and overlaps with the orthographic projection of the first extension portion on the base substrate;

the orthographic projection of the second extension portion on the base substrate covers the orthographic projection of the first extension portion on the base substrate, the orthographic projection of the second extension portion on the base substrate has a first center line in the first direction, the orthographic projection of the first extension portion on the base substrate has a second center line, and the first center line overlaps with the second center line; and the orthographic projection of the second extension portion on the base substrate has a first width in the second direction, and the orthographic projection of the first extension portion on the base substrate has a second width in the second direction, wherein the second direction intersects with the first direction;

wherein a ratio of the first width to the second width is 1.5 to 3 at a same position.

10. The display panel according to claim 6, wherein the first gate line is provided with a first component and a second component that are connected to each other in the extension direction of the first gate line, a width of an orthographic projection of the first component on the base substrate in the second direction is greater than the width of the orthographic projection of the second component on the base substrate in the second direction, and the second direction intersects with the first direction; and the second gate line is provided with a third component and a fourth component that are connected to each other in the extension direction of the second gate line, and a width of an orthographic projection of the third component on the base substrate in the second direction is greater than a width of an orthographic projection of the fourth component on the base substrate in the second direction;

wherein the orthographic projection of the first component on the base substrate and the orthographic projection of the third component on the base substrate both cover the orthographic projection of the second active portion on the base substrate, and the orthographic projection of the third component on the base substrate covers the orthographic projection of the first component on the base substrate; and the orthographic projection of the first bridge portion on the base substrate partially overlaps with the orthographic projection of the first component on the base substrate and the orthographic projection of the second component on the base substrate, and the orthographic projection of the first bridge portion on the base substrate further partially overlaps with the orthographic projection of the third component on the base substrate and the orthographic projection of the fourth component on the base substrate.

11. The display panel according to claim 6, wherein the first gate line is provided with a first component and a second component, a width of the first component in the second direction is greater than a width of the second component in the second direction, and the second direction intersects with the first direction; and the second gate line is provided with a third component and a fourth component, and a width of the third component in the second direction is greater than a width of the fourth component in the second direction;

wherein an orthographic projection of the first component on the base substrate and an orthographic projection of the third component on the base substrate both cover the orthographic projection of the second active portion on the base substrate, and the orthographic projection of the third component on the base substrate covers the orthographic projection of the first component on the base substrate; and the orthographic projection of the first bridge portion on the base substrate intersects with the orthographic projection of the first component on the base substrate and the orthographic projection of the third component on the base substrate.

12. The display panel according to claim 1, wherein the display panel comprises a plurality of pixel driving circuits arranged in an array along the first direction and a second direction, wherein the first direction is a row direction and the second direction is a column direction; and the pixel driving circuit is configured to drive a light emitting unit to emit light, and further comprises a fourth transistor and a seventh transistor, wherein a first electrode of the fourth transistor is connected to a second electrode of the driving transistor, a gate of the fourth transistor is connected to a third gate line, and a second electrode of the fourth transistor is connected to a data line, and wherein a first electrode of the seventh transistor is connected to a first electrode of the light emitting unit, a second electrode of the seventh transistor is connected to a second initial signal line, and a gate of the seventh transistor is connected to a third reset signal line, and the display panel further comprises:

a first active layer, located between the base substrate and the first conductive layer, wherein the first active layer comprises:

a fourth active portion, configured to form a channel region of the fourth transistor; and a seventh active portion, configured to form a channel region of the seventh transistor;

wherein the first conductive layer further comprises:

the third gate line, wherein an orthographic projection of the third gate line on the base substrate extends in the first direction and covers an orthographic projection of the fourth active portion on the base substrate, and a partial structure of the third gate line is configured to form the gate of the fourth transistor; and the third reset signal line, wherein an orthographic projection of the third reset signal line on the base substrate extends in the first direction and covers the seventh active portion, and a partial structure of the third reset signal line is configured to form the gate of the seventh transistor; and wherein the third gate line of the pixel driving circuit of a current row is multiplexed as the third reset signal line of the pixel driving circuit of a previous row.

13. The display panel according to claim 1, wherein the pixel driving circuit further comprises a storage capacitor, a first electrode of the storage capacitor is connected to the gate of the driving transistor, and a second electrode of the storage capacitor is connected to a first power supply line; and the first conductive portion is further configured to form a first electrode of the storage capacitor;

wherein the display panel further comprises:

a fifth conductive layer, located on a side of the fourth conductive layer away from the base substrate, wherein the fifth conductive layer comprises:

the first power supply line, wherein an orthographic projection of the first power supply line on the base substrate extends in a second direction, and the second direction intersects with the first direction;

a second conductive layer, located between the first conductive layer and the second active layer, wherein the second conductive layer comprises:

a second conductive portion, wherein an orthographic projection of the second conductive portion on the base substrate partially overlaps with the orthographic projection of the first conductive portion on the base substrate, the second conductive portion is configured to form a second electrode of the storage capacitor, and the second conductive portion is connected to the first power supply line through a via hole;

wherein the first direction is a row direction and the second direction is a column direction; wherein the display panel comprises a plurality of repeating units arranged along the row direction and the column direction, wherein the repeating unit comprises two pixel driving circuits adjacent to each other in the row direction, and each column of the pixel driving circuits is correspondingly provided with one first power supply line and one second conductive portion;

in a same repeating unit, two first power supply lines are connected to each other; and in the repeating units adjacent in the row direction, adjacent second conductive portions are connected to each other;

wherein in the same repeating unit, two adjacent pixel driving circuits in the row direction are configured as mirror structures to each other.

14. The display panel according to claim 1, wherein the pixel driving circuit comprises a fifth transistor, wherein a first electrode of the fifth transistor is connected to a second electrode of the driving transistor, and a second electrode of the fifth transistor is connected to a first power supply line, wherein the display panel further comprises:

a first active layer, located between the base substrate and the first conductive layer, wherein the first active layer comprises:

a fifth active portion, configured to form a channel region of the fifth transistor;

wherein the first conductive layer further comprises:

an enable signal line, wherein an orthographic projection of the enable signal line on the base substrate extends along the first direction and covers the fifth active portion, and a partial structure of the enable signal line is configured to form a gate of the fifth transistor; and a fifth conductive layer, located on a side of the fourth conductive layer away from the base substrate, wherein the fifth conductive layer comprises:

the first power supply line, wherein an orthographic projection of the first power supply line on the base substrate extends in a second direction, and the second direction intersects with the first direction; and wherein the fourth conductive layer further comprises:

a second bridge, connected to the second electrode of the fifth transistor through a first via hole and connected to the first power supply line through another via hole;

wherein the first direction is a row direction and the second direction is a column direction;

the display panel comprises a plurality of repeating units arranged along the row direction and the column direction, and the repeating unit comprises two pixel driving circuits adjacent to each other in the row direction; and the second bridge portion is arranged in one-to-one correspondence with the pixel driving circuit, and in the repeating units adjacent in the row direction, adjacent second bridge portions are connected to each other and share the first via hole.

15. The display panel according to claim 1, further comprising:

a fifth conductive layer, located on a side of the fourth conductive layer away from the base substrate, wherein the fifth conductive layer comprises:

a first power supply line, wherein an orthographic projection of the first power supply line on the base substrate extends in a second direction, and the second direction intersects with the first direction; and wherein the orthographic projection of the first power supply line on the base substrate covers the orthographic projection of the first bridge portion on the base substrate;

wherein a gate of the second transistor is connected to the first gate line, and the second electrode of the second transistor is connected to the first electrode of the driving transistor;

wherein the second active layer further comprises:

a first active portion, configured to form a channel region of a first transistor; and the second active portion, configured to form the channel region of the second transistor;

wherein the display panel further comprises:

a second conductive layer, located between the first conductive layer and the second active layer, wherein the second conductive layer comprises:

a second gate line, wherein an orthographic projection of the second gate line on the base substrate extends in the first direction and covers an orthographic projection of the second active portion on the base substrate, and a partial structure of the second gate line is configured to form a bottom gate of the second transistor, and the orthographic projection of the first gate line on the base substrate covers the orthographic projection of the second active portion on the base substrate, and the partial structure structure of the first gate line is configured to form the top gate of the second transistor; and a first reset signal line, wherein an orthographic projection of the first reset signal line on the base substrate extends in the first direction and covers an orthographic projection of the first active portion on the base substrate, and a partial structure of the first reset signal line is configured to form a bottom gate of the first transistor; and wherein an orthographic projection of the first power supply line on the base substrate covers the orthographic projection of the first active portion on the base substrate and the orthographic projection of the second active portion on the base substrate.

16. The display panel according to claim 1, wherein a second electrode of a first transistor is connected to a first initial signal line, and the second electrode of the second transistor is connected to the first electrode of the driving transistor, wherein the pixel driving circuit further comprises a sixth transistor, and a first electrode of the sixth transistor is connected to the first electrode of the driving transistor;

wherein the display panel further comprises:

a second conductive layer, located between the first conductive layer and the second active layer, wherein the second conductive layer comprises:

the first initial signal line, wherein an orthographic projection of the first initial signal line on the base substrate extends in the first direction;

a first active layer, located between the base substrate and the first conductive layer, wherein the first active layer comprises:

a third active portion, configured to form a channel region of the driving transistor;

a sixth active portion, configured to form a channel region of the sixth transistor; and an eleventh active portion, connected between the third active portion and the sixth active portion;

wherein the second active layer further comprises:

the second active portion, configured to form the channel region of the second transistor;

a ninth active portion, connected between the second active portion and the eighth active portion; and a fourteenth active portion, connected to a side of the second active portion away from the eighth active portion;

wherein the fourth conductive layer further comprises:

a third bridge portion, connected to the fourteenth active portion and connected to the first initial signal line through a via hole; and a fourth bridge portion, connected to the eleventh active portion through a via hole and connected to the fourteenth active portion through another via hole;

wherein the display panel comprises a plurality of pixel driving circuits arranged in an array along the first direction and a second direction, wherein the first direction is a row direction and the second direction is a column direction; wherein the display panel comprises a plurality of repeating units arranged along the row direction and the column direction, and the repeating unit comprises two pixel driving circuits; and in a same repeating unit, two pixel driving circuits share the third bridge portion.

17. The display panel according to claim 16, wherein the pixel driving circuit further comprises a fifth transistor, a sixth transistor and a seventh transistor, wherein a first electrode of the fifth transistor is connected to a second electrode of the driving transistor, a second electrode of the fifth transistor is connected to a first power supply line, a first electrode of the sixth transistor is connected to the first electrode of the driving transistor, and a second electrode of the sixth transistor is connected to a first electrode of the seventh transistor, and wherein the display panel further comprises:

the first active layer, located between the base substrate and the first conductive layer, wherein the first active layer comprises:

a fifth active portion, configured to form a channel region of the fifth transistor;

a sixth active portion, configured to form a channel region of the sixth transistor; and a seventh active portion, configured to form a channel region of the seventh transistor;

wherein the first conductive layer further comprises:

an enable signal line, wherein an orthographic projection of the enable signal line on the base substrate extends along the first direction and covers the fifth active portion and the sixth active portion, and a partial structure of the enable signal line is configured to form a gate of the fifth transistor and the partial structure structure of the enable signal line is configured to form a gate of the sixth transistor; and a third reset signal line, wherein an orthographic projection of the third reset signal line on the base substrate extends in the first direction and covers the seventh active portion, and a partial structure of the third reset signal line is configured to form a gate of the seventh transistor;

the second conductive layer, located between the first conductive layer and the second active layer, wherein the second conductive layer comprises:

the first initial signal line, wherein the orthographic projection of the first initial signal line on the base substrate extends in the first direction;

a fifth conductive layer, located on a side of the fourth conductive layer away from the base substrate, wherein the fifth conductive layer comprises:

the first power supply line, wherein an orthographic projection of the first power supply line on the base substrate extends in a second direction, and the second direction intersects with the first direction; and wherein the fourth conductive layer further comprises:

a second bridge, connected to the second electrode of the fifth transistor through a via hole and connected to the first power supply line through another via hole; and wherein, in a same pixel driving circuit, the orthographic projection of the first conductive portion on the base substrate is located between the orthographic projection of the enable signal line on the base substrate and the orthographic projection of the first gate line on the base substrate; and in the same pixel driving circuit, the orthographic projection of the first gate line on the base substrate, the orthographic projection of the third reset signal line on the base substrate and the orthographic projection of the first initial signal line on the base substrate are sequentially arranged in a direction away from the first conductive portion.

18. The display panel according to claim 17, wherein a gate of the first transistor is connected to a second reset signal line; and wherein the second active layer further comprises:

a first active portion, configured to form a channel region of the first transistor;

wherein the display panel further comprises:

the second conductive layer, located between the first conductive layer and the second active layer, wherein the second conductive layer comprises:

a first reset signal line, wherein an orthographic projection of the first reset signal line on the base substrate extends in the first direction and covers an orthographic projection of the first active portion on the base substrate, and a partial structure of the first reset signal line is configured to form a bottom gate of the first transistor;

wherein the third conductive layer further comprises:

a second reset signal line, wherein an orthographic projection of the second reset signal line on the base substrate extends in the first direction and covers the orthographic projection of the first active portion on the base substrate, and a partial structure of the second reset signal line is configured to form a top gate of the first transistor; and wherein the orthographic projection of the first reset signal line on the base substrate is located between the orthographic projection of the first initial signal line on the base substrate and the orthographic projection of the third reset signal line on the base substrate.

19. The display panel according to claim 17, wherein the first direction is a row direction and the second direction is a column direction, and wherein the pixel driving circuit further comprises a fourth transistor, a first electrode of the fourth transistor is connected to the second electrode of the driving transistor, and a second electrode of the fourth transistor is connected to a data signal line; wherein the fifth conductive layer further comprises:

a data line, wherein an orthographic projection of the data line on the base substrate extends in the second direction; and the fourth conductive layer further comprises:

a sixth bridge, connected to the data line through a via hole and connected to a second electrode of the fourth transistor through another via hole;

wherein the display panel comprises a plurality of repeating units arranged along the row direction and the column direction, the repeating unit comprises two pixel driving circuits, and each column of the pixel driving circuits is correspondingly provided with one first power supply line and one data line; and in a same repeating unit, two first power supply lines are connected to each other, and orthographic projections of two data lines on the base substrate are arranged on both sides of the orthographic projections of two first power supply lines on the base substrate, respectively;

wherein the first transistor and the second transistor are N-type transistors, and the driving transistor, the fourth transistor, the fifth transistor, the sixth transistor and the seventh transistor are P-type transistors.

20. The display panel according to claim 1, wherein the display panel comprises a plurality of pixel driving circuits arranged in an array along the first direction and a second direction, wherein the first direction is a row direction and the second direction is a column direction, and wherein the display panel comprises a plurality of sub-pixels arranged in an array along the row direction and the column direction, the sub-pixel comprises the pixel driving circuit, and the display panel further comprises:

a fifth conductive layer, located on a side of the fourth conductive layer away from the base substrate, wherein the fifth conductive layer comprises:

a first power supply line, wherein an orthographic projection of the first power supply line on the base substrate extends in the second direction; and a plurality of virtual pixel rows, wherein the virtual pixel rows are located between two adjacent rows of sub-pixels, the virtual pixel row comprises a plurality of row virtual sub-pixels, and the row virtual sub-pixel comprises a row virtual pixel driving circuit;

wherein the row virtual pixel driving circuit comprises a row virtual transistor and a row virtual signal line, the row virtual transistor and the row virtual signal line are connected to each other into an integral structure, and the integral structure is connected to the first power supply line;

wherein the display panel comprises the plurality of pixel driving circuits arranged in the array along the first direction and the second direction, wherein the first direction is the row direction and the second direction is the column direction, wherein the pixel driving circuit is configured to drive a light emitting unit to emit light, and further comprises a fourth transistor, a sixth transistor and a seventh transistor, wherein a first electrode of the fourth transistor is connected to a second electrode of the driving transistor, a gate of the fourth transistor is connected to a third gate line, and a second electrode of the fourth transistor is connected to a data line, wherein a first electrode of the sixth transistor is connected to the first electrode of the driving transistor, a second electrode of the sixth transistor is connected to a first electrode of the light emitting unit, and wherein a first electrode of the seventh transistor is connected to the first electrode of the light emitting unit, a second electrode of the seventh transistor is connected to a second initial signal line, and a gate of the seventh transistor is connected to a third reset signal line;

wherein an orthographic projection of the seventh transistor in the pixel driving circuit of a current row on the base substrate is located at a side of an orthographic projection of the virtual pixel row on the base substrate away from an orthographic projection of the sixth transistor in the pixel driving circuit of the current row on the base substrate, and the display panel further comprises:

a first active layer, located between the base substrate and the first conductive layer, wherein the first active layer comprises:

a fourth active portion, configured to form a channel region of the fourth transistor;

a sixth active portion, configured to form a channel region of the sixth transistor;

a seventh active portion, configured to form a channel region of the seventh transistor; and a third conductive portion, at least partially located in a region where the virtual pixel row is located, wherein an orthographic projection of the third conductive portion on the base substrate extends along the second direction, and the third conductive portion is configured to be connected to the second electrode of the sixth transistor in the pixel driving circuit of the current row and the first electrode of the seventh transistor in the pixel driving circuit of the current row;

wherein the first conductive layer further comprises:

the third gate line, wherein an orthographic projection of the third gate line on the base substrate extends in the first direction and covers an orthographic projection of the fourth active portion on the base substrate, and a partial structure of the third gate line is configured to form the gate of the fourth transistor; and the third reset signal line, wherein an orthographic projection of the third reset signal line on the base substrate extends in the first direction and covers the seventh active portion, and a partial structure of the third reset signal line is configured to form the gate of the seventh transistor; and wherein the third gate line of the pixel driving circuit of a current row is multiplexed as the third reset signal line of the pixel driving circuit of a previous row;

wherein the row virtual pixel driving circuit further comprises a row virtual storage capacitor, the row virtual signal line comprises a row virtual second initial signal line, a row virtual third reset signal line, a row virtual gate line and a row virtual enable signal line, and the row virtual transistor comprises a row virtual driving transistor and a row virtual fifth transistor, wherein a first notch region is arranged between an orthographic projection of the row virtual fifth transistor on the base substrate and an orthographic projection of the row virtual driving transistor on the base substrate, the orthographic projection of the third conductive portion on the base substrate is located in the first notch region, and an orthographic projection of the second electrode of the row virtual storage capacitor on the base substrate, an orthographic projection of the row virtual second initial signal line on the base substrate, an orthographic projection of the row virtual third reset signal line on the base substrate, and an orthographic projection of the row virtual gate line on the base substrate and an orthographic projection of the row virtual enable signal line on the base substrate are all disconnected at the first notch region;

wherein the third conductive portion is located on the first conductive layer, and the row virtual pixel driving circuit comprises a row virtual first transistor, wherein a first electrode of the row virtual first transistor is connected to a gate of the row virtual driving transistor, a second electrode of the row virtual first transistor is connected to a row virtual first initial signal line, and a gate of the row virtual first transistor is connected to a row virtual second reset signal line; and the row virtual signal line further comprises the row virtual second reset signal line, wherein the row virtual second reset signal line is located on the third conductive layer, and an orthographic projection of the row virtual second reset signal line on the base substrate extends along the first direction and is located between the first notch region and a region where the pixel driving circuit of the previous row is located;

wherein the display panel further comprises:

a fifth bridge portion, located on the fourth conductive layer, wherein the fifth bridge portion is connected to the third conductive portion and a second electrode of the sixth transistor in the pixel driving circuit in current row through a via hole respectively, and an orthographic projection of the fifth bridge portion on the base substrate intersects with an orthographic projection of the second reset signal line on the base substrate;

wherein the display panel further comprises:

a plurality of virtual pixel columns, wherein the virtual pixel column is located between two adjacent columns of sub-pixels, the virtual pixel column comprises a plurality of column virtual sub-pixels, the column virtual sub-pixel comprises a column virtual pixel driving circuit, the column virtual pixel driving circuit comprises a channel region of a column virtual reset transistor, and an orthographic projection of the channel region of the column virtual reset transistor on the base substrate has a second notch region; and the first conductive layer further comprises a third reset signal line, wherein an orthographic projection of the third reset signal line on the base substrate extends along the first direction and passes through the second notch region;

wherein the virtual pixel column further comprises a column virtual storage capacitor and a column virtual signal line, wherein a first electrode of the column virtual storage capacitor is connected to the enable signal line, the column virtual signal line and the column virtual transistor are connected to each other into an integral structure, and the integral structure is connected to the first power supply line.

* * * * *